(12) United States Patent
Nishiyama et al.

(10) Patent No.: US 7,122,589 B2
(45) Date of Patent: Oct. 17, 2006

(54) POSITIVE RESIST COMPOSITION AND PATTERN FORMATION METHOD USING THE SAME

(75) Inventors: Fumiyuki Nishiyama, Shizuoka (JP); Kenichiro Sato, Shizuoka (JP); Kunihiko Kodama, Shizuoka (JP)

(73) Assignee: Fuji Photo Film Co., Ltd, Kanagawa (JP)

( * ) Notice: Subject to any disclaimer, the term of this patent is extended or adjusted under 35 U.S.C. 154(b) by 137 days.

(21) Appl. No.: 10/669,603

(22) Filed: Sep. 25, 2003

(65) Prior Publication Data
US 2004/0063827 A1    Apr. 1, 2004

(30) Foreign Application Priority Data

Sep. 30, 2002 (JP) ............... P. 2002-287252
Sep. 30, 2002 (JP) ............... P. 2002-287393

(51) Int. Cl.
*C08K 5/36* (2006.01)

(52) U.S. Cl. ............ 524/155; 430/921; 430/905; 526/319; 526/320; 524/556; 524/560

(58) Field of Classification Search ........... 430/270.1, 430/921, 922, 905; 526/319, 320; 524/155, 524/556, 560

See application file for complete search history.

(56) References Cited

U.S. PATENT DOCUMENTS

| 6,348,297 | B1 * | 2/2002 | Uetani et al. ............ 430/270.1 |
| 6,440,636 | B1 * | 8/2002 | Ushirogouchi et al. .. 430/270.1 |
| 6,733,951 | B1 * | 5/2004 | Kodama ................... 430/270.1 |

FOREIGN PATENT DOCUMENTS

| JP | 9-73173 (A) | 3/1997 |
| JP | 11-119434 (A) | 4/1999 |
| JP | 2000-292917 (A) | 10/2000 |
| JP | 2001-294570 (A) | 10/2001 |

* cited by examiner

*Primary Examiner*—David W. Wu
*Assistant Examiner*—Satya B. Sastri
(74) *Attorney, Agent, or Firm*—Sughrue Mion, PLLC

(57) ABSTRACT

A positive resist composition comprising: (A) a resin having alicyclic hydrocarbon groups in side chains, containing specified two types of repeating units, which increases the solubility in an alkali developing solution by the action of an acid; and (B) a particular sulfonium compound having a specified structure and capable of generating an acid upon irradiation with an actinic ray or radiation.

14 Claims, No Drawings

POSITIVE RESIST COMPOSITION AND PATTERN FORMATION METHOD USING THE SAME

FIELD OF THE INVENTION

The present invention relates to a positive resist composition used in ultra micro-lithographic processes for manufacturing VLSI circuits and high-capacity microchips, and other photo-fabrication processes.

BACKGROUND OF THE INVENTION

In recent years, integrated circuitry has become increasingly larger in its scale of integration, and manufacturing semiconductor boards of VLSI chips or the like has come to require super minute patterning capable of ensuring trace widths of half a micron or below. In order to meet this requirement, wavelengths of exposure apparatus used in photo-lithography have become shorter and shorter, and it is being considered now to utilize excimer laser beams of shorter wavelengths in the ultraviolet region (e.g., XeCl, KrF, ArF).

In forming patterns by lithography in such a wavelength region, chemical amplification resist is used to advantage.

In general, chemical amplification resist compositions fall roughly into three categories: the so-called 2-component, 2.5-component and 3-component systems. In the 2-component system, a compound capable of generating an acid by photolysis (referred to as a photo-acid generator, hereinafter) and a binder resin are used in combination. The binder resin used therein is a resin containing groups capable of decomposing under the action of an acid to increase the resin solubility in an alkali developer (acid-decomposable groups). In the 2.5-component system, a low molecular-weight compound having an acid-decomposable group is further included in addition to such a 2-component system. The 3-component system includes a photo-acid generator, an alkali-soluble resin and such an acid-decomposable compound of low molecular weight.

Although those chemical amplification resist compositions are suitable as photoresist compositions for ultraviolet or far-ultraviolet irradiation, it is further necessary for them to provide for characteristics required from the viewpoint of using them.

In the case of photoresist compositions designed for use of an ArF light source, there is a proposal to introduce alicyclic hydrocarbon moieties into resins for the purpose of providing dry etching resistance. However, the introduction of alicyclic hydrocarbon moieties renders the resin extremely hydrophobic, thereby yielding such a detriment that the photoresist is difficult to develop with an aqueous solution of tetramethylammonium hydroxide (abbreviated as TMAH hereinafter) hitherto widely used as a resist developing solution or peels off a substrate during development.

As a measure against the resin's hydrophobicity, mixing an organic solvent, such as isopropyl alcohol, into a developer was considered and met with a qualified success. However, the mixing with an organic solvent causes apprehension of swelling of resist films and makes the patterning process complex, so it cannot be always said that the problems have been solved. In an approach of improving resist, hydrophilic groups have frequently been introduced as a measure for complementing various hydrophobic alicyclic hydrocarbon moieties.

JP-A-9-73173 discloses the resist material using an acid-responsive compound that has an alkali-soluble group protected with an alicyclic group-containing structure and contains a structural unit capable of rendering the compound soluble in an alkali through elimination of the alkali-soluble group by an acid.

Further, JP-A-11-119434 offers the resist material using a resin having repeating units containing alicyclic hydrocarbons and repeating units having lactone structures as a low-cost resist material having high resolution, high sensitivity and improved dry etching resistance.

JP-A-2000-292917 discloses the resist composition using a mixture of an acid generator of triarylsulfonium salt type and an acid generator of phenacylsulfonium salt type.

In addition, JP-A-2001-294570 discloses the resist composition containing a phenacylsulfonium salt.

However, the hitherto known positive resist compositions do not produce satisfactory results on line edge roughness and pattern collapse performances in micro-photo fabrication using far ultraviolet light, notably ArF excimer laser beam.

SUMMARY OF THE INVENTION

Therefore, an object of the invention is to provide a positive resist composition that is used suitably in micro-photofabrication utilizing far ultraviolet light, notably ArF excimer laser beam, and offers excellent line edge roughness performance and excellent pattern collapse performance.

The present inventors made intensive investigations in view of constituent materials of positive chemical-amplification resist compositions. As a result, they have found that the object of the present invention is accomplished by using a specific acid-decomposable resin.

More specifically, the object of the present invention is achieved by the following constitutions.

(1) A positive resist composition comprising:

(A) a resin comprising a repeating unit represented by the following formula (Ia) and a repeating unit represented by the following formula (Ib), which increases the solubility in an alkali developing solution by the action of an acid:

(B) a compound represented by the following formula (I), (II) or (III):

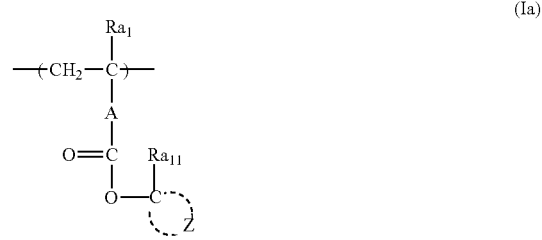

(Ia)

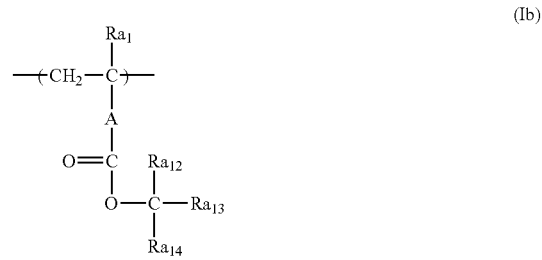

(Ib)

wherein $Ra_1$ each independently represents a hydrogen atom or an alkyl group, and A each independently represents a linkage group, $Ra_{11}$ represents an alkyl group containing 1 to 4 carbon atoms, Z represents an atom group forming an alicyclic hydrocarbon group together with the carbon atom, $Ra_{12}$ to $Ra_{14}$ each independently represents a hydrocarbon group, with the proviso that at least one among $Ra_{12}$, $Ra_{13}$ and $Ra_{14}$ represents an alicyclic hydrocarbon group:

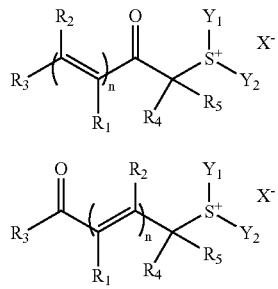

wherein $R_1$ to $R_3$, which may be the same or different, each represents a hydrogen atom, an alkyl group, an alkenyl group, an aryl group or an alkoxy group, $R_4$ and $R_5$, which may be the same or different, each represent a hydrogen atom, a cyano group, an alkyl group, an aryl group or an alkoxy group, $Y_1$ and $Y_2$, which may be the same or different, each represents an alkyl group, an aryl group, an aralkyl group or a hetero atom-containing aromatic group, n represents an integer of 1 to 4, and with the proviso that when n is 2 or more, a plurality of $R_1$s may be the same or different and a plurality of $R_2$s may also be the same or different, any two or more among $R_1$ to $R_3$, $R_4$, $R_5$, $Y_1$ and $Y_2$ may be bonded with each other to form a cyclic structure, two or more of structures represented by formula (I) or (II) may be present by being bonded to each other via one or more of a linkage group at any sites of $R_1$s, $R_2$s, $R_3$s, $R_4$s, $R_5$s, $Y_1$s and $Y_2$s, $X^-$ represents a non-nucleophilic anion:

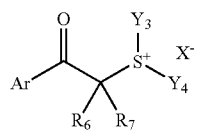

wherein Ar represents an aryl group or a hetero atom-containing aromatic group, $R_6$ represents a hydrogen atom, a cyano group, an alkyl group or an aryl group, $R_7$ represents an alkyl group or an aryl group, $Y_3$ and $Y_4$, which may be the same or different, each represents an alkyl group, an aryl group, an aralkyl group or a hetero atom-containing aromatic group, or $Y_3$ and $Y_4$ may be bonded with each other to form a ring, Ar and at least either $Y_3$ or $Y_4$ may be bonded with each other to form a ring, Ar and $R_6$ may be bonded with each other to form a ring, or two or more of structures represented by formula (III)

may be present by being bonded to each other via one or more of a linkage group at Ar sites, either $R_6$ or $R_7$ sites, or either $Y_3$ or $Y_4$ sites, and $X^-$ represents a non-nucleophilic anion.

(2) The composition according to the above (1), wherein the compound (B) represented by formula (III) is a compound represented by the following formula (IV):

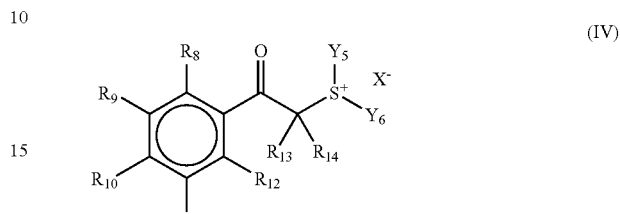

wherein $R_8$ to $R_{12}$, which may be the same or different, each represents a hydrogen atom, a nitro group, a halogen atom, an alkyl group, an alkoxy group, an alkyloxycarbonyl group, an aryl group or an acylamino group, with the proviso that at least two of $R_8$ to $R_{12}$ may be bonded with each other to form a ring structure, $R_{13}$ represents a hydrogen atom, a cyano group, an alkyl group or an aryl group, $R_{14}$ represents an alkyl group or an aryl group, $Y_5$ and $Y_6$, which may be the same or different, each represents an alkyl group, an aryl group, an aralkyl group or a hetero atom-containing aromatic group, or $Y_5$ and $Y_6$ may be bonded with each other to form a ring, or at least one of $R_8$ to $R_{12}$ and at least either $Y_5$ or $Y_6$ may be bonded with each other to form a ring, or at least one of $R_8$ to $R_{12}$ may be bonded with $R_{13}$ to form a ring, two or more of structures represented by formula (IV) may be present by being bonded to each other via one or more of a linkage group at any sites of $R_8$s to $R_{14}$s or at either $Y_5$ sites or $Y_6$ sites, and $X^-$ represents a non-nucleophilic anion.

(3) The composition according to the above (1), further comprising (C) a fluorine-based and/or silicon-based surfactant.

(4) The composition according to the above (1), further comprising (D) an organic basic compound.

(5) The composition according to the above (1), wherein the component (B) includes: at least one of the compounds represented by the formulae (I) and (II); and the compound represented by the formula (III).

(6) The composition according to the above (1), wherein the amount of the repeating unit represented by the formula (Ia) and the repeating unit represented by the formula (Ib) is from 30 to 70 mole % based on the component (a).

(7) The composition according to the above (1), wherein the content of the compound represented by the formula (I) or (II) is from 0.1 to 20% by weight based on a solids contents in the composition.

(8) A method for forming a pattern, which comprises forming a resist film comprising the composition described in the above (1), exposing the resist film upon irradiation with the actinic rays or a radiation, and subsequently developing the resist film.

(9) The method for forming a pattern according to the above (8), wherein the compound (B) represented by formula (III) is a compound represented by the following formula (IV):

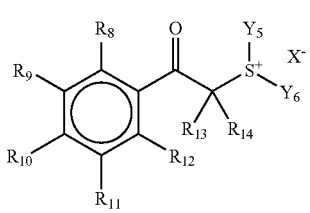

wherein $R_8$ to $R_{12}$, which may be the same or different, each represents a hydrogen atom, a nitro group, a halogen atom, an alkyl group, an alkoxy group, an alkyloxycarbonyl group, an aryl group or an acylamino group, with the proviso that at least two of $R_8$ to $R_{12}$ may be bonded with each other to form a ring structure, $R_{13}$ represents a hydrogen atom, a cyano group, an alkyl group or an aryl group, $R_{14}$ represents an alkyl group or an aryl group, $Y_5$ and $Y_6$, which may be the same or different, each represents an alkyl group, an aryl group, an aralkyl group or a hetero atom-containing aromatic group, or $Y_5$ and $Y_6$ may be bonded with each other to form a ring, or at least one of $R_8$ to $R_{12}$ and at least either $Y_5$ or $Y_6$ may be bonded with each other to form a ring, or at least one of $R_8$ to $R_{12}$ may be bonded with $R_{13}$ to form a ring, two or more of structures represented by formula (IV) may be present by being bonded to each other via one or more of a linkage group at any sites of $R_8$s to $R_{14}$s or at either $Y_5$ sites or $Y_6$ sites, and $X^-$ represents a non-nucleophilic anion.

(10) The method for forming a pattern according to the above (8), wherein the composition further comprises (C) a fluorine-based and/or silicon-based surfactant.

(11) The method for forming a pattern according to the above (8), wherein the composition further comprises (D) an organic basic compound.

(12) The method for forming a pattern according to the above (8), wherein the component (B) includes: at least one of the compounds represented by the formulae (I) and (II); and the compound represented by the formula (III).

(13) The method for forming a pattern according to the above (8), wherein the amount of the repeating unit represented by the formula (Ia) and the repeating unit represented by the formula (Ib) is from 30 to 70 mole % based on the component (a).

(14) The method for forming a pattern according to the above (8), wherein the content of the compound represented by the formula (I) or (II) is from 0.1 to 20% by weight based on a solids contents in the composition.

The invention can provide a positive resist composition excellent in both line-edge roughness performance and pattern collapse performance. The present positive resist composition can be used suitably in micro-fabrication utilizing far ultraviolet light, notably ArF excimer laser beam.

DETAILED DESCRIPTION OF THE INVENTION

The invention is described below in detail.

Incidentally, the term "group (atom group)" as used herein is intended to include both unsubstituted and substituted ones unless designated as "unsubstituted" or "substituted".

For instance, the term "alkyl group" used herein includes not only an alkyl group having no substituent (an unsubstituted alkyl group) but also an alkyl group having a substituent (a substituted alkyl group).

[1] (A) Resin Which Increases the Solubility in an Alkali Developing Solution by the Action of an Acid (Acid-decomposable Resin)

The component (A) in the invention, namely a resin which increases the solubility in an alkali developing solution by the action of an acid, is a resin having repeating units represented by the following formula (Ia) and repeating units represented by the following formula (Ib):

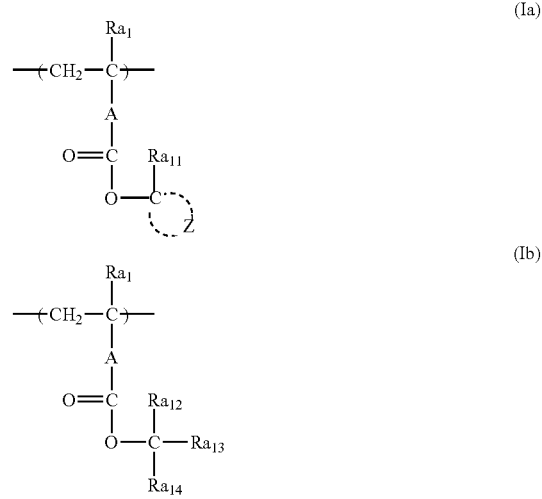

In formulae (Ia) and (Ib), each $Ra_1$ represents a hydrogen atom or an alkyl group, and each A represents a linkage group.

In formula (Ia), $Ra_{11}$ represents an alkyl group containing 1 to 4 carbon atoms, and Z represents an atom group forming an alicyclic hydrocarbon group together with the carbon atom.

In formula (Ib), $Ra_{12}$ to $Ra_{14}$ each independently represents a hydrocarbon group, provided that at least one of $Ra_{12}$ to $Ra_{14}$ is an alicyclic hydrocarbon group.

The alkyl group suitable as $Ra_1$ is an alkyl group containing 1 to 4 carbon atoms (e.g. a methyl group, an ethyl group, a propyl group, an isopropyl group, a n-butyl group, an isobutyl group, a sec-butyl group and a t-butyl group), and a hydrogen atom or a methyl group is especially suitable as $Ra_1$.

The linkage group represented by A is generally a single bond, or a group selected alone from or a combination of at least two groups selected from the class consisting of an alkylene group, a substituted alkylene group, an ether group, a thioether group, a carbonyl group, an ester group, an amido group, a sulfonamido group, an urethane group and an urea group. It is appropriate that the number of carbon atoms contained in the linkage group of A be 10 or below.

Examples of the alkylene group of A include groups represented by the following formula.

—[C(Rf)(Rg)]$r_1$-

In the formula, Rf and Rg each represents a hydrogen atom, an alkyl group, a halogen atom, a hydroxyl group or an alkoxy group, and they may be the same or different. The alkyl group may be a substituted alkyl group or an unsubstituted alkyl group, which may have a linear or branched form. Suitable examples thereof include lower alkyl groups, such as a methyl group, an ethyl group, a propyl group, an isopropyl group and a butyl group. And it is preferable to select the alkyl group from a methyl group, an ethyl group, a propyl group or an isopropyl group. Examples of a substituent the substituted alkyl group has include a hydroxyl group, a halogen atom and an alkoxy group. Examples of the alkoxy group include alkoxy groups including 1 to 4 carbon atoms, such as a methoxy group, an ethoxy group, a propoxy group and a butoxy group. Examples of the halogen atom include a chlorine atom, a bromine atom, a fluorine atom and an iodine atom. r1 is an integer of 1 to 10.

In formula (Ia), the alkyl group containing 1 to 4 carbon atoms of $Ra_{11}$ includes a methyl group, an ethyl group, a propyl group, an isopropyl group, a n-butyl group, an isobutyl group, a sec-butyl group and a t-butyl group.

In formula (Ib), $Ra_{12}$ to $Ra_{14}$ each independently represents a hydrocarbon group, provided that at least one of $Ra_{12}$ to $Ra_{14}$ is an alicyclic hydrocarbon group.

The hydrocarbon groups of $Ra_{12}$ to $Ra_{14}$, except for alicyclic hydrocarbon groups, are preferably linear or branched alkyl groups including 1 to 15 carbon atoms (especially preferably ones including 1 to 4 carbon atoms).

The alicyclic hydrocarbon group represented by at least one of $Ra_{12}$ to $Ra_{14}$ and the alicyclic hydrocarbon group formed by Z and the carbon atom may be monocyclic or polycyclic. Examples of such alicyclic hydrocarbon groups include groups having monocyclic, bicyclic, tricyclic and tetracyclic structures which each contain at least 5 carbon atoms. The suitable number of carbon atoms contained in such a group is from 6 to 30, particularly from 7 to 25. Those alicyclic hydrocarbon groups may have substituents.

Examples of a structural formula of the alicyclic moiety of such an alicyclic hydrocarbon group are illustrated below:

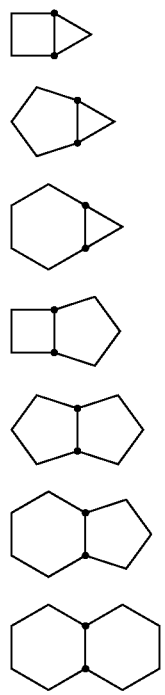

(1)
(2)
(3)
(4)
(5)
(6)
(7)

-continued

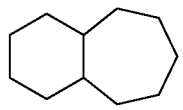

(8)

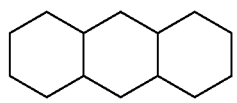

(9)

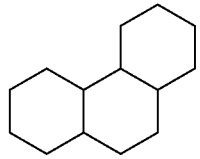

(10)

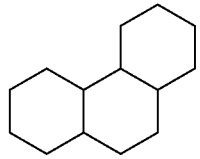

(11)

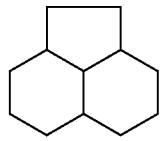

(12)

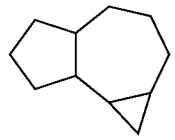

(13)

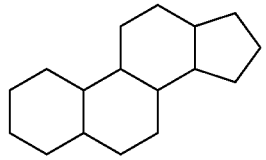

(14)

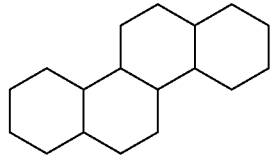

(15)

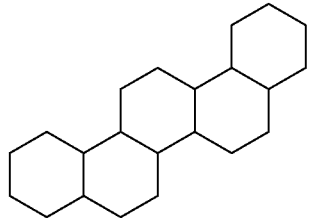

(16)

(17)

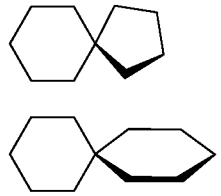

(18)

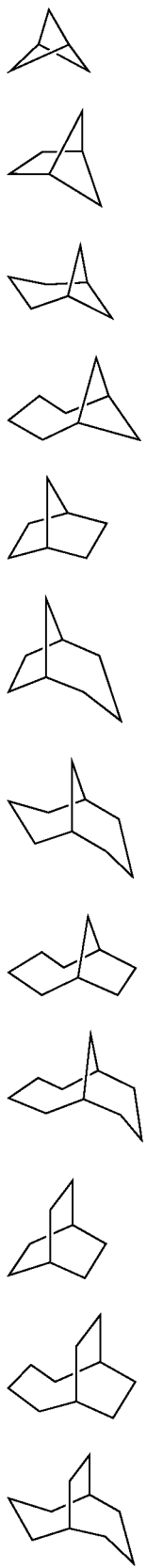
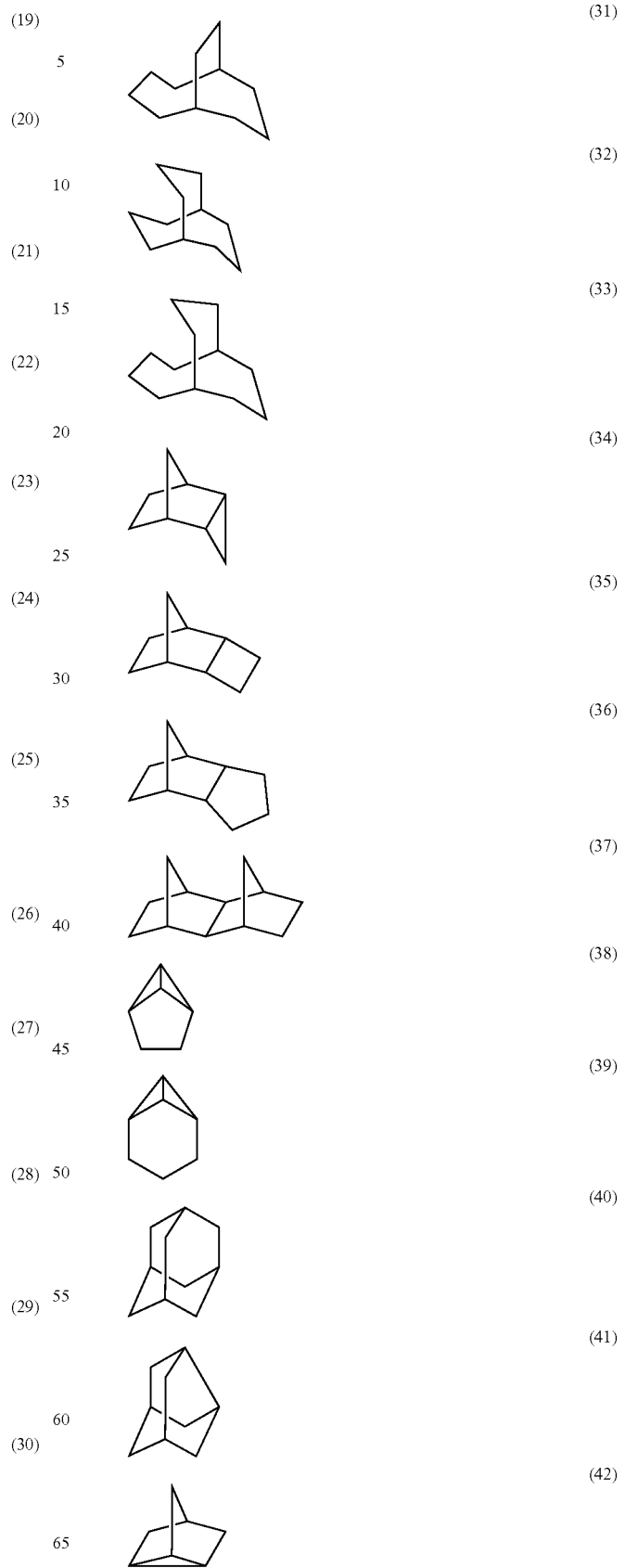

-continued

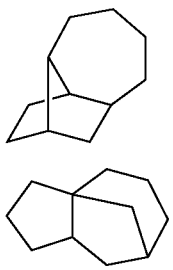

(43)

(44)

(45)

(46)

(47)

(48)

(49)

(50)

Of these alicyclic moieties, an adamantyl group, a noradamantyl group, adecaline residue, atricyclodecanyl group, a tetracyclododecanyl group, anorbornyl group, acedorol group, a cyclohexyl group, a cycloheptyl group, a cyclooctyl group, a cyclodecanyl group and a cyclododecanyl group are preferred over the others. Of these groups, an adamantyl group, a decaline residue, anorbornyl group, acedorol group, a cyclohexyl group, a cycloheptyl group, a cyclooctyl group, a cyclodecanyl group and a cyclododecanyl group are preferable to the others.

Those alicyclic hydrocarbon groups may have substituents, such as an alkyl group, a halogen atom, a hydroxyl group and an oxo group (=O). The alkyl group may be substituted or unsubstituted, and it may take a linear or branched form. Suitable examples thereof include lower alkyl groups such as a methyl group, an ethyl group, a propyl group, an isopropyl group and a butyl group. And the alkyl group more suitable as the substituent is a group selected from the family consisting of a methyl group, an ethyl group, a propyl group and an isopropyl group. Examples of a substituent the substituted alkyl group has include a hydroxyl group, a halogen atom and an alkoxy group. Examples of the alkoxy group include alkoxy groups including 1 to 4 carbon atoms such as a methoxy group, an ethoxy group, a propoxy group and a butoxy group.

Examples of monomers corresponding to repeating units represented by formulae (Ia) and (Ib) respectively are illustrated below:

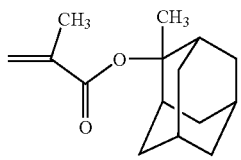

Ia-1

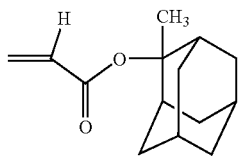

Ia-2

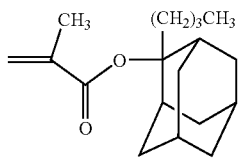

Ia-3

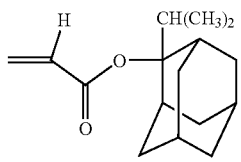

Ia-4

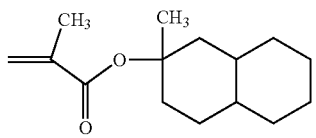

Ia-5

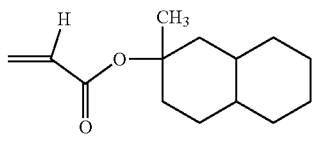

Ia-6

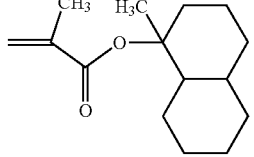

Ia-7

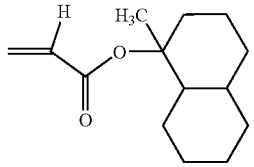

Ia-8

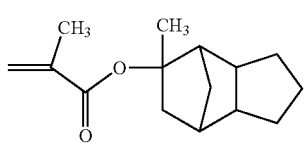

Ia-9

-continued
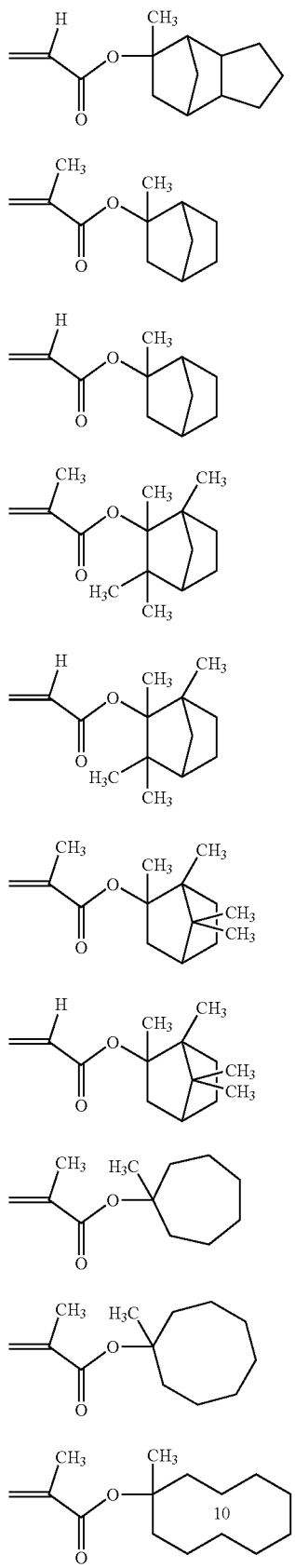
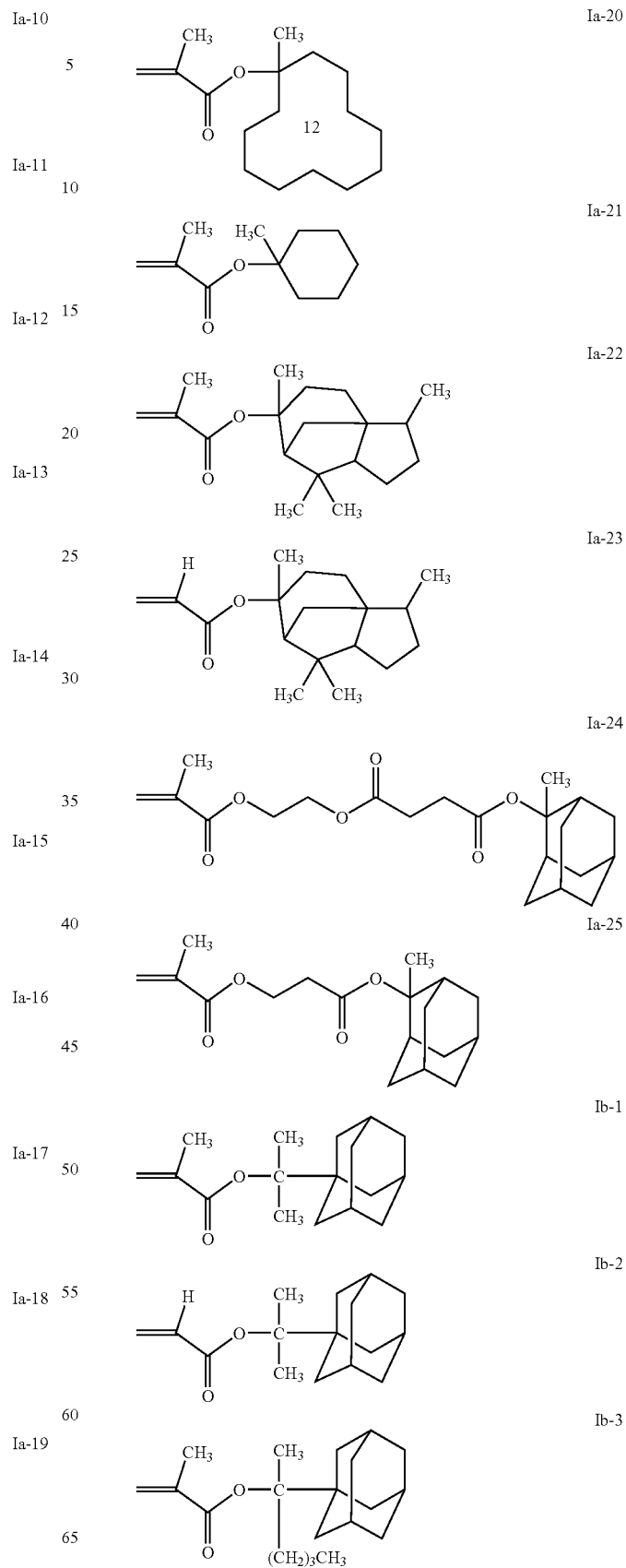

-continued

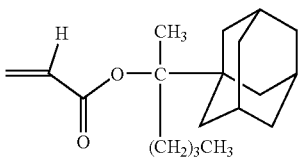
Ib-4

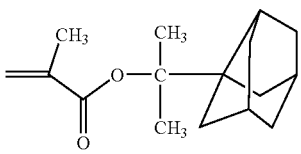
Ib-5

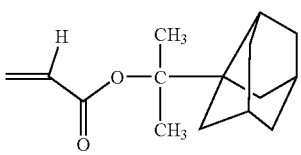
Ib-6

Ib-7

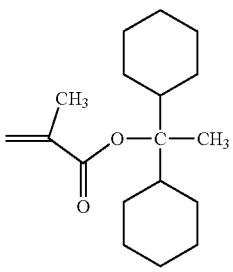

Ib-8

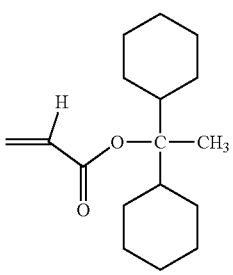

Ib-9

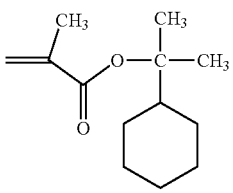

The present acid-decomposable resin (A) may further contain repeating units having partial structures containing alicyclic hydrocarbon groups represented by the following formulae (pIII) to (pV).

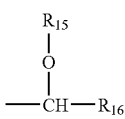
(pIII)

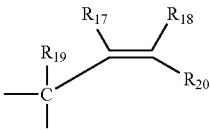
(pIV)

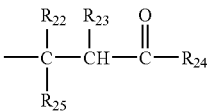
(pV)

In the formulae, $R_{15}$ and $R_{16}$ each independently represents a straight-chain or branched alkyl group containing 1 to 4 carbon atoms, or an alicyclic hydrocarbon group, provided that at least either $R_{15}$ or $R_{16}$ represents an alicyclic hydrocarbon group.

$R_{17}$ to $R_{21}$ each independently represents a hydrogen atom, a straight-chain or branched alkyl group containing 1 to 4 carbon atoms, or an alicyclic hydrocarbon group, provided that at least one of $R_{17}$ to $R_{21}$ represents an alicyclic hydrocarbon group and either $R_{19}$ or $R_{21}$ represents a straight-chain or branched alkyl group containing 1 to 4 carbon atoms or an alicyclic hydrocarbon group.

$R_{22}$ to $R_{25}$ each independently represents a straight-chain or branched alkyl group containing 1 to 4 carbon atoms, or an alicyclic hydrocarbon group, provided that at least one of $R_{22}$ to $R_{25}$ represents an alicyclic hydrocarbon group; or $R_{23}$ and $R_{24}$ may combine with each other to form a ring.

The alkyl groups represented by $R_{15}$ to $R_{25}$ in formulae (pIII) to (pV) may be substituted or unsubstituted linear or branched alkyl groups including 1 to 4 carbon atoms. Examples of such alkyl groups include a methyl group, an ethyl group, an n-propyl group, an isopropyl group, an n-butyl group, an isobutyl group, a sec-butyl group and a t-butyl group.

Examples of substituents those alkyl groups may have include alkoxy groups containing 1 to 4 carbon atoms, halogen atoms (fluorine, chlorine, bromine and iodine atoms), acyl groups, acyloxy groups, a cyano group, a hydroxyl group, a carboxyl group, alkoxycarbonyl groups and a nitro group.

In the present resin, the structures represented by formulae (pIII) to (pV) can be used for protecting alkali-soluble groups. Examples of such alkali-soluble groups include various groups known in this technical field.

Specifically, a carboxylic acid group, a sulfonic acid group, a phenol group and a thiol group are well known. Of these groups, a carboxylic acid group and a sulfonic acid group are preferred over the others.

Suitable examples of alkali-soluble groups protected by the structures of formulae (pIII) to (pV) respectively in the present resin include groups represented by the following formulae (pIX) to (pXI).

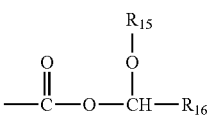
(pIX)

-continued

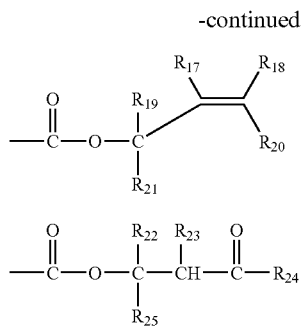

(pX)

(pXI)

In the formulae, $R_{15}$ to $R_{25}$ have the same meanings as defined hereinbefore, respectively.

As the repeating units having alkali-soluble groups protected by structures represented by formulae (pIII) to (pV), which may be contained in the present resin, repeating units represented by the following formula (pA) are preferred.

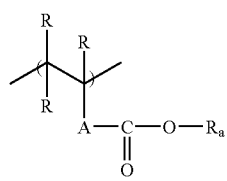

(pA)

Herein, each R represents a hydrogen atom, a halogen atom, or a substituted or unsubstituted, linear or branched alkyl group including 1 to 4 carbon atoms, and three R groups may be the same or different.

A has the same meaning as in formulae (Ia) and (Ib).

Ra represents any of the groups of formulae (pIII) to (pV).

Examples of a monomer corresponding to the repeating unit represented by formula (pA) are illustrated below, but these examples should not be construed as limiting the scope of the invention.

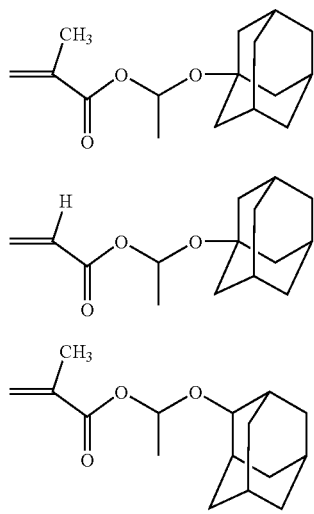

1

2

3

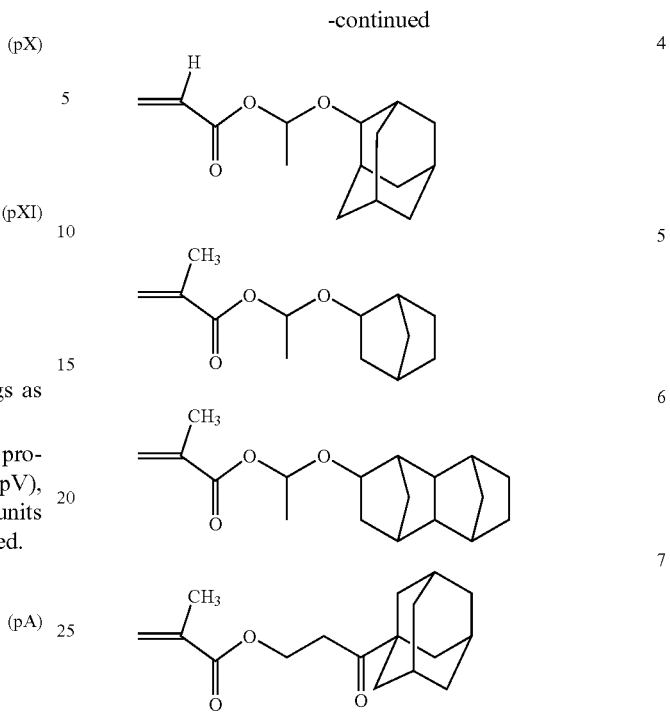

4

5

6

7

The present acid-decomposable resin can furthermore contain repeating units having lactone structures represented by the following formula (IV).

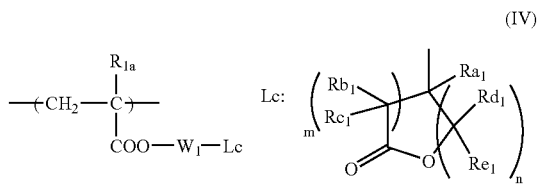

(IV)

In formula (IV), $R_1a$ represents a hydrogen atom or a methyl group.

$W_1$ represents a single bond, or a group selected solely from or a combination of at least two groups selected from the class consisting of an alkylene group, an ether group, a thioether group, a carbonyl group and an ester group.

$Ra_1$, $Rb_1$, $Rc_1$, $Rd_1$ and $Re_1$ each independently represents a hydrogen atom or an alkyl group containing 1 to 4 carbon atoms. m and n each independently represents an integer of 0 to 3, provided that m+n is from 2 to 6.

Examples of the alkyl groups including 1 to 4 carbon atoms represented by $Ra_1$ to $Re_1$ include a methyl group, an ethyl group, a propyl group, an isopropyl group, an n-butyl group, an isobutyl group, a sec-butyl group and a t-butyl group.

Examples of the alkylene group of $W_1$ in formula (IV) include groups represented by the following formula:

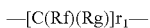

—[C(Rf)(Rg)]$r_1$—

In the formula, Rf and Rg, which may be the same or different, each represents a hydrogen atom, an alkyl group, a halogen atom, a hydroxyl group or an alkoxy group. The alkyl group may be substituted or unsubstituted, and may take a linear or branched form, with suitable examples including lower alkyl groups, such as a methyl group, an ethyl group, a propyl group and a butyl group. It is preferable to select the alkyl group from among a methyl group, an ethyl group, a propyl group and an isopropyl group.

Examples of a substituent the substituted alkyl group has include a hydroxyl group, a halogen atom and an alkoxy group. Examples of the alkoxy group include alkoxy groups including 1 to 4 carbon atoms, such as a methoxy group, an ethoxy group, a propoxy group and a butoxy group. Examples of the halogen atom include a chlorine atom, a bromine atom, a fluorine atom and an iodine atom. $r_1$ represents an integer of 1 to 10.

Examples of a substituent the alkyl group can further have include a carboxyl group, an acyloxy group, a cyano group, an alkyl group, a substituted alkyl group, a halogen atom, a hydroxyl group, an alkoxy group, a substituted alkoxy group, an acetylamido group, an alkoxycarbonyl group and an acyl group.

Examples of an alkyl group as the substituent include lower alkyl groups such as a methyl group, an ethyl group, a propyl group, an isopropyl group, a butyl group, a cyclopropyl group, a cyclobutyl group and a cyclopentyl group. Examples of a substitutent the substituted alkyl group has include a hydroxyl group, halogen atoms and alkoxy groups. Examples of a substituent the substituted alkoxy group has include alkoxy groups. Examples of such alkoxy groups include alkoxy groups containing 1 to 4 carbon atoms such as a methoxy group, an ethoxy group, a propoxy group and a butoxy group. Examples of the acyloxy group include an acetoxy group. Examples of the halogen atom include a chlorine atom, a bromine atom, a fluorine atom and an iodine atom.

Examples of a repeating unit represented by formula (IV) are illustrated below, but these examples should not be construed as limiting the scope of the invention.

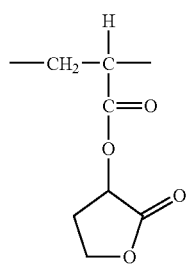

(IV-1)

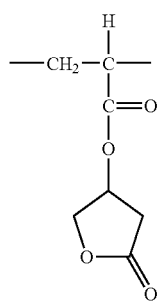

(IV-2)

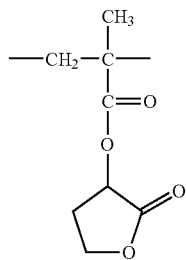

(IV-3)

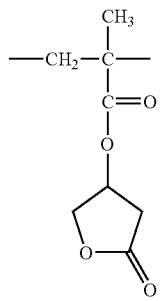

(IV-4)

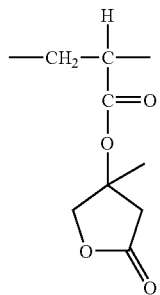

(IV-5)

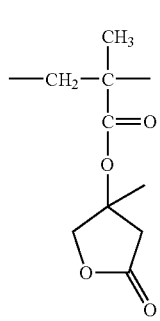

(IV-6)

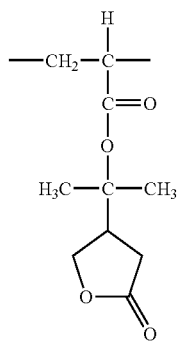

(IV-7)

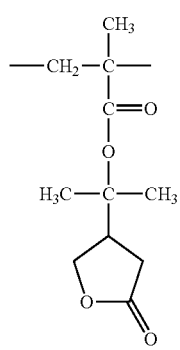 (IV-8)
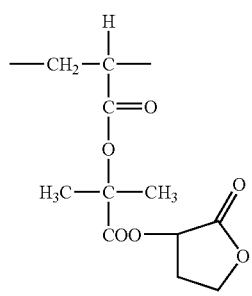 (IV-9)
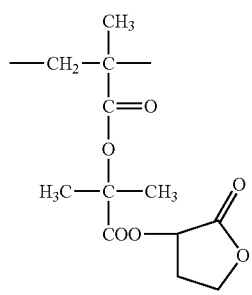 (IV-10)
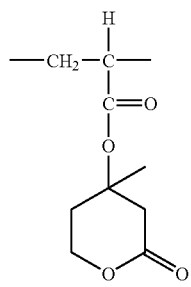 (IV-11)
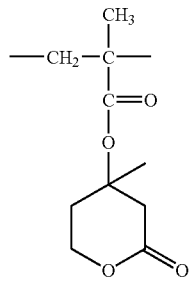 (IV-12)
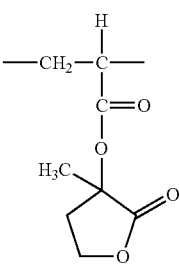 (IV-13)
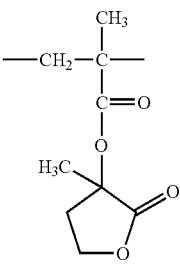 (IV-14)
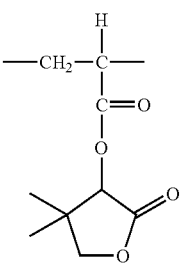 (IV-15)
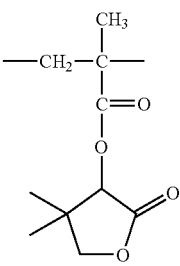 (IV-16)
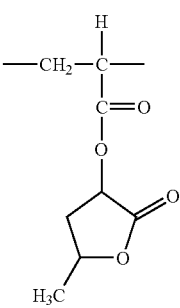 (IV-17)

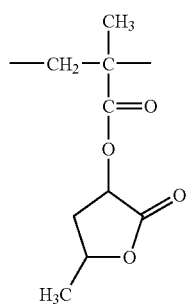
(IV-18)
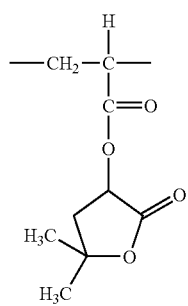
(IV-19)
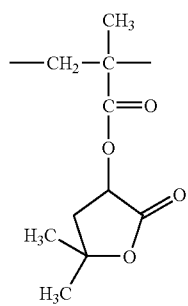
(IV-20)
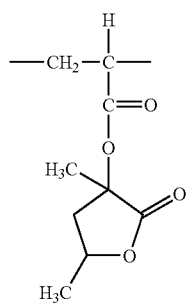
(IV-21)
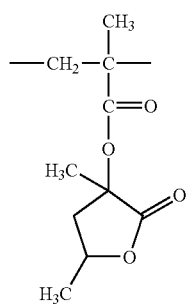
(IV-22)
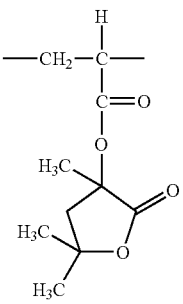
(IV-23)
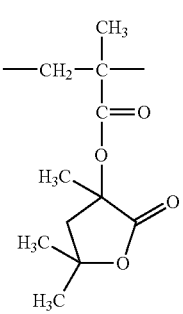
(IV-24)
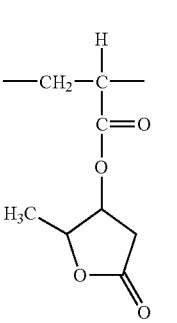
(IV-25)
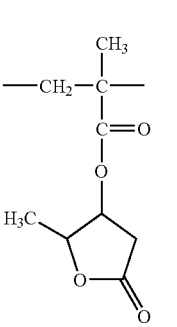
(IV-26)
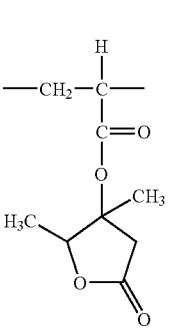
(IV-27)

-continued

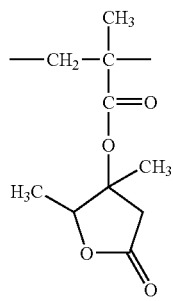
(IV-28)

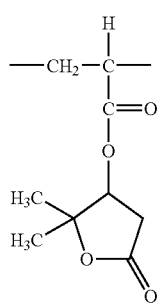
(IV-29)

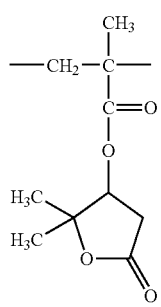
(IV-30)

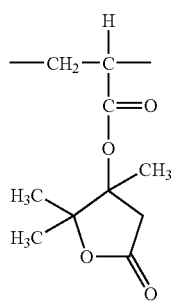
(IV-31)

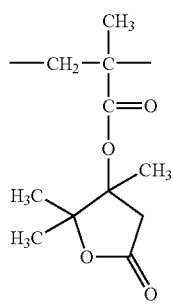
(IV-32)

-continued

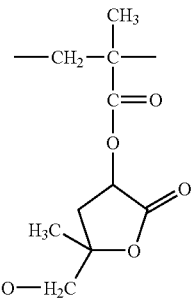
(IV-33)

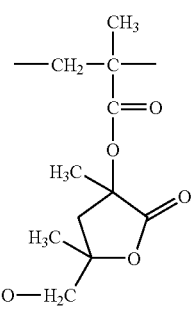
(IV-34)

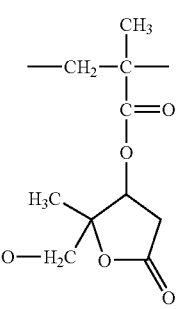
(IV-35)

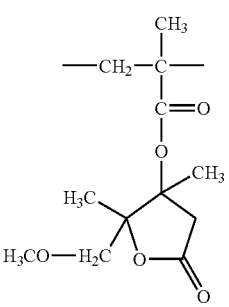
(IV-36)

Of the above-recited repeating units represented by formula (IV), (IV-17) to (IV-36) are preferred over the others from the viewpoint of more improving an exposure margin.

As to the structure of a repeating unit represented by formula (IV), the repeating units having acrylate structures are preferable from the viewpoint of improving edge roughness.

In addition, the present resin may contain repeating units having any of groups resented by formulae (V-1) to (v-4)

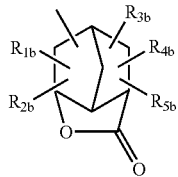
(V-1)

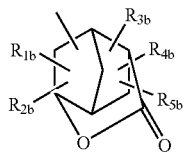
(V-2)

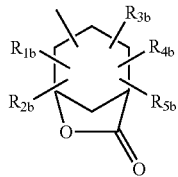
(V-3)

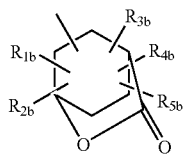
(V-4)

In each of formulae (V-1) to (V-4), $R_{1b}$ to $R_{5b}$ each independently represent a hydrogen atom, or an unsubstituted or substituted alkyl, cycloalkyl or an alkenyl group. Any two of $R_{1b}$ to $R_{5b}$ may combine with each other to form a ring.

The alkyl groups represented by $R_{1b}$ to $R_{5b}$ in formulae (V-1) to (V-4) each may be linear or branched alkyl groups, and may have substituents.

The linear or branched alkyl groups are preferably linear or branched alkyl groups including 1 to 12 carbon atoms, far preferably linear or branched alkyl groups including 1 to 10 carbon atoms, particularly preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group.

Suitable examples of the cycloalkyl group represented by $R_{1b}$ to $R_{5b}$ each includes cycloalkyl groups including 3 to 8 carbon atoms, such as a cyclopropyl group, a cyclopentyl group, a cyclohexyl group, a cycloheptyl group and a cyclooctyl group.

Suitable examples of the alkenyl group represented by $R_{1b}$ to $R_{5b}$ each includes alkenyl groups containing 2 to 6 carbon atoms, such as a vinyl group, a propenyl group, a butenyl group and a hexenyl group.

Examples of the ring formed by combining any two of $R_{1b}$ to $R_{5b}$ include 3- to 8-membered rings, such as a cyclopropane ring, a cyclobutane ring, a cyclopentane ring, a cyclohexane ring and a cyclooctane ring.

Incidentally, $R_{1b}$ to $R_{5b}$ in formulae (V-1) to (V-4) each may be attached to any of carbon atoms constituting the ring skeleton.

Suitable examples of substituents the alkyl group, the cycloalkyl group and the alkenyl group may have include alkoxy groups containing 1 to 4 carbon atoms, halogen atoms (fluorine, chlorine, bromine and iodine atoms), acyl groups containing 2 to 5 carbon atoms, acyloxy groups containing 2 to 5 carbon atoms, a cyano group, a hydroxyl group, a carboxyl group, alkoxycarbonyl groups containing 2 to 5 carbon atoms and a nitro group.

Examples of repeating units having the groups represented by formulae (V-1) to (V-4) include those represented by the following formula (A1):

(AI)

In formula (A1), $R_{b0}$ represents a hydrogen atom, a halogen atom, or a substituted or unsubstituted alkyl group caontaining 1 to 4 carbon atoms. Suitable examples of a substituent the alkyl group of $R_{b0}$ may have include those recited above as suitable substituents the alkyl group of $R_{1b}$ in formulae (V-1) to (v-4) each may have.

Examples of the halogen atom of $R_{b0}$ include a fluorine atom, a chlorine atom, a bromine atom and an iodine atom. As to $R_{b0}$, however, a hydrogen atom is preferable to the others.

A' represents a single bond, an ether group, an ester group, a carbonyl group, an alkylene group, or a divalent group formed by combining any two of the groups recited above.

$B_2$ represents a group represented by any one of formulae (V-1) to (V-4). Examples of the combined divalent group represented by A' include groups having the following formulae:

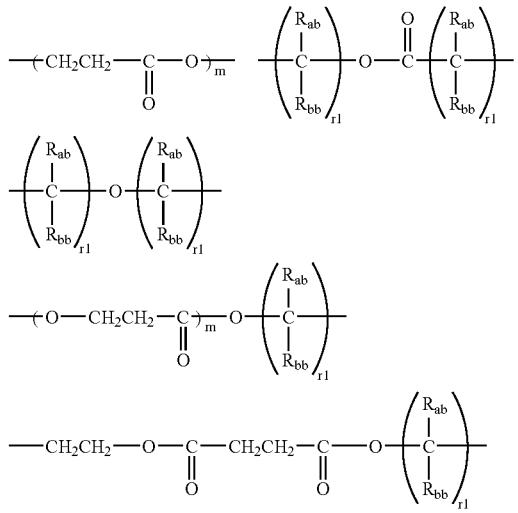

In the above formulae, $R_{ab}$ and $R_{bb}$ each represents a hydrogen atom, an alkyl group, a halogen atom, a hydroxyl group or an alkoxy group, and they may be the same or different.

The alkyl group may have a substituent, and may take a linear or branched form. Suitable examples thereof include lower alkyl groups, such as a methyl group, an ethyl group, a propyl group, an isopropyl group and a butyl group. And it is preferable to select the alkyl group from among a methyl group, an ethyl group, a propyl group and an isopropyl group. Examples of a substituent the substituted alkyl group has include a hydroxyl group, a halogen atom and alkoxy groups containing 1 to 4 carbon atoms.

Examples of the alkoxy group represented by $R_{ab}$ and $R_{bb}$ each include alkoxy groups containing 1 to 4 carbon atoms, such as a methoxy group, an ethoxy group, a propoxy group and a butoxy group. Examples of the halogen include a chlorine atom, a bromine atom, a fluorine atom and an iodine atom. r1 represents an integer of 1 to 10, preferably an integer of 1 to 4. m represents an integer of 1 to 3, preferably 1 or 2.

Examples of the repeating unit represented by formula (A1) are illustrated below, but these examples should not be construed as limiting the scope of the invention.

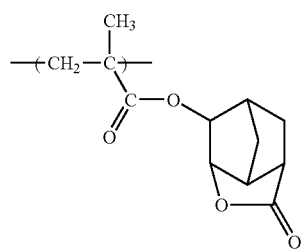
(AI-1)

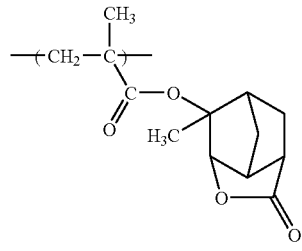
(AI-2)

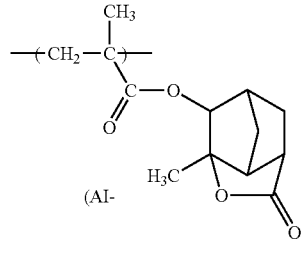
(AI-3)

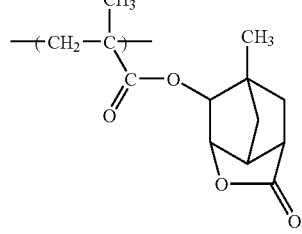
(AI-4)

-continued

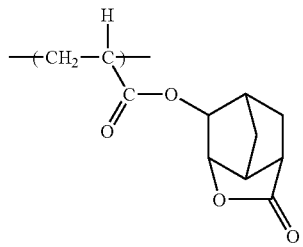
(AI-5)

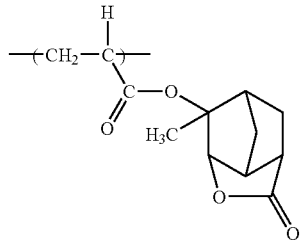
(AI-6)

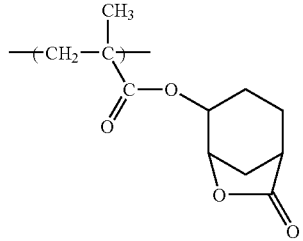
(AI-7)

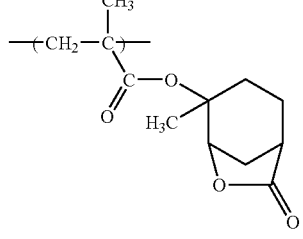
(AI-8)

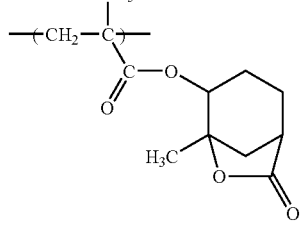
(AI-9)

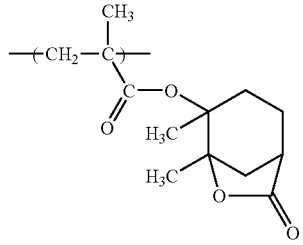
(AI-10)

-continued
(AI-11)
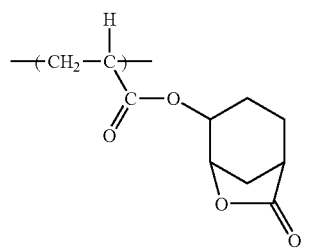
(AI-12)
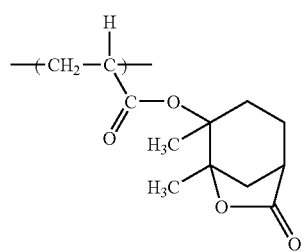
(AI-13)
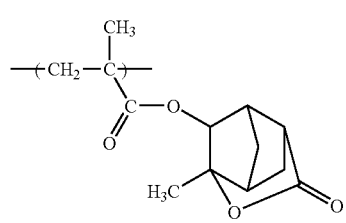
(AI-14)
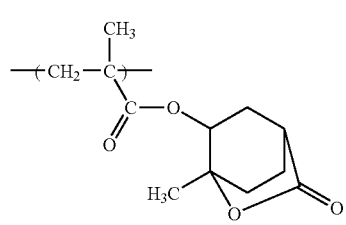
(AI-15)
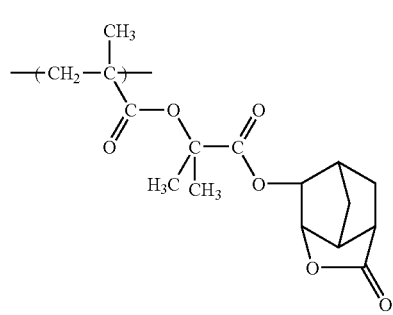
(AI-16)
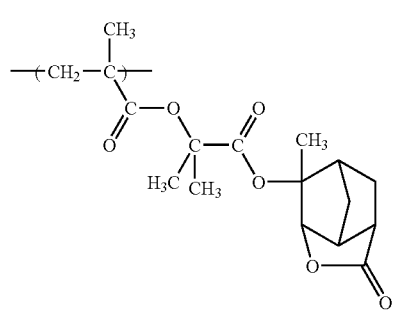
(AI-17)
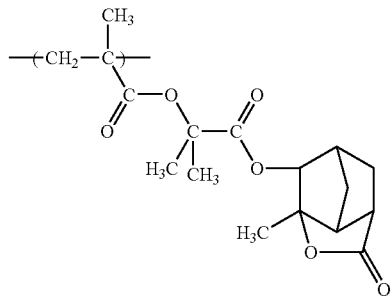
(AI-18)
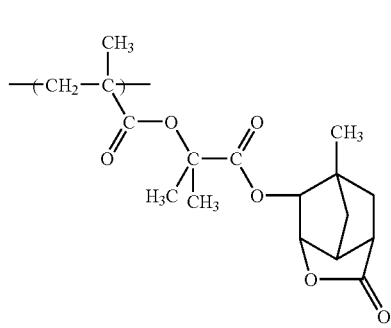
(AI-19)
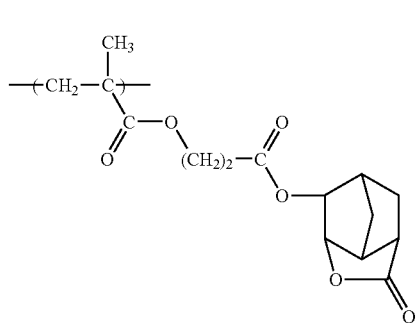
(AI-20)
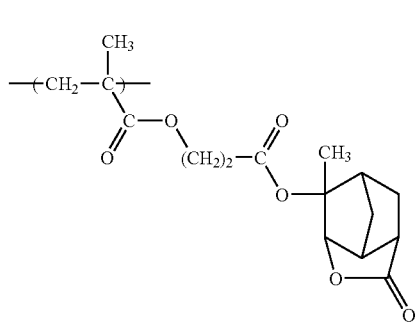
(AI-21)
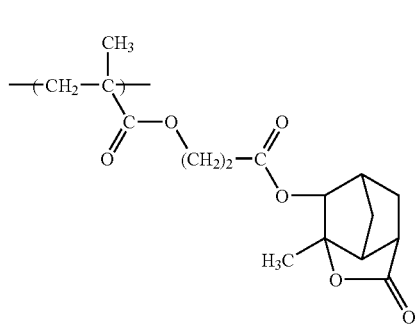

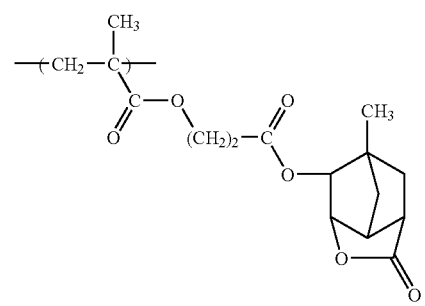
(AI-22)
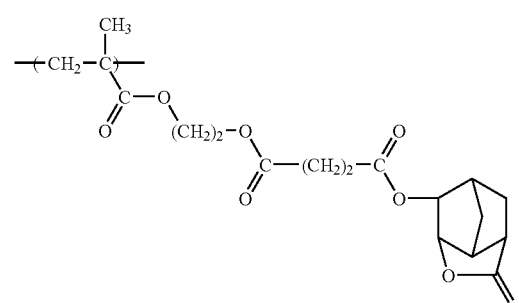
(AI-23)
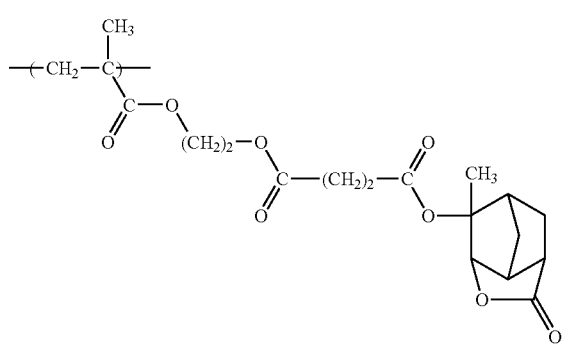
(AI-24)
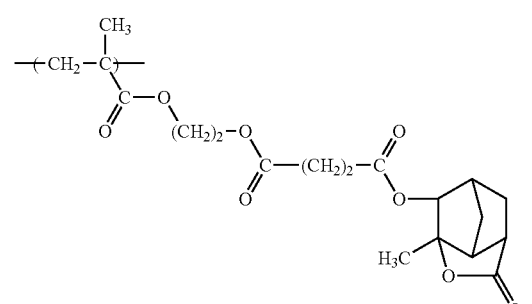
(AI-25)
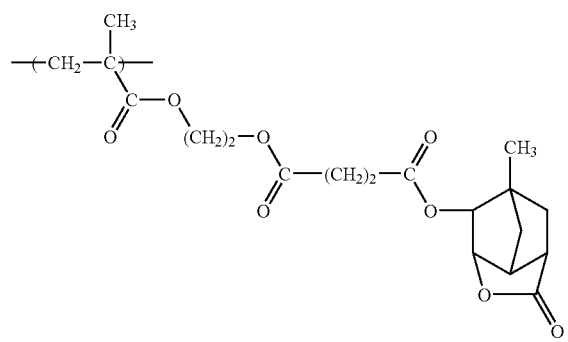
(AI-26)
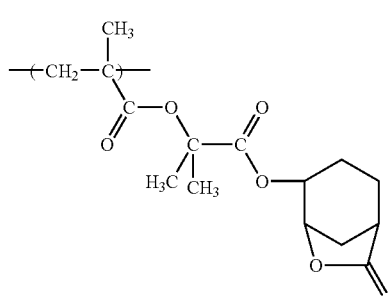
(AI-27)
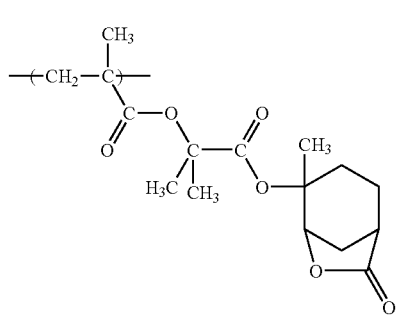
(AI-28)
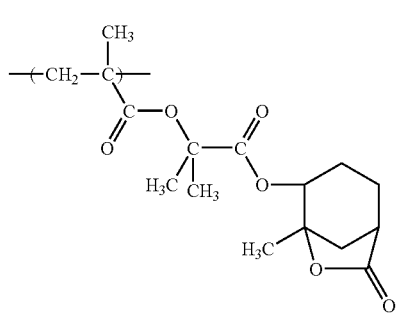
(AI-29)
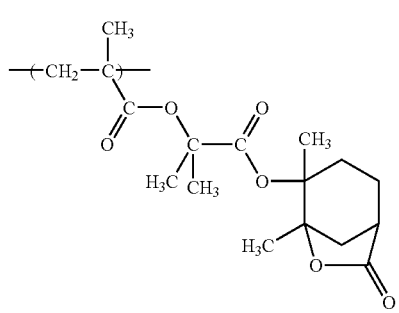
(AI-30)

(AI-31) 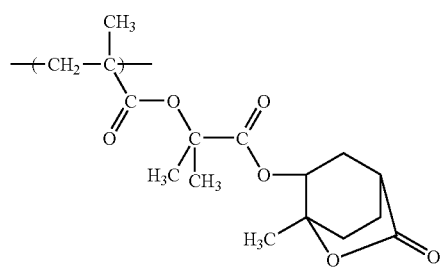
(AI-32) 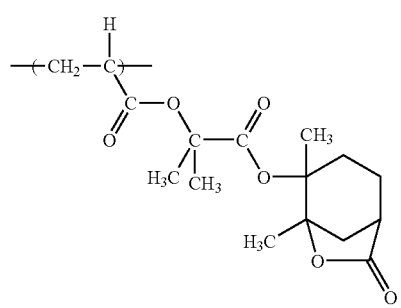
(AI-33) 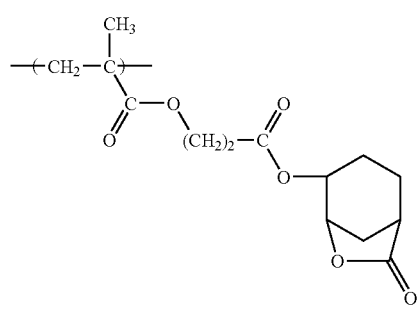
(AI-34) 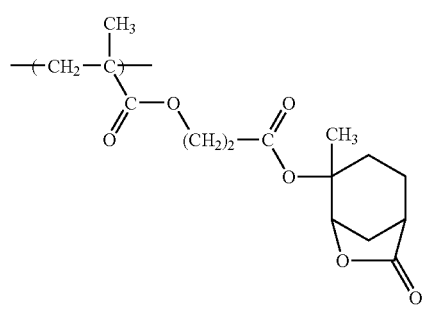
(AI-35) 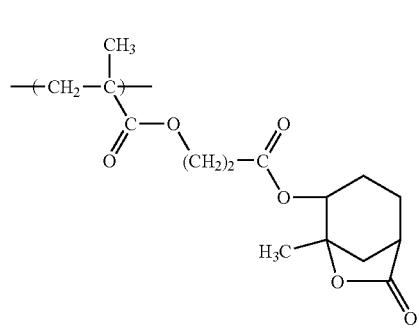
(AI-36) 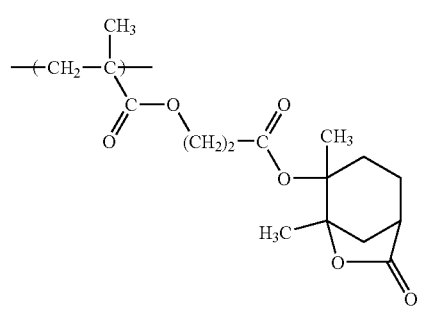
(AI-37) 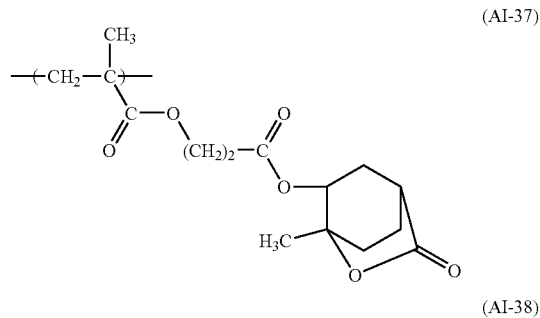
(AI-38) 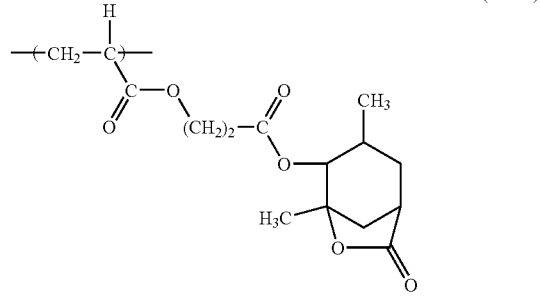
(AI-39) 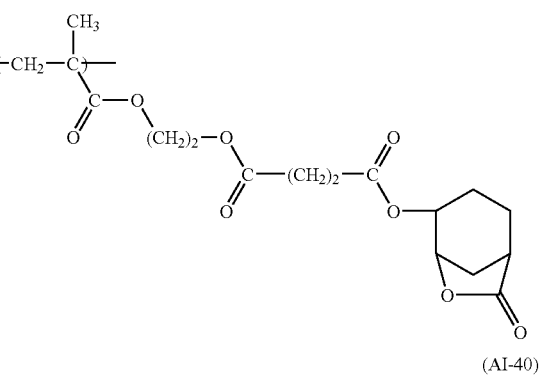
(AI-40) 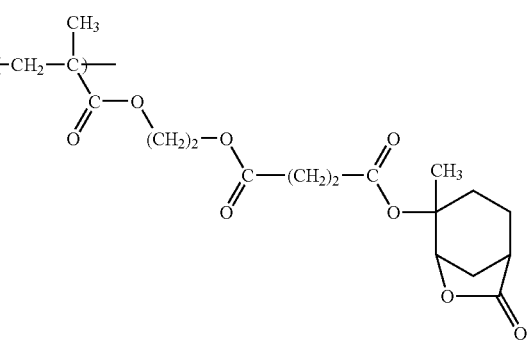

(AI-41)

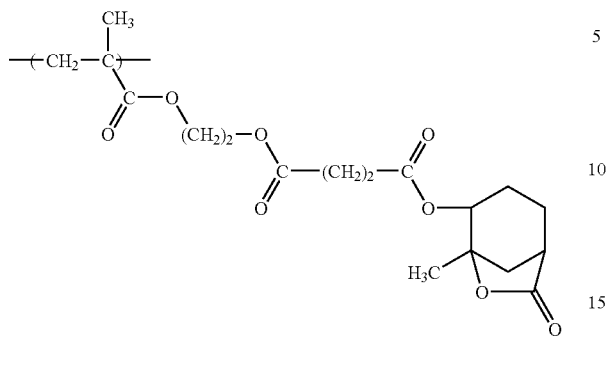

(AI-42)

(AI-43)

(AI-44)

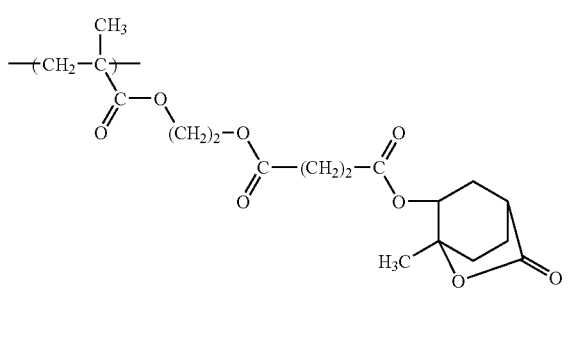

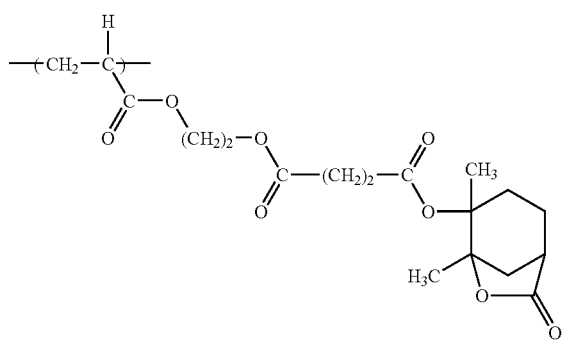

Additionally, the present acid-decomposable resin can contain repeating units represented by the following formula (VI):

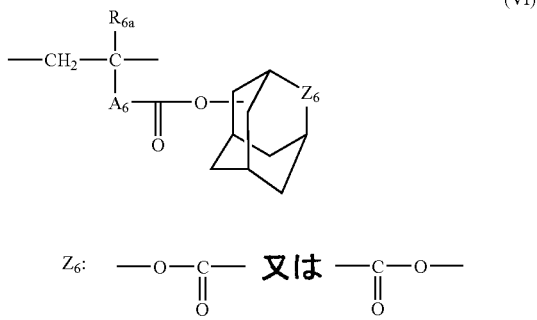

(VI)

$Z_6$: 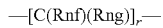

In formula (VI), A represents a single bond, or a group selected alone from or a combination of at least two groups selected from the class consisting of an alkylene group, a cycloalkylene group, an ether group, a thioether group, a carbonyl group and an ester group.

$R_{6a}$ represents an alkyl group containing 1 to 4 carbon atoms, a cyano group or a halogen atom.

Examples of the alkylene group of $A_6$ in formula (VI) include groups represented by the following formula:

—[C(Rnf)(Rng)]$_r$—

In the formula, Rnf and Rng each represents a hydrogen atom, an alkyl group, a halogen atom, a hydroxyl group or an alkoxy group, and they may be the same or different. The alkyl group may have a substituent and take a linear or branched form, with suitable examples including lower alkyl groups, such as a methyl group, an ethyl group, a propyl group, an isopropyl group and a butyl group. Further, it is preferable to select the alkyl group from among a methyl group, an ethyl group, a propyl group and an isopropyl group. Examples of a substitutent the alkyl group may have include a hydroxyl group, a halogen atom and an alkoxy group. Examples of the alkoxy group include alkoxy groups containing 1 to 4 carbon atoms, such as a methoxy group, an ethoxy group, a propoxy group and a butoxy group. Examples of the halogen atom include a chlorine atom, a bromine atom, a fluorine atom and an iodine atom. r is an integer of 1 to 10.

Examples of a cycloalkylene group represented by $A_6$ in formula (VI) include cycloalkylene groups containing 3 to 10 carbon atoms, such as a cyclopentylene group, a cyclohexylene group and a cyclooctylene group.

The $Z_6$-containing bridged alicyclic ring may have a substituent. Examples of such a substituent include a halogen atom, an alkoxy group (preferably containing 1 to 4 carbon atoms), an alkoxycarbonyl group (preferably containing 1 to 5 carbon atoms), an acyl group (e.g., a formyl group, a benzoyl group), an acyloxy group (e.g., a propylcarbonyloxy group, a benzoyloxy group), an alkyl group (preferably containing 1 to 4 carbon atoms), a carboxyl group, a hydroxyl group and an alkylsulfonylcarbamoyl group (e.g., —SO$_2$NHSO$_2$CH$_3$). The alkyl group as substituent may further be substituted by a hydroxyl group, a halogen atom or an alkoxy group (preferably containing 1 to 4 carbon atoms).

In formula (VI), the oxygen atom of the ester group bound to $A_6$ may be attached to any of the carbon atoms constituting the $Z_6$-containing bridged alicyclic ring structure.

Examples of repeating units represented by formula (VI) are illustrated below, but these examples should not be construed as limiting the scope of the invention.
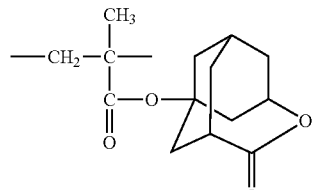
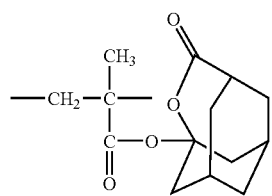
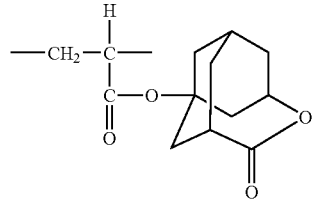
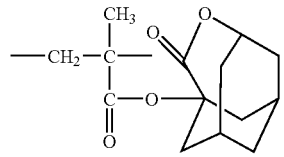
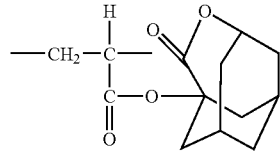
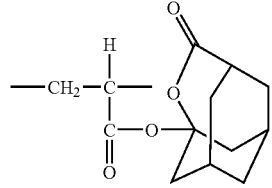
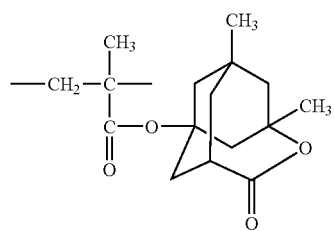
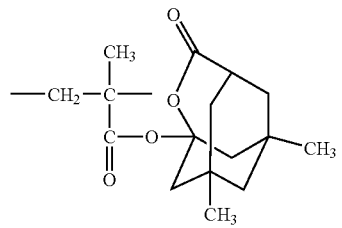
-continued
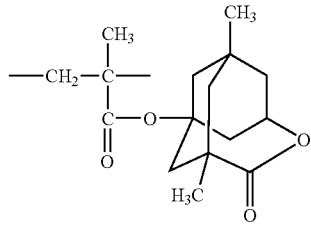
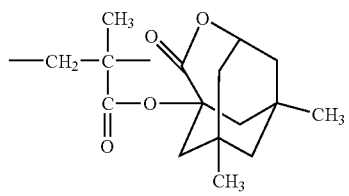
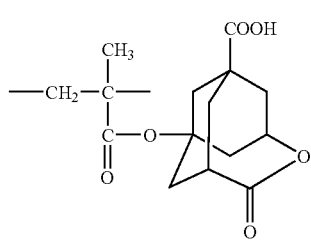
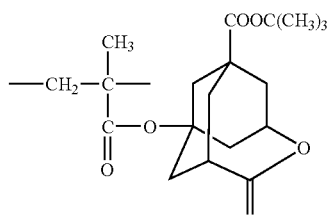
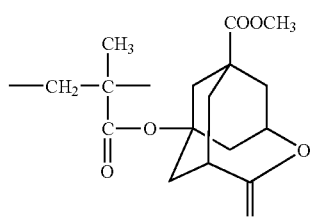
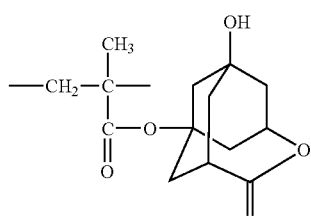
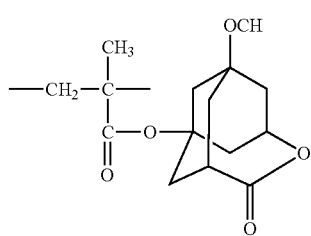

-continued

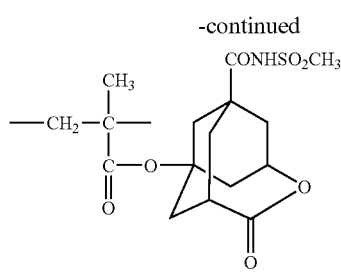

Furthermore, the present resin may contain repeating units having groups represented by the following formula (VII):

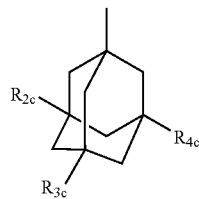

(VII)

In formula (VII), $R_2c$ to $R_4c$ each independently represents a hydrogen atom or a hydroxyl group, provided that at least one of them is a hydroxyl group.

The group represented by formula (VII) is preferably a dihydroxy-substituted group or a monohydroxy-substituted group, far preferably a dihydroxy-substituted group.

Examples of the repeating units having groups represented by formula (VII) include repeating units represented by the following formula (AII):

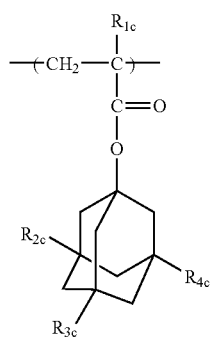

(AII)

In the formula, $R_1c$ represents a hydrogen atom or a methyl group, $R_2c$ to $R_4c$ each represents a hydrogen atom or a hydroxyl group, provided that at least one of them represents a hydroxyl group.

Examples of the repeating units having structures represented by formula (AII) are illustrated below, but these examples should not be construed as limiting the scope of the invention.

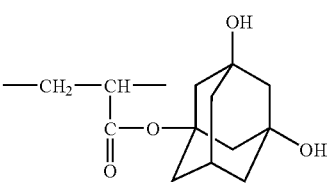
(1)

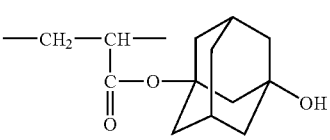
(2)

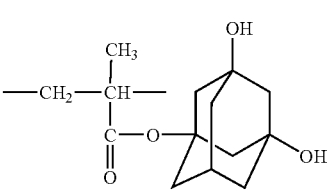
(3)

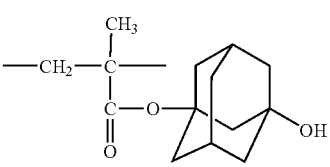
(4)

In addition to the repeating structural units illustrated above, the acid-decomposable resin of Component (A) can contain a wide variety of repeating structural units for the purpose of controlling dry etching resistance, standard developer suitability, adhesion to substrates, resist profile, and properties generally required of resist, such as resolution, heat resistance and sensitivity.

Examples of such repeating structural units include repeating structural units corresponding to monomers as recited below, but these examples should not be construed as limiting the scope of the invention.

By containing these additional repeating structural units, the acid-decomposable resin can have properties required thereof, particularly properties of:

(1) being soluble in solvents used for coating
(2) enabling film formation (glass transition point)
(3) being developable with alkali
(4) hardly causing a decline in film thickness (balance between hydrophilic and hydrophobic properties, selection of alkali-soluble groups)
(5) ensuring adhesion of unexposed areas to substrates
(6) being resistant to dry etching and so on.

Examples of such monomers include compounds, which each have at least one addition-polymerizable unsaturated bond, selected from acrylic acid esters, methacrylic acid esters, acrylamides, methacrylamides, allyl compounds, vinyl ethers or vinyl esters.

More specifically, the compounds recited above include the following monomers:

acrylic acid esters (preferably containing 1 to 10 carbon atoms in their respective alkyl moieties), such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetra hydroofurfuryl acrylate;

methacrylic acid esters (preferably containing 1 to 10 carbon atoms in their respective alkyl moieties), such as methyl methacrylate, ethyl methacrylate, propyl methacrylate, isopropylmethacrylate, amylmethacrylate, hexylmethacrylate, cyclohexyl methacrylate, benzyl methacrylate, chlorobenzyl methacrylate, octylmethacrylate, 2-hydroxyethylmethacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, fulfuryl methacrylate and tetrahydrofurfuryl methacrylate;

acrylamides, such as acrylamide, N-alkylacrylamides (containing 1 to 10 carbon atoms in their respective alkyl moieties, with examples including a methyl group, an ethyl group, a propyl group, a butyl group, a t-butyl group, a heptyl group, an octyl group, a cyclohexyl group and a hydroxyethyl group), N,N-dialkylacrylamides (containing 1 to 10 carbon atoms in their respective alkyl moieties, with examples including a methyl group, an ethyl group, a butyl group, an isobutyl group, an ethylhexyl group and a cyclohexyl group), N-hydroxyethyl-N-methylacrylamide and N-2-acetamidoethyl-N-acetylacrylamide;

methacrylamides, such as methacrylamide, N-alkylmethacrylamides (containing 1 to 10 carbon atoms in their respective alkyl moieties, with examples including a methyl group, an ethyl group, a t-butyl group, an ethylhexyl group, a hydroxyethyl group and a cyclohexyl group), N,N-dialkylmethacrylamides (each alkyl moiety of which is, e.g., an ethyl group, a propyl group or a butyl group) and N-hydroxyethyl-N-methylmethacrylamide;

allyl compounds, such as allyl esters (e.g., allyl acetate, allyl caproate, allyl caprylate, allyl laurate, allyl palmitate, allyl stearate, allyl benzoate, allyl acetoacetate, allyl lactate) and allyloxyethanol;

vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetra hydrofurfuryl vinyl ether);

vinyl esters, such as vinyl butyrate, vinyl isobutyrate, vinyl trimethylacetate, vinyl diethylacetate, vinyl valate, vinyl caproate, vinyl chloroacetate, vinyl dichloroacetate, vinyl methoxyacetate, vinyl botoxyacetate, vinyl acetacetate, vinyl lactate, vinyl-β-phenyl butyrate and vinyl chlorohexyl carboxylate;

dialkyl itaconates, such as dimethyl itaconate, diethyl itaconate and dibutyl itaconate;

dialkyl or monoalkyl esters of fumaric acid; and dibutyl fumarate.

In addition to those monomers, crotonic acid, itaconic acid, maleic anhydride, maleimide, acrylonitrile, methacrylonitrile and maleironitrile may be used for the aforesaid purposes.

Besides the monomers recited above, addition-polymerizable unsaturated compounds may be used as comonomers as long as they can form copolymers together with the monomers corresponding to the various repeating units as illustrated above.

The mole proportions of repeating structural units contained in the acid-decomposable resin are each determined appropriately so as to adjust the dry etching resistance of resist, the standard developer suitability of resist, adhesion to a substrate, resist profile, and characteristics generally required of resist, such as resolution, heat resistance and sensitivity.

The suitable amount of repeating units represented by formula (Ia) and repeating units represented by formula (Ib) in the acid-decomposable resin is from 30 to 70 mole %, preferably from 35 to 65 mole %, far preferably from 40 to 60 mole %, based on the total repeating structural units.

The mole ratio of the repeating units represented by formula (Ia) to the repeating units represented formula (Ib) is generally from 99/1 to 1/99, preferably from 90/10 to 10/90, far preferably from 80/20 to 20/80.

The suitable amount of the repeating units having partial structures containing alicyclic hydrocarbons represented by formulae (pIII) to (pV) in the acid-decomposable resin is from 30 to 70 mole %, preferably from 35 to 65 mole %, far preferably from 40 to 60 mole %, based on the total repeating structural units.

And the suitable amount of the repeating units represented by formulae (IV) to (VII) is from 5 to 70 mole %, preferably from 10 to 65 mole %, far preferably from 15 to 60 mole %, based on the total repeating structural units.

Further, the suitable amount of the repeating units having acid-decomposable groups, inclusive of the repeating units represented by formula (Ia) or (Ib) and the repeating units having partial structures containing alicyclic hydrocarbons represented by formulae (pIII) to (pV), is from 30 to 70 mole %, preferably 35 to 65 mole %, far preferably 40 to 60 mole %.

The acid-decomposable resins used in the invention can be synthesized according to the usual methods (e.g., radical polymerization). In a general synthesis method, for instance, monomer species are placed in a reaction vessel collectively or sequentially in the course of reaction and, if necessary, the monomer species placed are dissolved homogeneously in a reaction solvent, e.g., an ether such as tetrahydrofuran, 1,4-dioxane or diisopropyl ether, a ketone such as methyl ethyl ketone or methyl isobutyl ketone, or an ester such as acetone, and further a solvent capable of dissolving the present composition, such as propylene glycol monomethyl ether acetate. Thereafter, the polymerization is initiated by use of a commercially available radical initiator (e.g., an azo-type initiator, peroxide) in the atmosphere of an inert gas, such as nitrogen or argon, and under heating, if needed. At a request, the initiator is further added to the reaction system, or the initiator is divided in some portions and added in succession. At the conclusion of the reaction, the reaction mixture is poured into a solvent, and therefrom the intended polymer is recovered using a method for a powder or solid recovery.

The concentration of the reaction solution is at least 20% by weight, preferably at least 30% by weight, far preferably at least 40% by weight. The reaction temperature is from 10° C. to 150° C., preferably from 30° C. to 120° C., far preferably from 50° C. to 100° C.

The suitable weight average molecular weight (Mw) of resins relating to the invention is from 1,000 to 200,000, as measured by GPC and calculated in terms of polystyrene. It is advantageous for the resins to have a weight average molecular weight of at least 1,000 from the viewpoints of heat resistance and dry etching resistance, while the weight average molecular weight of 200,000 or below is preferable from the viewpoints of developability and film formability. When the present composition is used in ArF lithography, it is advantageous in the point of transparency to ArF light that the resin contains no aromatic ring.

Additionally, the absence of alicyclic groups in the main chain of the resin is advantageous from the viewpoints of superiority in breakthrough of contact holes and marked improvement in defocus latitude (tolerance on a deviation from the focus).

In the present positive photoresist composition for use in far ultraviolet lithography, the suitable mixing amount of all the resins relating to the invention in the total composition is from 40 to 99.99%. by weight, preferably from 50 to 99.97% by weight, based on the total solids in the resist composition.

[2] (B) Acid Generators

The component (B) in the invention is a compound represented by formula (I), (II) or (III), which generates an acid upon irradiation with one of actinic rays or radiation.

Specifically, the actinic rays and the radiation used for acid generation from the compound of component (B) include actinic rays such as infrared rays, visible light, ultraviolet light and far ultraviolet light, charged particle beams such as X-rays and electron beams, heat rays and ultrasonic waves.

(B-1) Compound Represented by Formula (I) or (II):

Firstly, compounds represented by formula (I) or (II) are illustrated below.

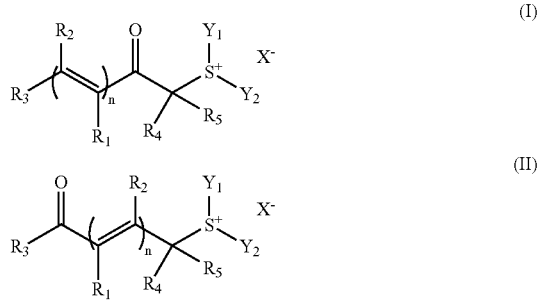

In formulae (I) and (II), $R_1$ to $R_3$, which may be the same or different, each represents a hydrogen atom, an alkyl group, an alkenyl group, an aryl group or an alkoxy group.

$R_4$ and $R_5$, which may be the same or different, each represents a hydrogen atom, a cyano group, an alkyl group, an aryl group or an alkoxy group.

$Y_1$ and $Y_2$, which may be the same or different, each represents an alkyl group, an aryl group, an aralkyl group or a hetero atom-containing aromatic group.

n represents an integer of 1 to 4. When n is 2 or more, a plurality of $R_1$s may be the same or different and a plurality of $R_2$s may also be the same or different.

Any two or more among $R_1$ to $R_3$, $R_4$, $R_5$, $Y_1$ and $Y_2$ may be bonded with each other to form a cyclic structure (ring).

The compound of component (B) may have two or more of structures represented by formula (I) or (II) in a state that the structures are bound to each other via one or more of a linkage group at any sites of $R_1$s, $R_2$s, $R_3$s, $R_4$s, $R_5$s, $Y_1$s and $Y_2$s.

$X^-$ Represents a Non-nucleophilic Anion.

In formulae (I) and (II), $R_1$ to $R_3$, which may be the same or different, each represents a hydrogen atom, or an alkyl, alkenyl, aryl or alkoxy group which may have a substituent. $R_4$ and $R_5$, which may be the same or different, each represent a hydrogen atom, a cyano group, or an alkyl, aryl or alkoxy group which may have a substituent. $Y_1$ and $Y_2$, which may be the same or different, each represent an alkyl, aryl, aralkyl or hetero atom-containing aromatic group which may have a substituent. n represents an integer of 1 to 4. When n is 2 or more, a plurality of $R_1$s may be the same or different and a plurality of $R_2$s may also be the same or different. Any two or more among $R_1$ to $R_3$, $R_4$, $R_5$, $Y_1$ and $Y_2$ may be bonded with each other to form a cyclic structure. Further, the compound of component (B) may have two or more of structures represented by formula (I) or (II) in a state that the structures are bonded to each other via one or more of a linkage group at any sites of $R_1$s, $R_2$s, $R_3$s, $R_4$s, $R_5$s, $Y_1$s and $Y_2$s. $X^-$ represents a non-nucleophilic anion.

The alkyl groups represented by $R_1$ to $R_5$, $Y_1$ and $Y_2$ may have substituents. They are preferably alkyl groups containing 1 to 10 carbon atoms. The examples thereof include linear, branched and cyclic alkyl groups such as a methyl group, an ethyl group, a propyl group, an n-butyl group, a sec-butyl group, a t-butyl group, a pentyl group, a cyclopentyl group, a hexyl group and a cyclohexyl group. The alkyl chain of an alkyl group as recited above may contain an oxygen atom, a sulfur atom or a carbonyl group.

The aryl groups represented by $R_1$ to $R_5$, $Y_1$ and $Y_2$ may have substituents. They are preferably aryl groups containing 6 to 14 carbon atoms. The examples thereof include a phenyl group, a tolyl group and a naphthyl group.

The alkenyl groups represented by $R_1$ to $R_3$ may have substituents. They are preferably alkenyl groups containing 2 to 6 carbon atoms. The examples thereof include a vinyl group, a propenyl group, an allyl group, a butenyl group, a pentenyl group, a hexenyl group, a cyclopentenyl group, a cyclohexenyl group, 2-oxocyclopentenyl group and 3-oxocyclohexenyl group.

The alkoxy groups represented by $R_1$ to $R_5$ may have substituents. They are preferably alkoxy groups containing 1 to 8 carbon atoms. The examples thereof include a methoxy group, an ethoxy group, an n-propoxy group, an isopropoxy group, a butoxy group, a pentoxy group, an allyloxy group and an octoxy group.

The aralkyl groups represented by $Y_1$ and $Y_2$ are preferably aralkyl groups containing 7 to 12 carbon atoms. The examples thereof include a benzyl group, a phenetyl group and cumyl group.

The term "a hetero atom-containing aromatic group" as used above is intended to include aryl groups having 4 to 14 carbon atoms and containing hetero atoms, such as a nitrogen atom, an oxygen atom and a sulfur atom, in their respective aromatic rings.

Examples of hetero atom-containing aromatic groups represented by $Y_1$ and $Y_2$ include aromatic hydrocarbon groups of heterocyclic type, such as a furanyl group, a thiophenyl group, a pyrrolyl group, a pyridyl group and an indolyl group.

The ring structure formed by bonding any two or more among $R_1$ to $R_3$, $R_4$, $R_5$, $Y_1$ and $Y_2$ includes a ring structure formed by combining $R_1$ or $R_2$ with $R_3$, a ring structure formed by combining $R_1$ or $R_2$ with $R_4$ or $R_5$, a ring structure formed by combining $R_3$ with $R_4$ or $R_5$, a ring structure formed by combining $R_1$, $R_2$ and $R_4$ or $R_5$, a ring structure formed by combining $R_1$, $R_2$, $R_3$ and $R_4$ or $R_5$, and a ring structure formed of a $Y_1$–$Y_2$ combination and the $S^+$ in formula (I) or (II).

When $R_1$ or $R_2$ is bonded with $R_3$ to form a ring structure, the group formed by combining $R_1$ or $R_2$ with $R_3$ is preferably an alkylene group containing 1 to 10 carbon atoms, which may contain a heteroatom in its chain. The examples thereof include a methylene group, an ethylene group, a propylene group, a butylene group, a pentylene group and a hexylene group.

When $R_1$ or $R_2$ is bonded with $R_4$ or $R_5$ to form a ring structure, the group formed by bonding $R_1$ or $R_2$ with $R_4$ or $R_5$ is, e.g., an alkylene group or a carbonyl group. Suitable examples of such an alkylene group include alkylene groups containing 1 to 10 carbon atoms, such as a methylene group, an ethylene group, a propylene group, a butylene group, a pentylene group and a hexylene group.

When $R_3$ is bonded with $R_4$ or $R_5$ to form a ring structure, the group formed by bonding $R_3$ with $R_4$ or $R_5$ is preferably an alkylene group containing 1 to 10 carbon atoms, such as a methylene group, an ethylene group, a propylene group, a butylene group, a pentylene group or a hexylene group.

Examples of a ring structure formed by combining $R_1$, $R_2$ and $R_4$ or $R_5$ and examples of a ring structure formed by combining $R_1$, $R_2$, $R_3$ and $R_4$ or $R_5$ include bicyclic condensed ring structures containing 5 to 15 carbon atoms.

$Y_1$ and $Y_2$ may combine and form a ring structure together with the $S^+$ in formula (I) or (II).

In this case, the group formed by bonding $Y_1$ with $Y_2$ is, e.g., an alkylene group containing 4 to 10 carbon atoms, preferably a butylene group, a pentylene group or a hexylene group, particularly preferably a butylene group or a pentylene group.

Incidentally, the ring formed by a $Y_1$–$Y_2$ combination and the $S^+$ in formula (I) or (II) may contain a hetero atom.

Examples of a substituent each of the alkyl group, the alkenyl group, the aryl group, the aralkyl group, the aromatic group and the ring structures may have include a nitro group, a halogen atom, a carboxyl group, a hydroxyl group, an oxo group, an amino group, a cyano group, and an alkoxy group (preferably containing 1 to 5 carbon atoms). Of these groups, the aryl group and the aralkyl group may further be substituted by an alkyl group (preferably an alkyl group containing 1 to 5 carbon atoms).

As a substituent of the alkyl group, a halogen atom, a hydroxyl group and an alkoxy group are preferred.

Examples of a non-nucleophilic anion $X^-$ include sulfonic acid anions, carboxylic acid anions, bis (alkylsulfonyl) imide anions, and tris(alkylsulfonyl)methide anions.

The term "a non-nucleophilic anion" is defined as an anion having significantly low ability to cause nucleophilic reaction, and so capable of inhibiting aging decomposition by intramolecular nucleophilic reaction. By containing such an anion, the storage stability of resist can be enhanced.

Examples of a sulfonic acid anion include alkylsulfonic acid anions, arylsulfonic acid anions and camphorsulfonic acid anions.

Examples of a carboxylic acid anion include alkylcarboxylic acid anions, arylcarboxylic acid anions and aralkylcarboxylic acid anions.

Suitable examples of the alkyl moiety of an alkylsulfonic acid anion include alkyl groups containing 1 to 30 carbon atoms, such as a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

Suitable examples of the aryl moiety of an arylsulfonic acid anion include aryl groups containing 6 to 14 carbon atoms, such as a phenyl group, a tolyl group and a naphthyl group.

The alkyl moiety of the alkylsulfonic acid anion and the aryl moiety of the arylsulfonic acid anion may have substituents.

Examples of such substituents include halogen atoms, alkyl groups, alkoxy groups and alkylthio groups.

The halogen atoms include a chlorine atom, a bromine atom, a fluorine atom and an iodine atom.

The alkyl groups are preferably alkyl groups containing 1 to 20 carbon atoms, such as a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group.

The alkoxy groups are preferably alkoxy groups containing 1 to 5 carbon atoms, such as a methoxy group, an ethoxy group, a propoxy group and a butoxy group.

The alkylthio groups are preferably alkylthio groups containing 1 to 20 carbon atoms, such as a methylthio group, an ethylthio group, a propylthio group, an isopropylthio group, an n-butylthio group, an isobutylthio group, a sec-butylthio group, a pentylthio group, a neopentylthio group, a hexylthio group, a heptylthio group, an octylthio group, a nonylthio group, a decylthio group, an undecylthio group, a dodecylthio group, a tridecylthio group, a tetradecylthio group, a pentadecylthio group, a hexadecylthio group, a heptadecylthio group, an octadecylthio group, a nonadecylthio group and a eicosylthio group. Incidentally, the alkyl groups, the alkkoxy groups and the alkylthio groups may further be substituted by halogen atoms (preferably fluorine atoms).

Examples of alkyl moieties in the alkylcarboxylic acid anions include the groups recited above as examples of alkyl moieties in the alkylsulfonic acid anions.

Examples of aryl moieties in the aryllcarboxylic acid anions include the groups recited above as examples of aryl moieties in the arylsulfonic acid anions.

Suitable examples of aralkyl moieties of the aralkylcarboxylic acid anions include aralkyl groups containing 6 to 12 carbon atoms, such as a benzyl group, a phenetyl group, a naphthylmethyl group and a naphthylethyl group.

The alkyl, aryl and aralkyl moieties contained in the alkyl-, aryl- and aralkylcarboxylic acid anions, respectively, may further have substituents. Examples of such substituents include the same halogen atoms, alkyl groups, alkoxy groups and alkoxythio groups as in the case of the arylsulfonic acid anions.

Suitable examples of alkyl moieties contained in the bis(alkylsulfonyl)imide anions and the tris(alkylsulfonyl) methide anions include alkyl groups containing 1 to 5 carbon atoms, such as a methyl group, an ethyl group, a propyl group, an isopropyl group, an n-butyl group, an isobutyl group, a sec-butyl group, a pentyl group and a neopentyl group. These alkyl groups may have substituents. Examples of such substituents include halogen atoms, alkoxy groups and alkylthio groups.

Examples of other non-nucleophilic anions include fluorophosphate ion, fluoroborate ion and fluoroantimonate ion.

Of the non-nucleophilic anions recited as the X⁻, an alkanesulfonic acid anion substituted by a fluorine atom at the α-position of sulfonic acid group, an arylsulfonic acid anion substituted by a fluorine atom or a fluorine-containing group, an bis (alkylsulfonyl) imide anion the alkyl moieties of which are substituted by fluorine atoms and a tris(fluoroalkylsulfonyl)methide anion the alkyl moieties of which are substituted by fluorine atoms are preferred over the others. Among these fluorine-containing anions, those preferred in particular are perfluoroalkanesulfonic acid anions containing 1 to 8 carbon atoms, notably nonafluorobutanesulfonic acid anion and perfluorooctanesulfonic acid anion.

In formula (I) or (II), two or more of structures represented by formula (I) or (II) may be present in a state that they are bonded to each other via one or more of a linkage group at the sites of their respective $R_1$s, $R_2$s, $R_3$s, $R_4$s, $R_5$s, $Y_1$s or $Y_2$s.

The acid generator (B) represented by formula (I) or (II) is characterized by a double bond conjugated with the carbonyl group. The presence of such a double bond can stabilize an excited state of the acid generator to result in enhancement of acid generation efficiency.

Further, formation of a ring structure by combining $R_1$ or $R_2$ with $R_4$ or $R_5$, or formation of a ring structure by combining $R_3$ with $R_4$ or $R_5$ is advantageous. This is because such a ring structure enables the acid generator to have a fixed conformation in which the π* orbital of the carbonyl group and the σ orbital of C—S⁺ becomes parallel, and thereby the acid generating capability is further heightened.

In formula (I) or (II), n is preferably 1 or 2, particularly preferably 1.

It is preferable that any two among $R_1$ to $R_5$ are combined via an alkylene group to form a 5- to 7-membered ring or a polycyclic ring structure containing a 5- to 7-membered ring.

It is also preferable that $R_4$ and $R_5$ are each a hydrogen atom or an alkyl group.

In addition, it is preferable that $Y_1$ and $Y_2$ are combined via an alkylene group to form a 5- to 7-membered ring.

Suitable examples of compounds represented by formulae (I) and (II) respectively are illustrated below, but these examples should not be construed as limiting the scope of the invention.

(I-1)
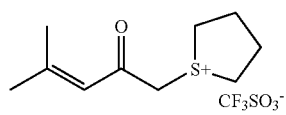

(I-2)
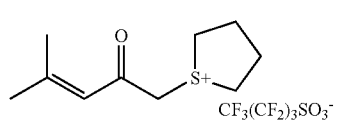

(I-3)
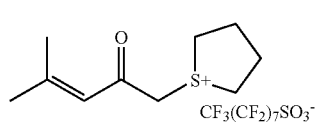

-continued (I-4)
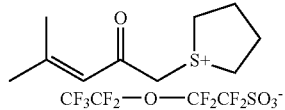

(I-5)
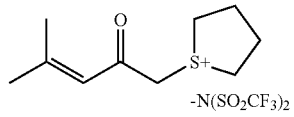

(I-6)
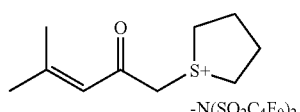

(I-7)
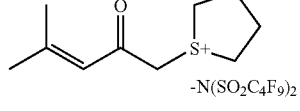

(I-8)
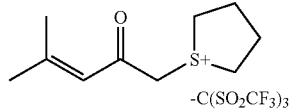

(I-9)
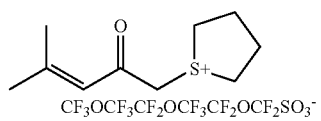

(I-10)
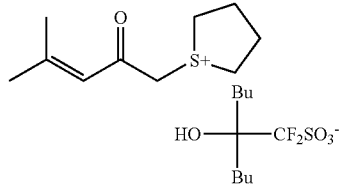

(I-11)
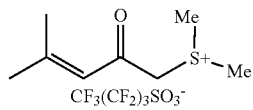

(I-12)
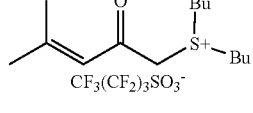

(I-13)
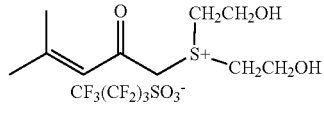

(I-14)
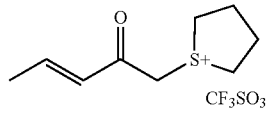

(I-15)
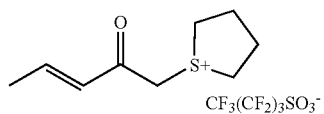

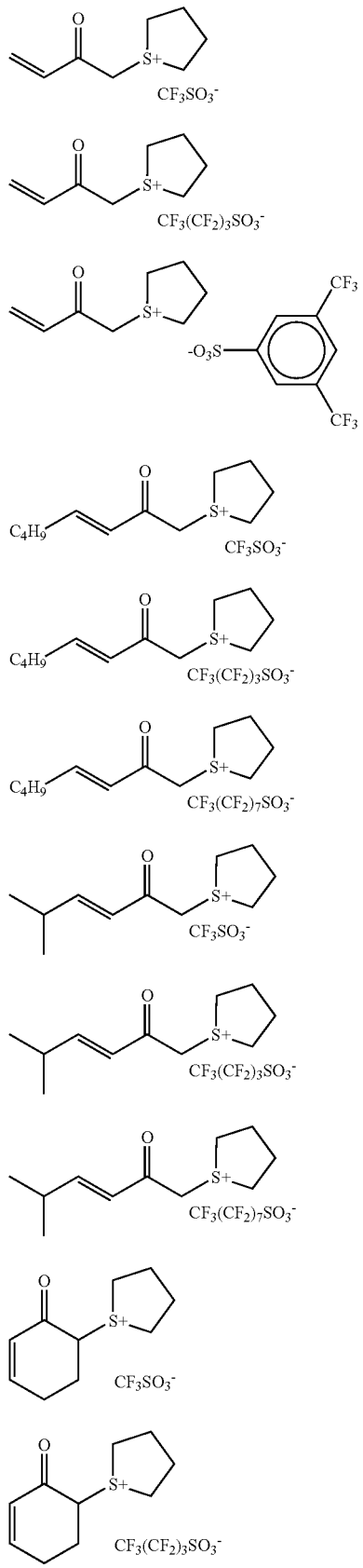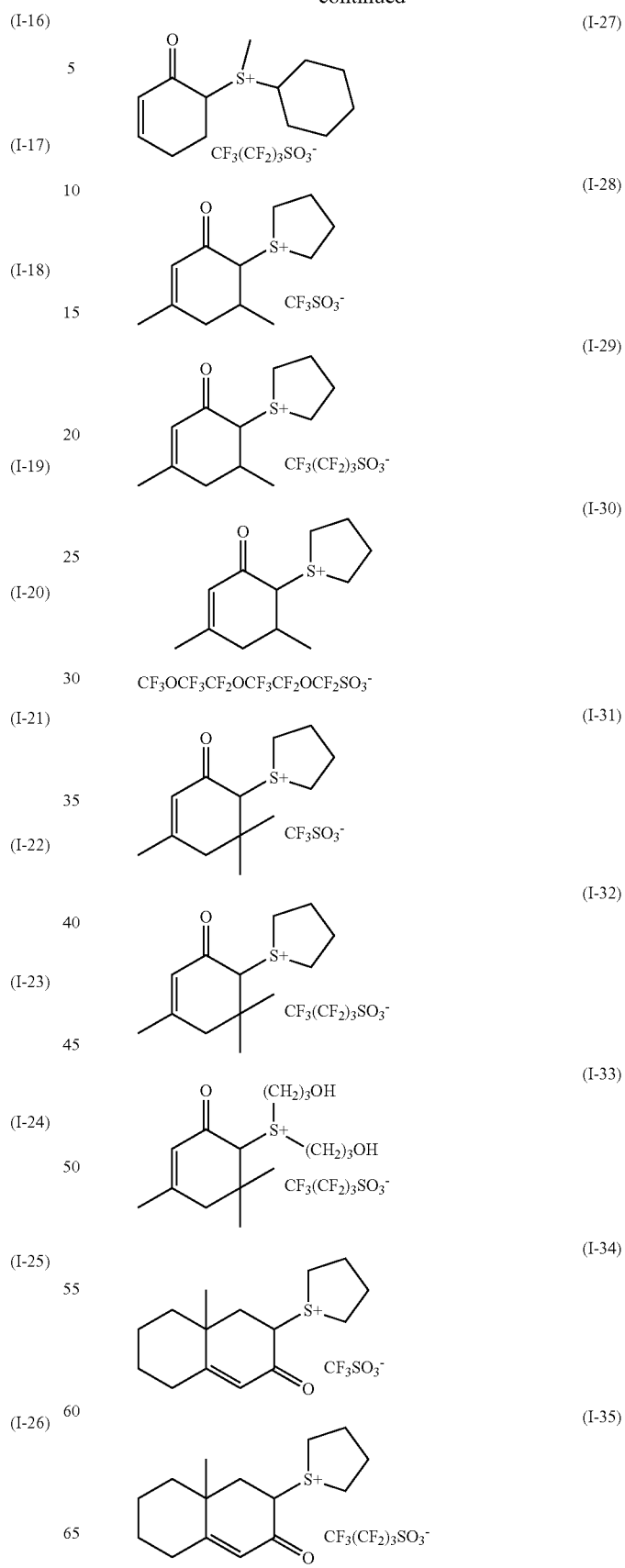

-continued
(I-36)
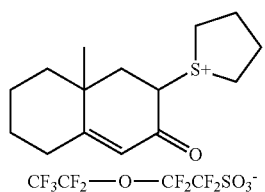
(I-37)
(I-38)
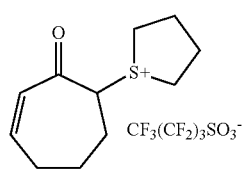
(I-39)
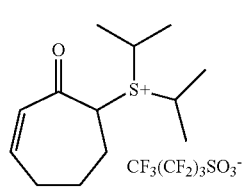
(I-40)
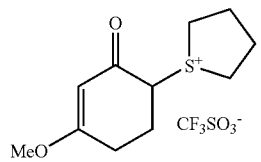
(I-41)
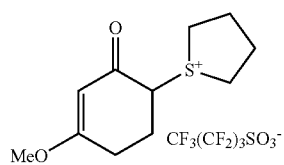
(I-42)
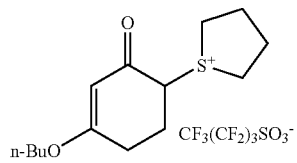
(I-43)
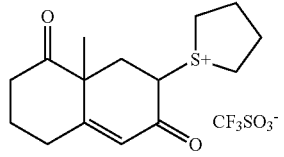
(I-44)
-continued
(I-45)
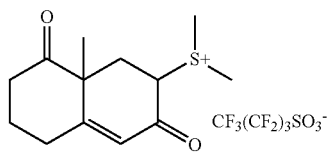
(I-46)
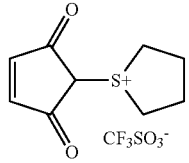
(I-47)
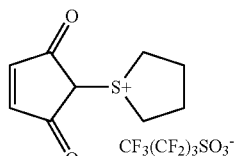
(I-48)
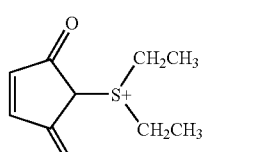
(I-49)
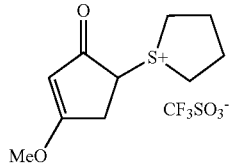
(I-50)
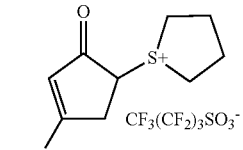
(I-51)
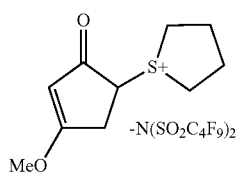
(I-52)
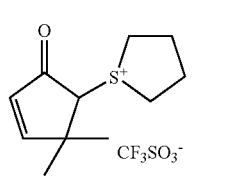
(I-53)
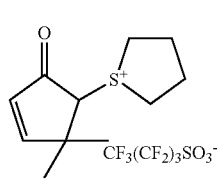

-continued
(I-54) 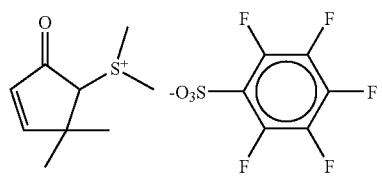
(I-55) 
(I-56) 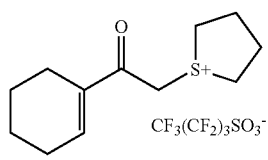
(I-57) 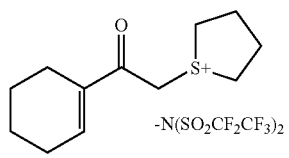
(I-58) 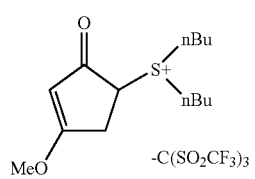
(I-59) 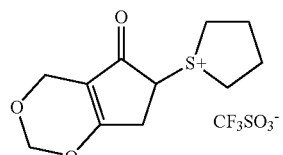
(I-60) 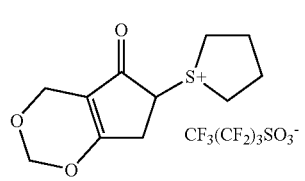
(I-61) 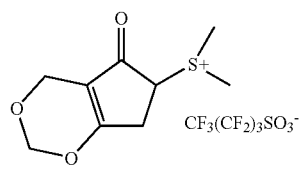
(I-62) 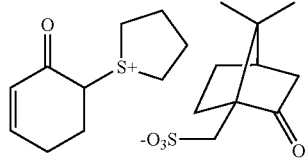
-continued
(I-63) 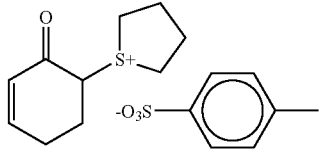
(I-64) 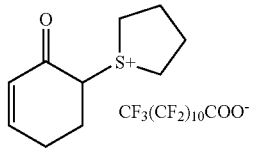
(I-65) 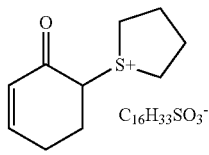
(I-66) 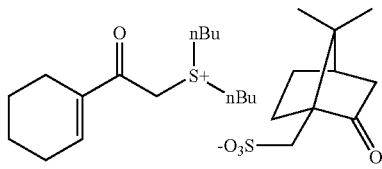
(I-67) 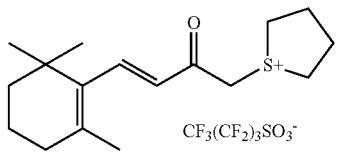
(I-68) 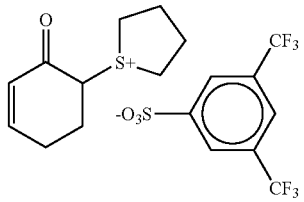
(I-69) 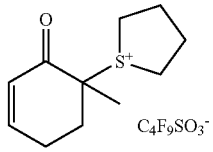
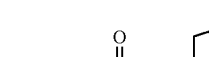
(I-70) 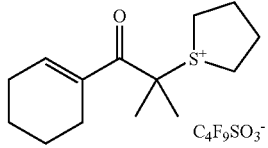
(IA-1) 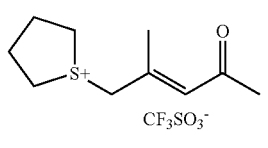

-continued
(IA-2)
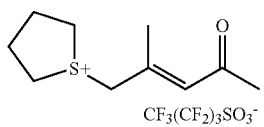
(IA-3)
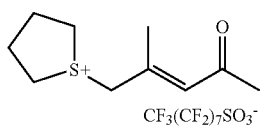
(IA-4)
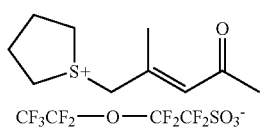
(IA-5)
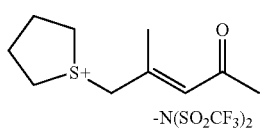
(IA-6)
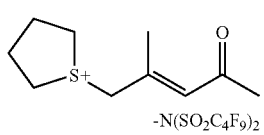
(IA-7)
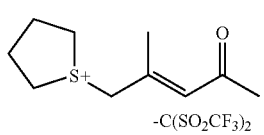
(IA-8)
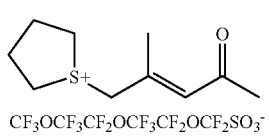
(IA-9)
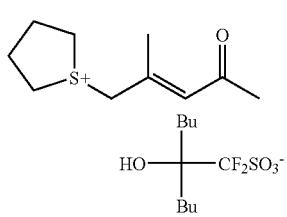
(IA-10)
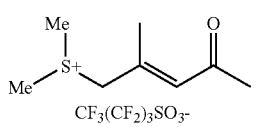
(IA-11)
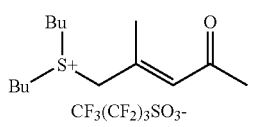
(IA-12)
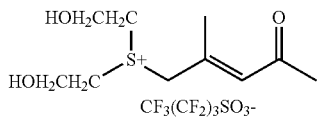
-continued
(IA-13)
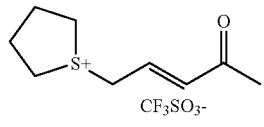
(IA-14)
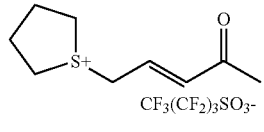
(IA-15)
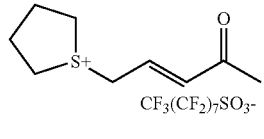
(IA-16)
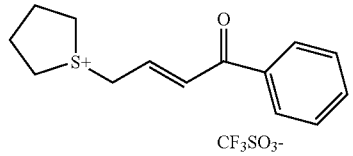
(IA-17)
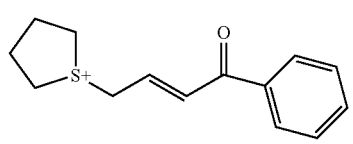
(IA-18)
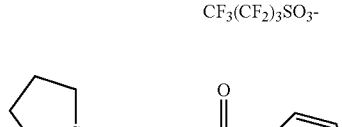
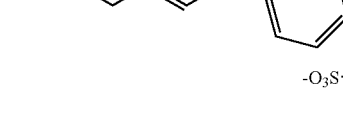
(IA-19)
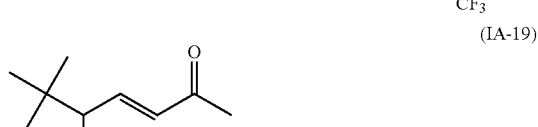
(IA-20)
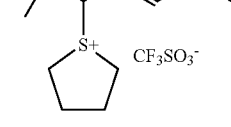
(IA-21)
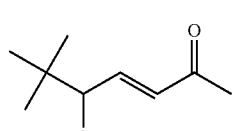
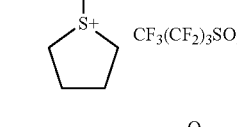
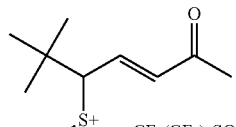

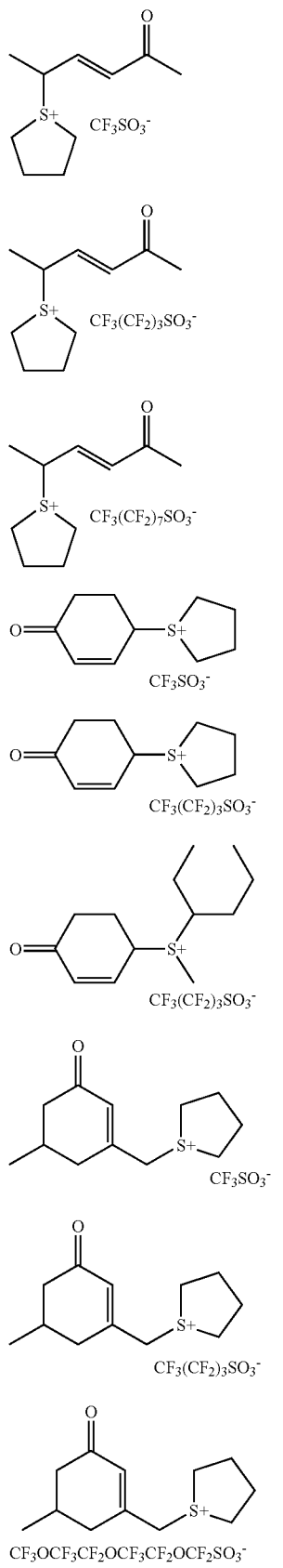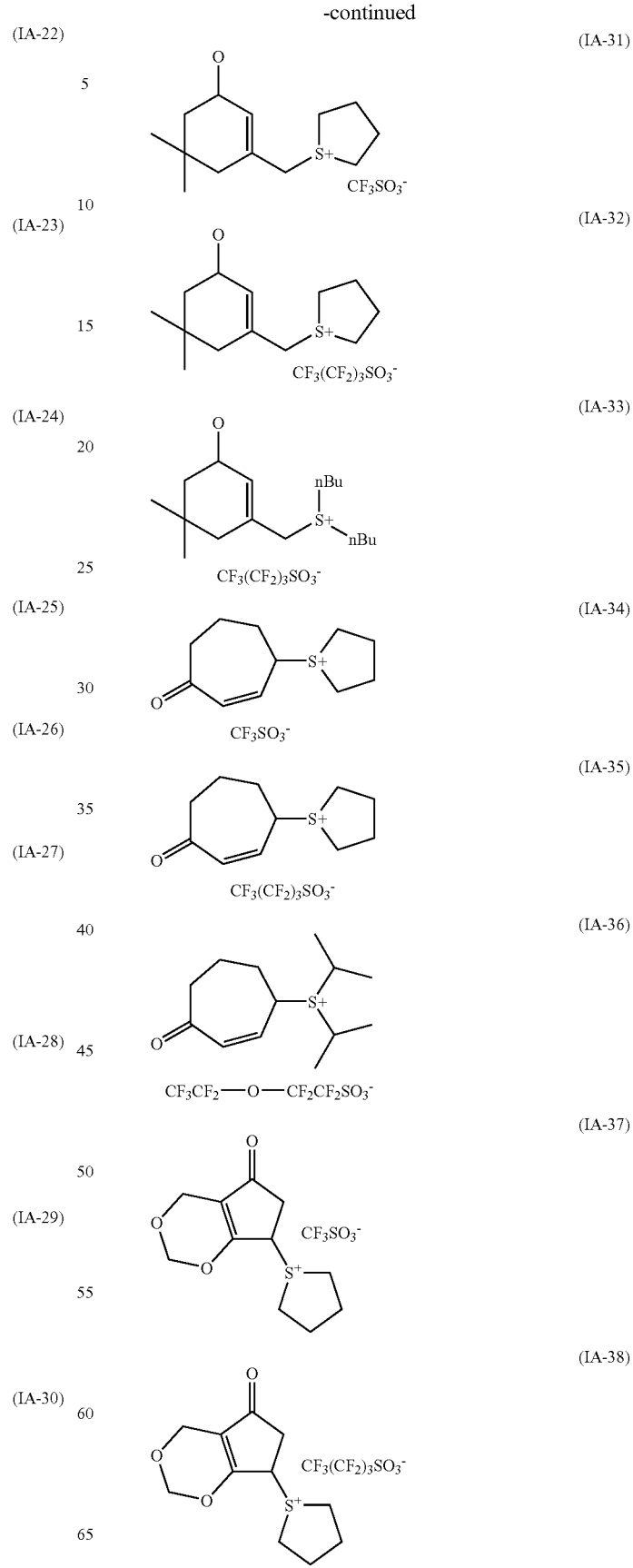

-continued
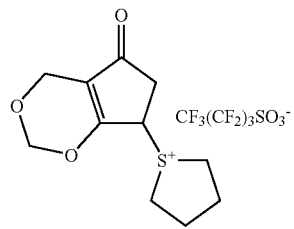 (IA-39)
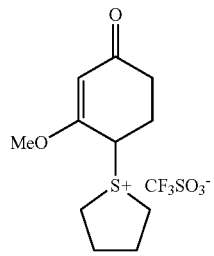 (IA-40)
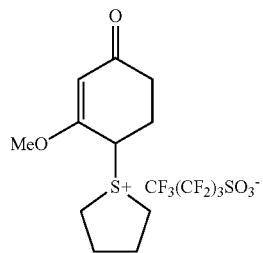 (IA-41)
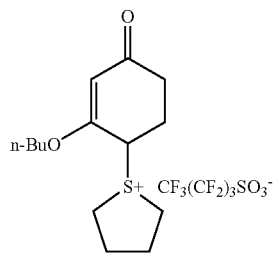 (IA-42)
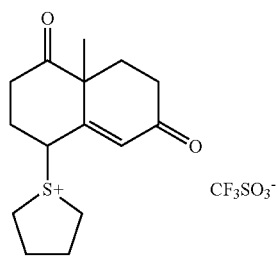 (IA-43)
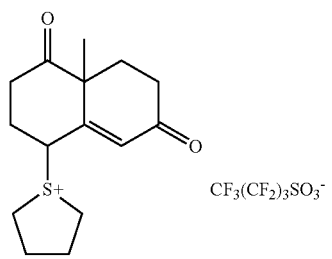 (IA-44)
-continued
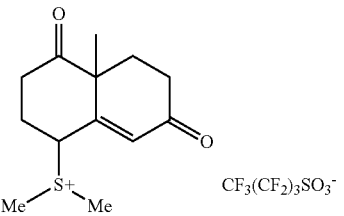 (IA-45)
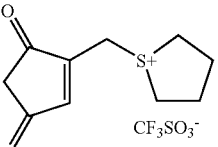 (IA-46)
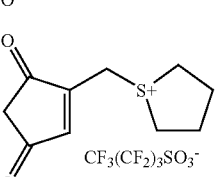 (IA-47)
(IA-48)
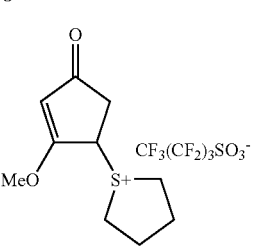 (IA-49)
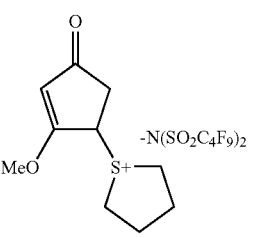 (IA-50)
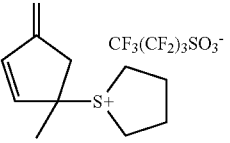 (IA-51)
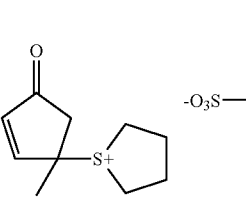 (IA-52)

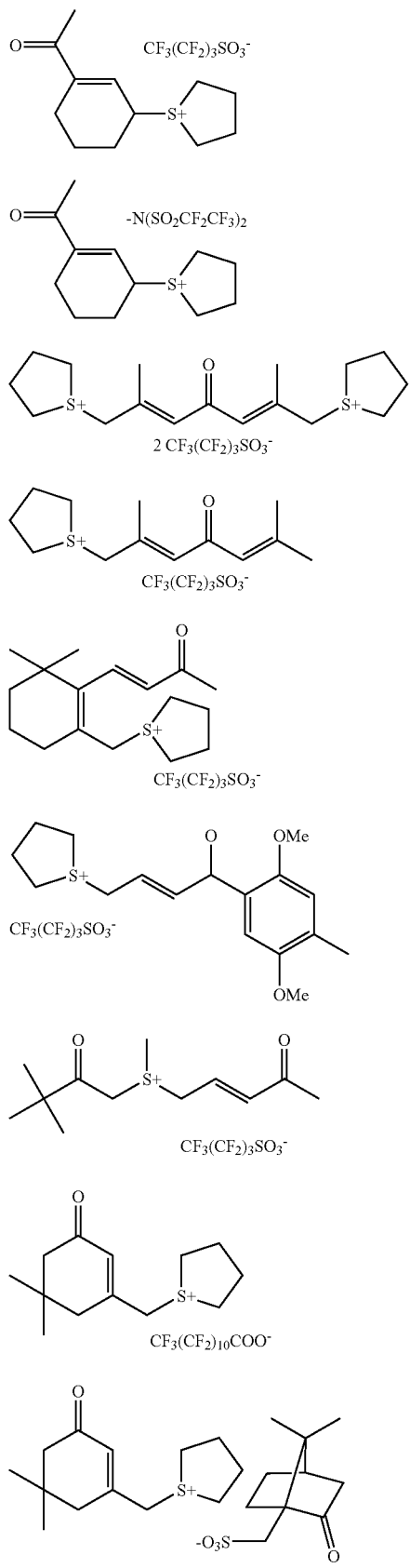
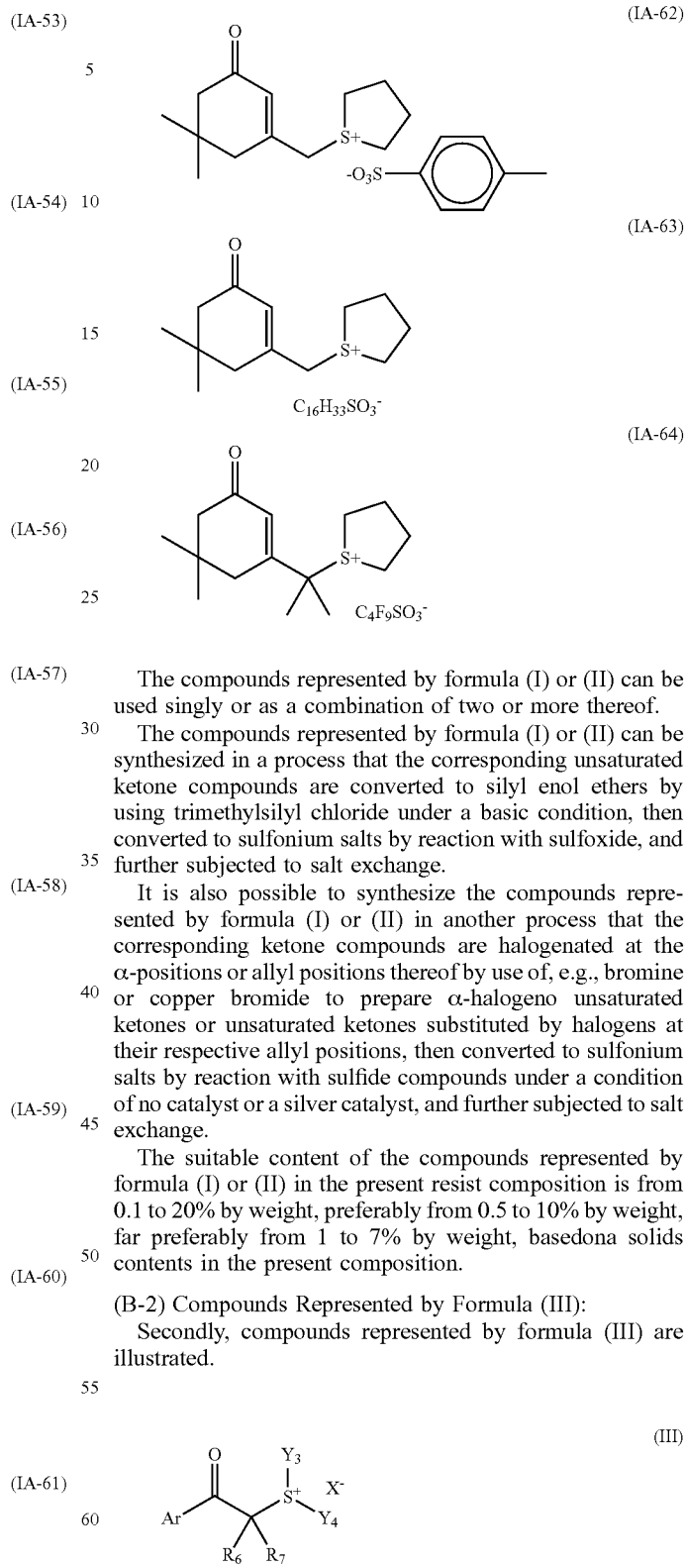

The compounds represented by formula (I) or (II) can be used singly or as a combination of two or more thereof.

The compounds represented by formula (I) or (II) can be synthesized in a process that the corresponding unsaturated ketone compounds are converted to silyl enol ethers by using trimethylsilyl chloride under a basic condition, then converted to sulfonium salts by reaction with sulfoxide, and further subjected to salt exchange.

It is also possible to synthesize the compounds represented by formula (I) or (II) in another process that the corresponding ketone compounds are halogenated at the α-positions or allyl positions thereof by use of, e.g., bromine or copper bromide to prepare α-halogeno unsaturated ketones or unsaturated ketones substituted by halogens at their respective allyl positions, then converted to sulfonium salts by reaction with sulfide compounds under a condition of no catalyst or a silver catalyst, and further subjected to salt exchange.

The suitable content of the compounds represented by formula (I) or (II) in the present resist composition is from 0.1 to 20% by weight, preferably from 0.5 to 10% by weight, far preferably from 1 to 7% by weight, basedona solids contents in the present composition.

(B-2) Compounds Represented by Formula (III):

Secondly, compounds represented by formula (III) are illustrated.

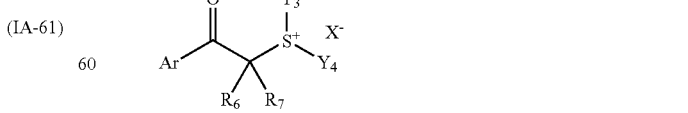

In formula (III), Ar represents an aryl group or a hetero atom-containing aromatic group.

$R_6$ represents a hydrogen atom, a cyano group, an alkyl group or an aryl group.

$R_7$ represents an alkyl group or an aryl group.

$Y_3$ and $Y_4$, which may be the same or different, each represents an alkyl group, an aryl group, an aralkyl group or a heteroatom-containing aromatic group. $Y_3$ and $Y_4$ may be bonded with each other to form a ring.

Ar and at least either $Y_3$ or $Y_4$ may be bonded with each other to form a ring.

Ar and $R_6$ may be bonded with each other to form a ring.

Two or more of structures represented by formula (III) may be contained in a compound represented by formula (III) by being bonded to each other via one or more of a linkage group at Ar sites, either $R_6$ sites or $R_7$ sites, or either $Y_3$ sites or $Y_4$ sites.

$X^-$ Represents a Non-nucleophilic Anion.

The compounds represented by formula (III) are preferably compounds represented by the following formula (IV).

Suitable examples of an aryl group represented by Ar in formula (III) include aryl groups containing 6 to 18 carbon atoms, such as a phenyl group, a naphthyl group and an anthracenyl group. Of these groups, phenyl and naphthyl groups are preferred over the others, and a phenyl group is preferable by far.

Suitable examples of a hetero atom-containing aromatic group represented by Ar include groups containing in their respective aromatic nuclei, such as aryl groups having 6 to 18 carbon atoms, hetero atoms, such as a nitrogen atom, an oxygen atom and a sulfur atom.

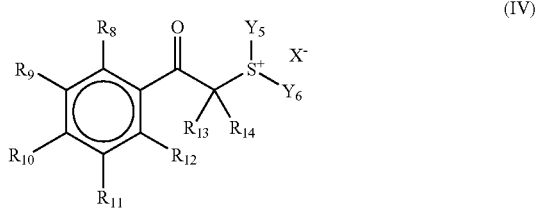

(IV)

In formula (IV), $R_8$ to $R_{12}$, which may be the same or different, each represents a hydrogen atom, a nitro group, a halogen atom, an alkyl group, an alkoxy group, an alkyloxycarbonyl group, an aryl group or an acylamino group. At least two of $R_8$ to $R_{12}$ may be bonded with each other to form a ring structure. $R_{13}$ and $R_{14}$ have the same meanings as $R_6$ and $R_7$ in formula (III), respectively.

$Y_5$ and $Y_6$ have the same meanings as $Y_3$ and $Y_4$ in formula (III), respectively. $Y_5$ and $Y_6$ may be bonded with each other to form a ring. At least one of $R_8$ to $R_{12}$ may be bonded with at least either $Y_5$ or $Y_6$ to form a ring. At least one of $R_8$ to $R_{12}$ may be bonded with $R_{13}$ to form a ring. The compound of formula (IV) may contain two or more of structures represented by formula (IV) in a state that the structures are bonded via one or more of a linkage group at any sites of $R_8$s to $R_{12}$s, or at either $Y_5$ sites or $Y_6$ sites. $X^-$ represents a non-nucleophilic anion.

The alkyl groups and the alkyl moieties of the acylamino groups represented by $R_6$, $R_7$, and $R_8$ to $R_{12}$ in formulae (III) and (IV) are preferably alkyl groups containing 1 to 20 carbon atoms. The examples thereof include linear, branched and cyclic alkyl groups, such as a methyl group, an ethyl group, a propyl group, an n-butyl group, a sec-butyl group, a t-butyl group, a cyclobutyl group, a pentyl group, a neopentyl group, a cylopentyl group, a hexyl group, a cyclohexyl group, a heptyl group, an octyl group, a nonyl group and a decyl group.

The alkoxy groups and the alkoxy moieties of the alkyloxycarbonyl groups represented by $R_8$ to $R_{12}$ are preferably alkoxy groups containing 1 to 10 carbon atoms, such as a methoxy group, an ethoxy group, a propoxy group, a butoxy group, a pentyloxy group, a hexyloxy group, a cyclohexyloxy group, a heptyloxy group, an octyloxy group, a nonyloxy group and a decyloxy group.

The aryl groups represented by $R_6$, $R_7$, and $R_8$ to $R_{12}$ are preferably aryl groups containing 6 to 14 carbon atoms, such as a phenyl group, a tolyl group and a naphthyl group.

Examples of halogen atoms represented by $R_8$ to $R_{12}$ include a fluorine atom, a chlorine atom, a bromine atom and an iodine atom.

The alkyl groups represented by $Y_3$ to $Y_6$ are preferably alkyl groups containing 1 to 30 carbon atoms. The examples thereof include linear and branched alkyl groups, such as a methyl group, an ethyl group, a propyl group, an n-butyl group, a sec-butyl group and a t-butyl group, and cyclic alkyl groups, such as a cyclopropyl group, a cyclopentyl group, a cyclohexyl group, an adamantyl group, a norbornyl group and a bornyl group.

The aryl groups represented by $Y_3$ to $Y_6$ are preferably aryl groups containing 6 to 14 carbon atoms, such as a phenyl group, a tolyl group and a naphthyl group.

The aralkyl groups represented by $Y_3$ to $Y_6$ are preferably aralkyl groups containing 7 to 12 carbon atoms, such as a benzyl group, a phenetyl group and a cumyl group.

The hetero atom-containing aromatic groups represented by $Y_3$ to $Y_6$ are preferably heterocyclic aromatic hydrocarbgon groups containing in their respective aromatic nuclei, such as aryl groups containing 6 to 14 carbon atoms, hetero atoms, such as a nitrogen atom, an oxygen atom and a sulfur atom. The examples among them include a furanyl group, a thiophenyl group, a pyrrolyl group, a pyridyl group and an indolyl group.

Ar may have two or more substituents, and at least two of the substituents may form a ring structure by being bonded with each other.

In this case, the group formed by combining at least two substituents is preferably an alkylene group containing 4 to 10 carbon atoms, such as a butylene group, a pentylene group or a hexylene group.

At least two of $R_8$ to $R_{12}$ may be bonded with each other to form a ring.

In this case, the group formed by bonding at least two of $R_8$ to $R_{12}$ is preferably an alkylene group containing 4 to 10 carbon atoms, such as a butylene group, a pentylene group or a hexylene group. These alkylene groups may contain hetero atoms.

$Y_5$ and $Y_6$ in formula (IV) as well as $Y_3$ and $Y_4$ in formula (III) may be bonded with each other to form a ring together with the $S^+$.

In this case, the groups formed by combining $Y_3$ with $Y_4$ and $Y_5$ with $Y_6$ are each an alkylene group containing 4 to 10 carbon atoms, preferably a butylene group, a pentylene group and a hexylene group, particularly preferably a butylene group and a pentylene group. Further, the rings formed may contain a hetero atom.

Each of the groups recited above may further have a substituent or not. Examples of substituents the aryl, alkyl, alkoxy, alkoxycarbonyl and aralkyl groups may have include a nitro group, a halogen atom, a carboxyl group, a hydroxyl group, an amino group, a cyano group, an alkoxy group (preferably containing 1 to 5 carbon atoms), an alkyl group (preferably containing 1 to 20 carbon atoms), an aryl group (preferably containing 6 to 14 carbon atoms), and alkoxycarbonyloxy group (preferably containing 2 to 7 carbon atoms).

As a substituent of the alkyl group, a halogen atom, particularly a fluorine atom, is preferred.

Ar may be bonded with at least either $Y_3$ or $Y_4$ to form a ring, or Ar may be bonded with $R_6$ to form a ring.

In such cases, the group formed by combining Ar with at least either $Y_3$ or $Y_4$ and the group formed by combining Ar with $R_6$ are preferably alkylene groups containing 1 to 10 carbon atoms, such as a methylene group, an ethylene group, a propylene group, a butylene group, a pentylene group and a hexylene group. In addition, a carbonyl group is also preferred as the group formed by bonding Ar with $R_6$.

Two or more of structures represented by formula (III) may be contained by being bound to each other via one or more of a linkage group at any of Ar sites, $R_6$ sites and $R_7$ sites, or at either $Y_3$ sites or $Y_4$ sites.

Two or more of structures represented by formula (IV) may be contained by being bonded to each other via one or more of a linkage group at any of $R_8$ sites to $R_{14}$ sites, or at either $Y_5$ sites or $Y_6$ sites.

At least one of $R_8$ to $R_{12}$ may be bonded with at least either $Y_5$ or $Y_6$ to form a ring, or at least one of $R_8$ to $R_{12}$ may be bonded with $R_{13}$ to form a ring.

In such cases, the group formed by bonding at least one of $R_8$ to $R_{12}$ with at least either $Y_5$ or $Y_6$ and the group formed by bonding at least one of $R_8$ to $R_{12}$ with $R_{13}$ are preferably alkylene groups containing 1 to 10 carbon atoms, such as a methylene group, an ethylene group, a propylene group, a butylene group, a pentylene group and a hexylene group. In addition, a carbonyl group is also preferred as the group formed by combining at least one of $R_8$ to $R_{12}$ with $R_{13}$.

The component (B) does not contain a hydrogen atom as $R_7$, so it can ensure improvements in light resolution and sensitivity. It is preferable in the component (B) that both $R_6$ and $R_7$ are alkyl groups or $R_7$ is an alkyl group containing 2 to 20 carbon atoms. And it is preferred by far that $R_7$ is an alkyl group containing 4 to 20 carbon atoms. When Ar and $R_6$ are bonded with each other to form a ring, $R_7$ is preferably an alkyl group containing 1 to 20 carbon atoms.

Examples of a non-nucleophilic anion of $X^-$ include the same ones as in the cases of formulae (I) and (II).

Suitable examples of the present compounds represented by formula (III) are illustrated below, but these examples should not be construed as limiting the scope of the invention.

(P-1)
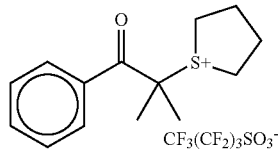

(P-2)
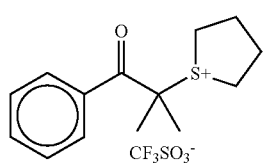

-continued (P-3)
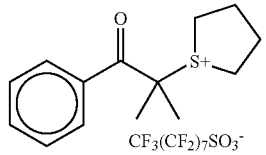

(P-4)
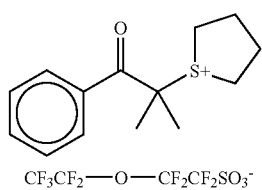

(P-5)
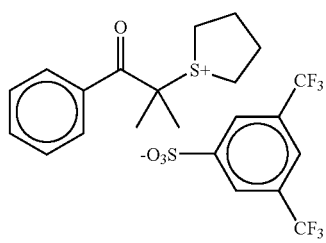

(P-6)
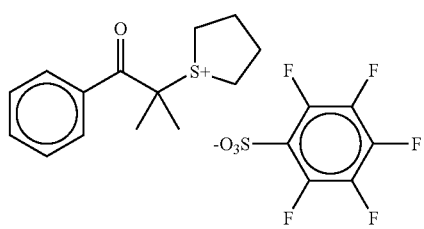

(P-7)
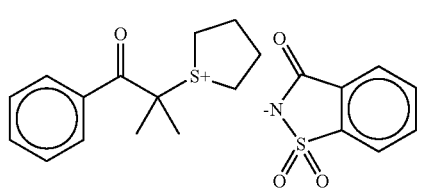

(P-8)
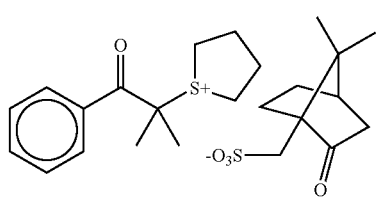

(P-9)
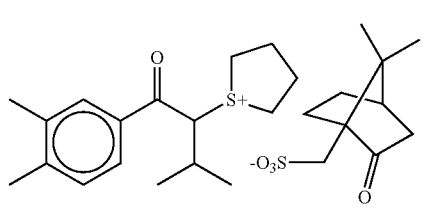

-continued
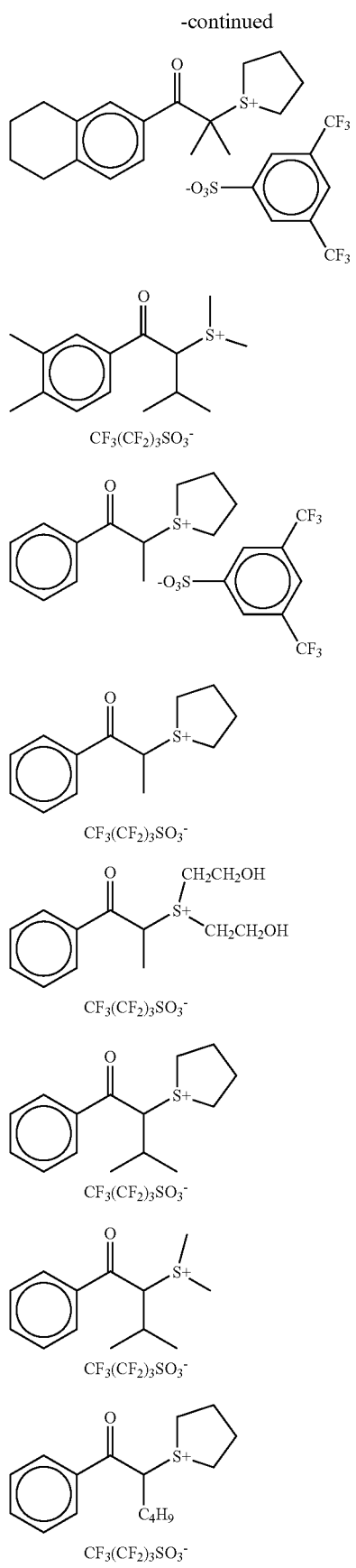
(P-10)
(P-11)
(P-12)
(P-13)
(P-14)
(P-15)
(P-16)
(P-17)
-continued
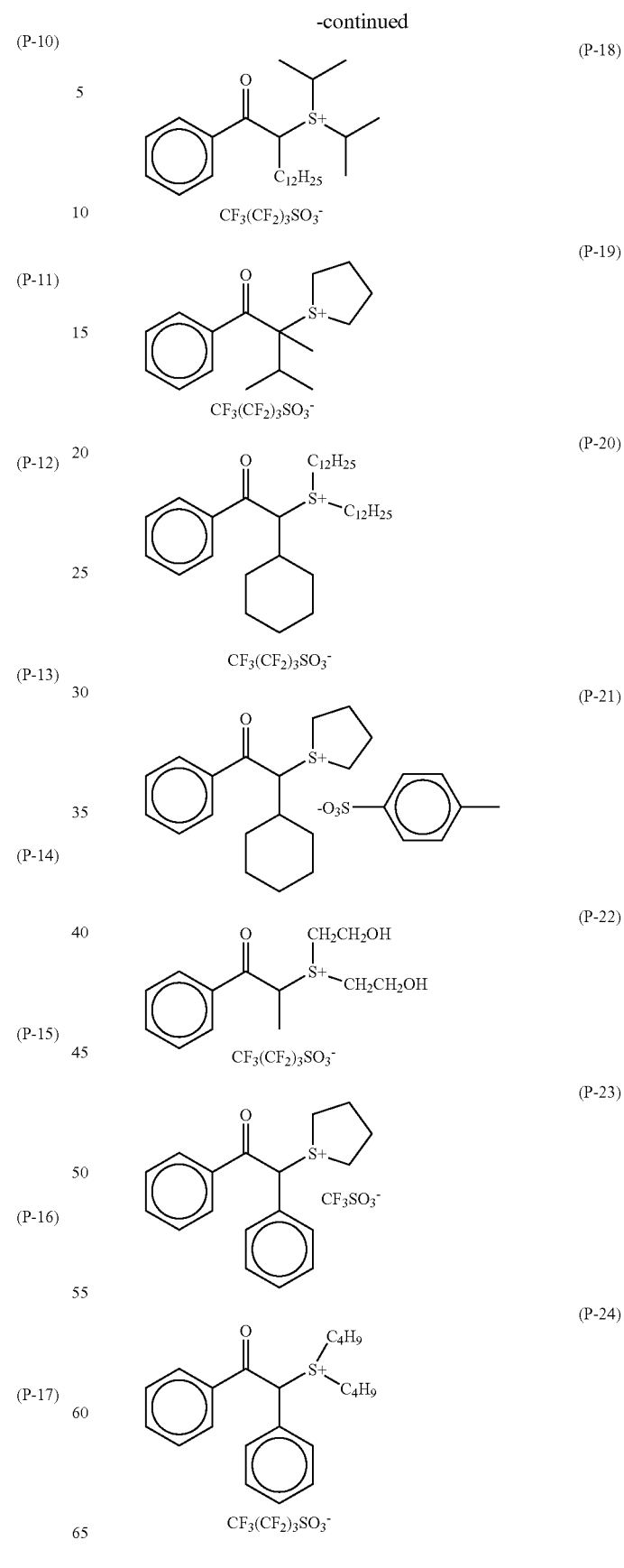
(P-18)
(P-19)
(P-20)
(P-21)
(P-22)
(P-23)
(P-24)

-continued
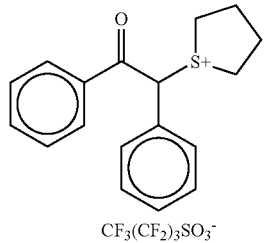 (P-25)
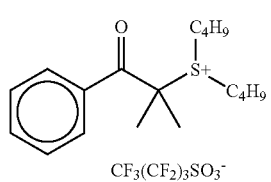 (P-26)
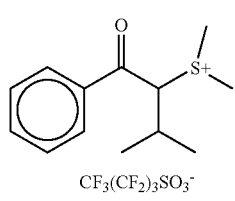 (P-27)
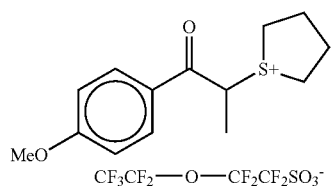 (P-28)
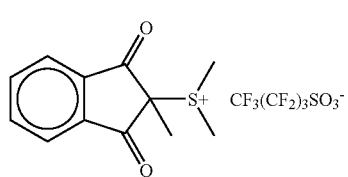 (P-29)
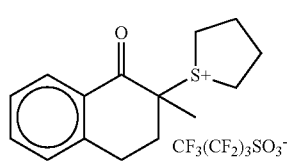 (P-30)
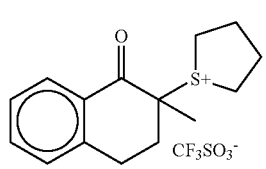 (P-31)
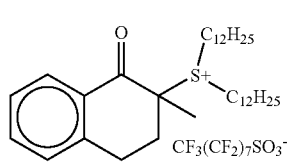 (P-32)
-continued
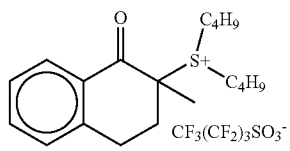 (P-33)
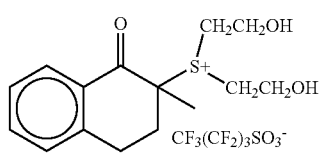 (P-34)
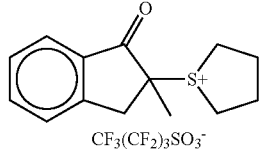 (P-35)
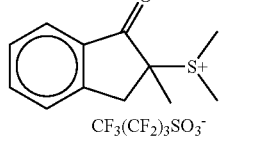 (P-36)
 (P-37)
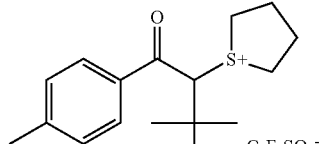 (P-38)
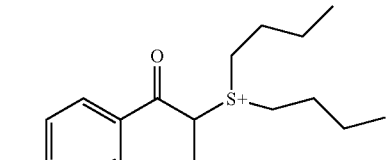 (P-39)
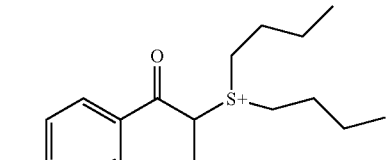 (P-40)

-continued
(P-41) 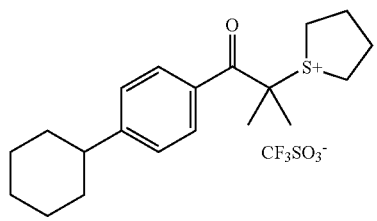
(P-42) 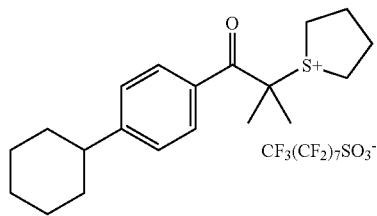
(P-43) 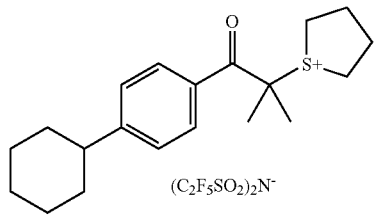
(P-44) 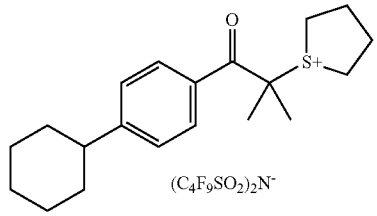
(P-45) 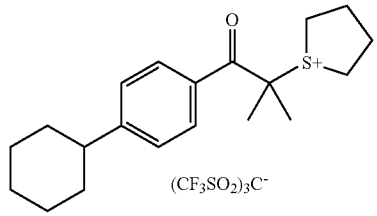
(P-46) 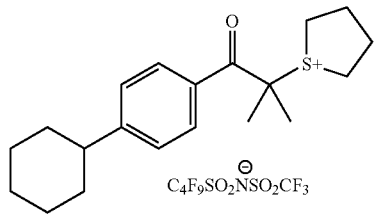
(P-47) 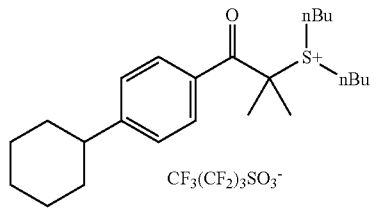
-continued
(P-48) 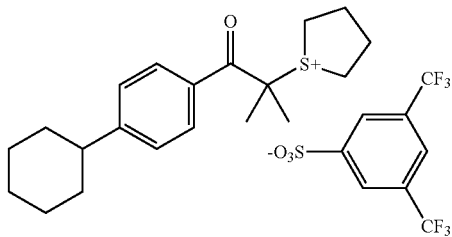
(P-49) 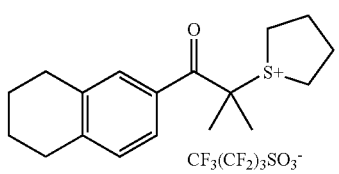
(P-50) 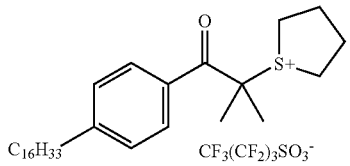
(P-51) 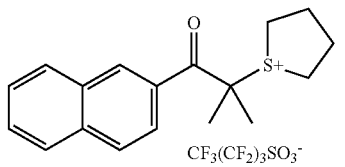
(P-52) 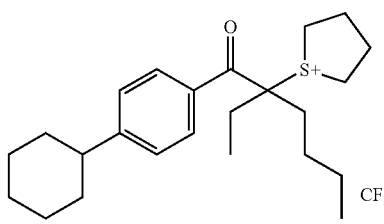
(P-53) 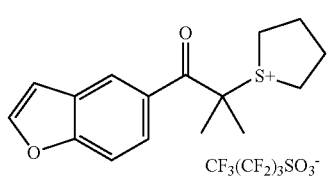
(P-54) 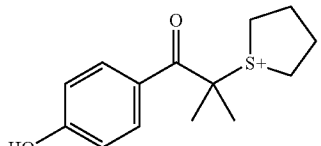
(P-55) 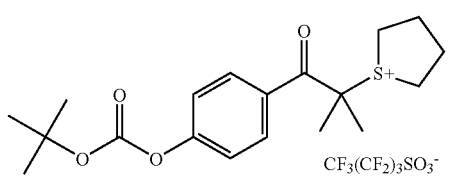

-continued

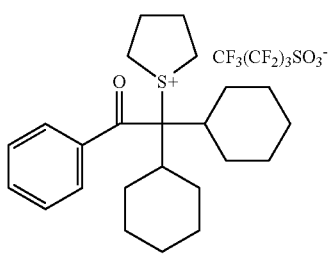
(P-56)

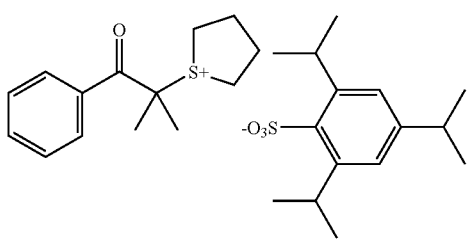
(P-57)

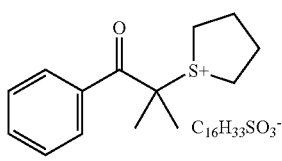
(P-58)

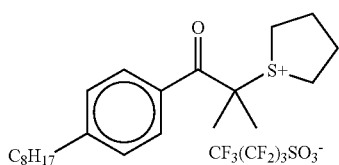
(P-59)

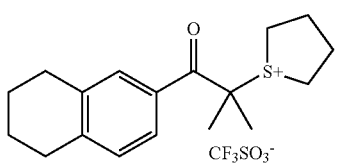
(P-60)

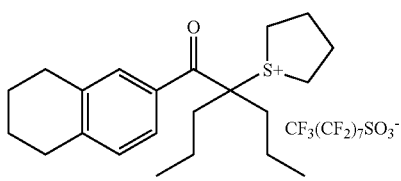
(P-61)

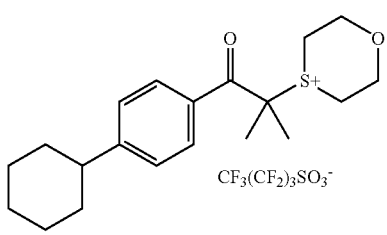
(P-62)

-continued

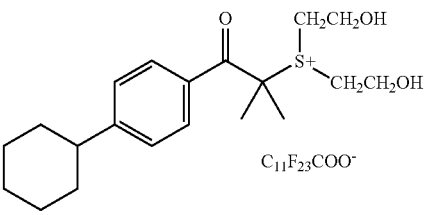
(P-63)

The compounds of formula (III) may be used singly or as a combination of two or more thereof.

The compounds represented by formula (III) can be prepared by converting the corresponding acylbenzene compounds to silyl enol ethers by reaction with trialkylsilyl halogenide under a basic condition, synthesizing sulfonium skeletons by reacting the silyl enol ethers with sulfoxide, and then subjecting them to salt exchange for the corresponding anions. In another synthesis process, the corresponding phenacyl halogenides are reacted with sulfide compounds under a condition of no catalyst or in the presence of a silver catalyst to produce sulfonium skeletons, and then the sulfonium salts obtained are subjected to salt exchange for the corresponding anions.

The suitable content of compounds represented by formula (III) in the present resist composition is from 0.1 to 20% by weight, preferably from 0.5 to 10% by weight, far preferably from 1 to 7% by weight, based on a solid contents in the present composition.

As component (B) of the invention, the compound of formula (I) or (II) and the compound of formula (III) may be used alone or in combination. When they are used in combination, their total content in the resist composition is preferably from 0.1 to 20% by weight, far preferably from 0.5 to 10% by weight, particularly preferably from 1 to 7% by weight, based on a solid contents in the present composition.

Acid Generating Compounds Usable in Combination with Component (B):

In the invention, compounds capable of generating acids through decomposition by irradiation with an actinic ray or radiation, other than component (B), may further be used in combination with the compounds of component (B).

The ratio of the present component (B) to acid generators usable in combination therewith (component (B)/other acid generators ratio) is generally from 100/0 to 20/80, preferably from 100/0 to 40/60, far preferably from 100/0 to 50/50, by mole.

When acid generators having aromatic ring structures in particular are used in combination with the present component (B), their amount used is preferably not higher than 60%, far preferably not higher than 50%, based on the total weight of all acid generators used.

As acid generators usable in combination with the compounds of component (B), it is possible to use compounds selected appropriately from photo-initiators for cationic photopolymerization, photo-initiators for radical photopolymerization, photodecoloring agents for dyes, photodiscoloring agents, compounds used in microresist and known to generate acids by irradiation with actinic rays or radiation, and mixtures of two or more thereof.

Examples of such compounds include diazonium salts, phosphonium salts, sulfonium salts, iodonium salts, imide sulfonates, oxime sulfonates, diazodisulfone, disulfone and o-nitrobenzylsulfonate.

Of these compounds, sulfonium salts are preferred over the others. In particular, triarylsulfoniun salts and 2-oxoalkyl group-containing sulfonium salts are used to advantage.

In addition, polymeric compounds prepared by introducing groups or compounds capable of generating acids upon irradiation with actinic rays or radiation into the main or the side chains of polymers can also be used. Examples of such polymeric compounds include the compounds as disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids by the action of light as disclosed in U.S. Pat. No. 3,779,778 and European Patent No. 136,712 can be used.

Of the compounds capable of decomposing upon irradiation with actinic rays or radiation to generate acids and usable in combination with Component (B), compounds represented by the following formulae (ZI), (ZII) and (ZIII) respectively are preferred in particular:

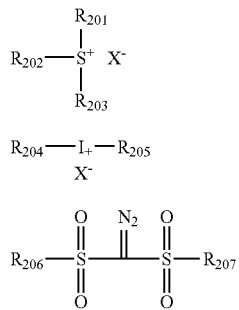

In formula (ZI), $R_{201}$, $R_{202}$ and $R_{203}$ each independently represents an organic group.

$X^-$ represents a non-nucleophilic anion, and the examples include the same ones as recited for $X^-$ in formula (I).

The number of carbon atoms in the organic group of $R_{201}$, $R_{202}$ and $R_{203}$ each is generally from 1 to 30, preferably from 1 to 20.

In addition, two among $R_{201}$, $R_{202}$ and $R_{203}$ may be combined with each other to complete a ring structure, and the ring formed may contain an oxygen atom, a sulfur atom, an ester linkage, an amide linkage or a carbonyl group.

Examples of a group formed by combining two among $R_{201}$, $R_{202}$ and $R_{203}$ include alkylene groups (such as a butylene group and a pentylene group).

Examples of an organic group represented by $R_{201}$, $R_{202}$ and $R_{203}$ each include groups corresponding to those in compounds (ZI-1), (ZI-2) and (ZI-3) described hereinafter.

Incidentally, the acid generator used in combination with Component (B) may have two or more of structures represented by formula (ZI). For instance, it may be a compound having a structure that at least one of $R_{201}$, $R_{202}$ and $R_{203}$ in one compound represented by formula (ZI) is bound to at least one of $R_{201}$, $R_{202}$ and $R_{203}$ in another compound represented by formula (ZI).

Of the compounds represented by formula (ZI), compounds (ZI-1) and compounds (ZI-2) described below are preferred over the others.

The compounds (ZI-1) are arylsulfonium compounds represented by formula (ZI) wherein at least one of $R_{201}$, $R_{202}$ and $R_{203}$ is an aryl group, namely compounds having arylsulfonium cations.

In the arylsulfonium compounds, all of $R_{201}$, $R_{202}$ and $R_{203}$ may be aryl groups, or a part of them may be an aryl group and the remainder may be alkyl groups.

Examples of arylsulfonium compounds include triarylsulfonium compounds, diarylalkylsulfonium compounds and aryldialkylsulfonium compounds.

Suitable examples of aryl groups in the arylsulfonium compounds include phenyl and naphthyl groups, preferably a phenyl group. When two or more aryl groups are contained in one arylsulfonium compound, they may be the same or different.

Suitable examples of alkyl groups contained in the arylsulfonium compounds on an as needed basis include 1-15C linear, branched and cyclic alkyl groups, such as a methyl group, an ethyl group, a propyl group, an n-butyl group, a sec-butyl group, a t-butyl group, a cyclopropyl group, a cyclobutyl group and a cyclohexyl group.

The aryl group or the alkyl group represented by each of $R_{201}$ to $R_{203}$ may contain as a substituent an alkyl group (containing, e.g., 1 to 15 carbon atoms), an aryl group (containing, e.g., 6 to 14 carbon atoms), an alkoxy group (containing, e.g., 1 to 15 carbon atoms), a halogen atom, a hydroxyl group or a phenylthio group. Suitable examples of such a substituent include linear, branched or cyclic alkyl groups containing 1 to 12 carbon atoms, and linear, branched or cyclic alkoxy groups containing 1 to 12 carbon atoms, particularly preferably alkyl groups containing 1 to 4 carbon atoms and alkoxy groups containing 1 to 4 carbon atoms. Any one of $R_{201}$ to $R_{203}$ may have such a substituent, or all of them may have such substituents. When $R_{201}$ to $R_{203}$ are aryl groups, it is preferable that the aryl groups have substituents at their respective p-positions.

Next the compounds (ZI-2) are illustrated.

The compounds (ZI-2) are compounds represented by formula (ZI) wherein $R_{201}$ to $R_{203}$ each independently represents an organic group containing no aromatic ring. The term "aromatic ring" as used herein is intended to include hetero atom-containing aromatic rings also.

The aromatic ring-free organic group represented by $R_{201}$ to $R_{203}$ each contains generally 1 to 30 carbon atoms, preferably 1 to 20 carbon atoms.

$R_{201}$ to $R_{203}$ are independent of one another, and each of them is preferably an alkyl group, an allyl group or a vinyl group, far preferably a linear or branched 2-oxoalkyl group, a 2-oxocycloalkyl group or an alkoxycarbonylmethyl group, particularly preferably a linear or branched 2-oxoalkyl group.

The alkyl groups or the cycloalkyl groups represented by $R_{201}$ to $R_{203}$ may have substituents. The alkyl groups may be linear or branched ones, and they preferably include linear or branched alkyl groups containing 1 to 10 carbon atoms (e.g., a methyl group, an ethyl group, a propyl group, a butyl group, a pentyl group) and cycloalkyl groups containing 3 to 10 carbon atoms (e.g., a cyclopentyl group, a cyclohexyl group, an orbornyl group). And it is preferable by far that $R_{201}$ to $R_{203}$ are each a 2-oxoalkyl group or an alkoxycarbonylmethyl group. The 2-oxoalkyl group may have any of linear, branched and cyclic structures, preferably one which has a carbonyl group (>C=O) at the 2-position of alkyl moiety. Suitable examples of an alkoxy moiety of the alkoxycarbonylmethyl group include alkoxy groups containing 1 to 5 carbon atoms (such as a methoxy group, an ethoxy group, a propoxy group, a butoxy group and a pentoxy group).

$R_{201}$ to $R_{203}$ each may further be substituted by a halogen atom, an alkoxy group (containing, e.g., 1 to 5 carbon atoms), a hydroxyl group, a cyano group and a nitro group.

Two of $R_{201}$ to $R_{203}$ may be bonded with each other to a ring structure, and the ring formed may contain an oxygen atom, a sulfur atom, an ester linkage, an amide linkage or a carbonyl group. Examples of a group formed by bonding two of $R_{201}$ to $R_{203}$ include alkylene groups (such as a butylenes group and a pentylene group).

In formulae (ZII) and (ZIII), $R_{204}$ to $R_{207}$ each independently represents an aryl group which may have a substituent, or an alkyl group which may have a substituent.

The aryl group represented by $R_{204}$ to $R_{207}$ each is preferably a phenyl group or a naphthyl group, far preferably a phenyl group.

The alkyl group represented by $R_{204}$ to $R_{207}$ each may have any of linear, branched and cyclic structures, and the examples preferably include linear and branched alkyl groups containing 1 to 10 carbon atoms (such as a methyl group, an ethyl group, a propyl group, a butyl group and a pentyl group) and cycloalkyl groups containing 3 to 10 carbon atoms (such as a cyclopentyl group, a cyclohexyl group and a norbornyl group).

Examples of a substituent each of the groups represented by $R_{204}$ to $R_{207}$ may further have include an alkyl group (containing, e.g., 1 to 15 carbon atoms), an aryl group (containing, e.g., 6 to 15 carbon atoms), an alkoxy group (containing, e.g., 1 to 15 carbon atoms), a halogen atom, a hydroxyl group and a phenylthio group.

$X^-$ represents a non-nucleophilic anion, including the same examples as recited for $X^-$ in formulae (I) and (II).

Examples of compounds preferred in particular among the compounds of the kind which generate acids through decomposition by irradiation with an actinic ray or radiation and may be used in combination with the present component (B) are illustrated below.

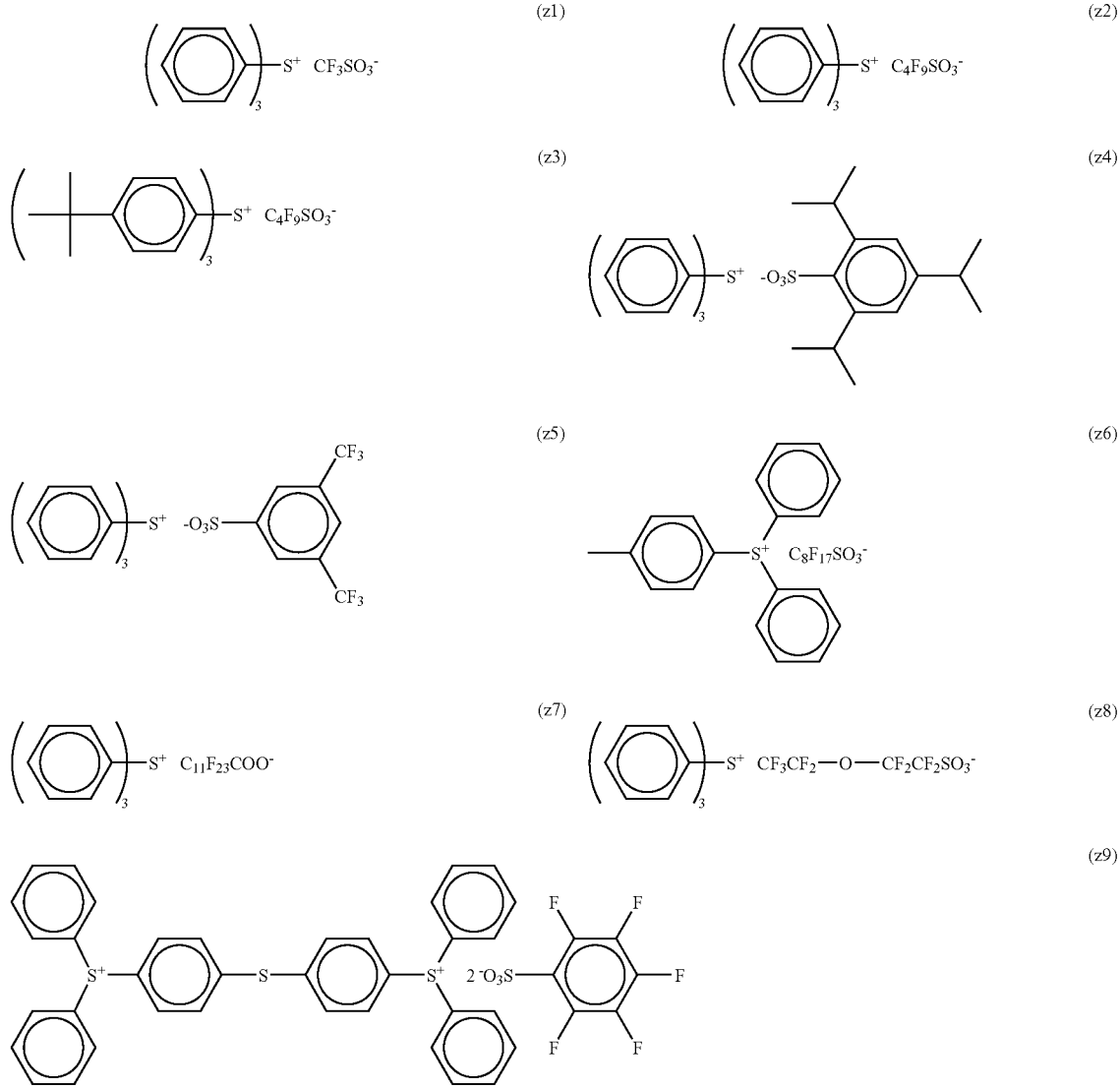

-continued
(z10)
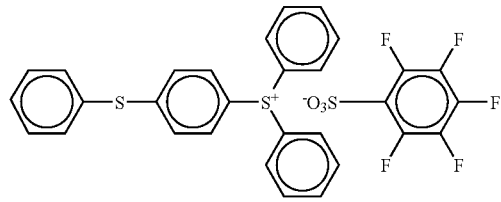
(z11)
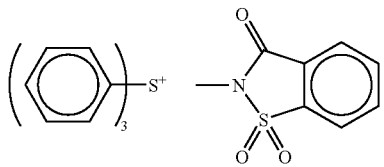
(z12)
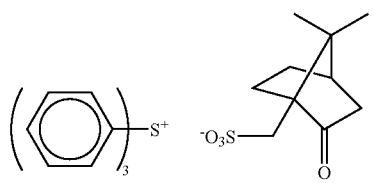
(z13)
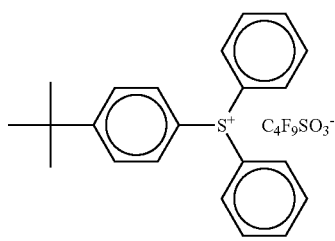
(z14)
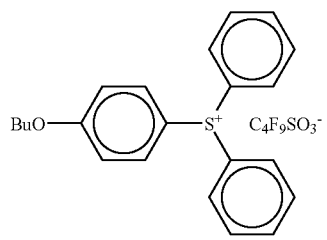
(z15)
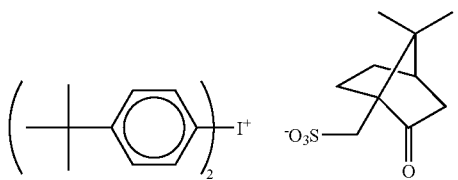
(z16)
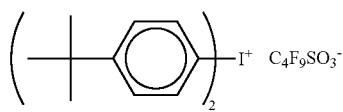
(z17)
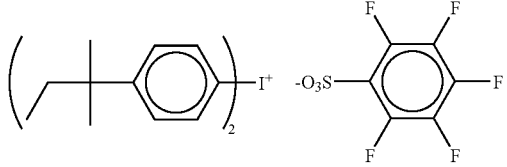
(z18)
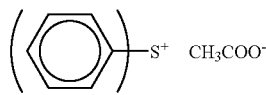
(z19)
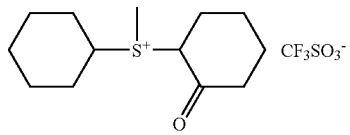
(z20)
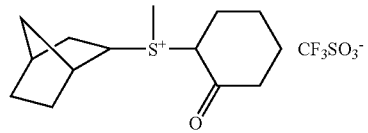
(z21)
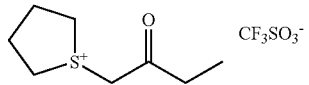
(z22)
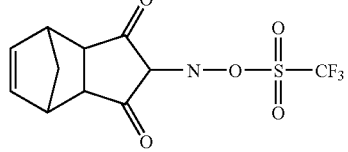
(z23)
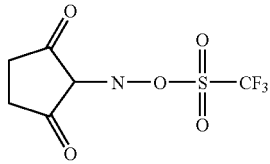
(z24)
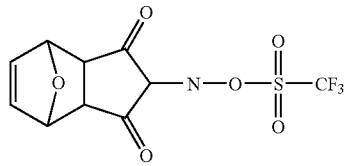
(z25)
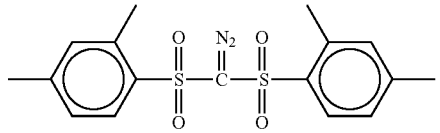
(z26)
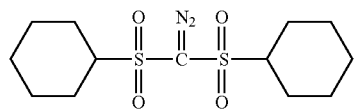
(z27)
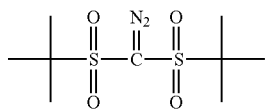

-continued

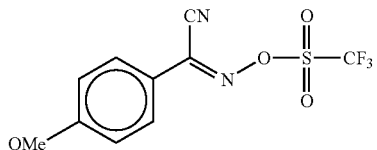 (z28)

 (z29)

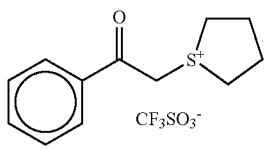 (z30)

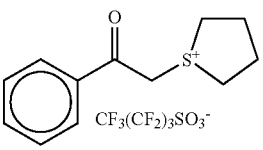 (z31)

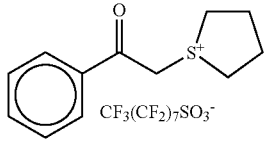 (z32)

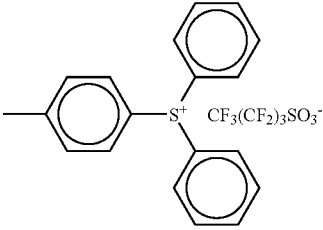 (z33)

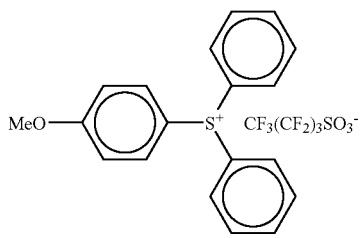 (z34)

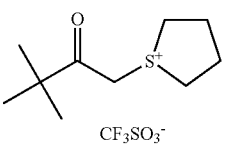 (z35)

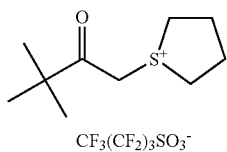 (z36)

(z37)

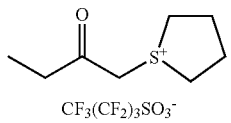 (z38)

(z39)

[3] Other Additives

The present positive resist composition can further contain, if needed, acid-decomposable dissolution-inhibiting compounds, dyes, plasticizers, surfactants, photo-sensitizers, organic basic compounds, and compounds capable of promoting dissolution in developers.

(C) Fluorine-based and/or Silicon-based Surfactant (Component (C) or Surfactant (C))

The present positive resist composition contains at least components (A) and (B) illustrated above, and it is advantageous for the composition to further contain (C) a fluorine-based and/or a silicon-based surfactant (namely any of a fluorine-containing surfactant, a silicon-containing surfactant and a surfactant containing both fluorine and silicon atoms), or a combination of at least two of these surfactants.

Incorporation of the surfactant (C) into the present positive resist composition enables the composition to provide resist patterns having strong adhesion and reduced development defects while ensuring the composition both satisfactory sensitivity and high resolution at the time of using an exposure light source of 250 nm or shorter, especially 220 nm or shorter.

Examples of such a surfactant (C) include the surfactants disclosed in JP-A-62-36663, JP-A-61-226746, JP=A-61-226745, JP=A-62-170950, JP-A-63-34540, JP-A-7-230165, JP-A-8-62834, JP-A-9-54432, JP-A-9-5988, JP-A-

2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable herein include fluorine-containing surfactants and silicon-containing surfactants, such as Eftop EF301 and EF303 (produced by Shin-Akita Kasei K.K.), Florad FC430 and FC431 (produced by Sumitomo 3M, Inc.), Megafac F171, F173, F176, F189 and R08 (produced by Dainippon Ink & Chemicals, Inc.), Surflon S-382, SC101, SC102, SC103, SC104, SC105 and SC106 (produced by Asahi Glass Co., Ltd.), and Troysol S-366 (produced by Troy Chemical Industries, Inc.). In addition, organo siloxane polymer KP-341 (produced by Shin-Etsu Chemical Co., Ltd.) can be used as a silicon-containing surfactant.

In addition to known surfactants as recited above, specific polymers containing fluorinated aliphatic groups can be used as surfactants in the invention. Such polymers contain fluorinated aliphatic groups derived from fluorinated aliphatic compounds synthesized by a telomerization method (r also referred to as a telomer method) or an oligomerization method (also referred to as an oligomer method). These fluorinated aliphatic compounds can be synthesized by the methods disclosed in JP-A-2002-90991.

The polymers suitable as the polymers containing fluorinated aliphatic groups are copolymers of fluorinated aliphatic group-containing monomers and poly(oxyalkylene) acrylates and/or poly(oxyalkylene) methacrylates, wherein the fluorinated aliphatic group-containing units may be distributed randomly or in blocks. Examples of those poly(oxyalkylene) groups include a poly(oxyethylene) group, a poly(oxypropylene) group and a poly(oxybutylene) group. In addition, the poly(oxyalkylene) groups maybe units containing alkylene groups of different chain lengths in their respective oxyalkylene chains, such as poly(oxyethylene block-oxypropylene block-oxyethylene block combination) groups and poly(oxyethylene block-oxypropylene block combination) groups. Further, the copolymers of fluorinated aliphatic group-containing monomers and poly(oxyalkylene) acrylates (or methacrylates) may be binary copolymers or at least ternary copolymers prepared by copolymerizing at least two different kinds of fluorinated aliphatic group-containing monomers and at least two different kinds of poly(oxyalkylene) acrylates (or methacrylates) simultaneously.

Examples of a fluorinated aliphatic group-containing polymer commercially available as surfactant include Megafac F178, F-470, F-473, F-475, F-476 and F-472 (produced by Dainippon Ink & Chemicals, Inc.). Additional examples of a fluorinated aliphatic group-containing polymer include a copolymer of $C_6F_{13}$ group-containing acrylate (or methacrylate) and poly(oxyalkylene) acrylate (or methacrylate), a terpolymer of $C_6F_{13}$ group-containing acrylate (or methacrylate), poly(oxyethylene) acrylate (or methacrylate) and poly(oxypropylene) acrylate (or methacrylate), a copolymer of $C_8F_{17}$ group-containing acrylate (or methacrylate) and poly(oxyalkylene) acrylate (or methacrylate), and a terpolymer of $C_8F_{17}$ group-containing acrylate (or methacrylate), poly(oxyethylene) acrylate (or methacrylate) and poly(oxypropylene) acrylate (or methacrylate).

It is appropriate that the surfactants (C) be used in a proportion of 0.0001 to 2% by weight, preferably 0.001 to 1% by weight, based on the total ingredients (exclusive of a solvent) in the positive resist composition.

Organic basic compounds (D) usable to advantage in the invention are compounds having stronger basicity than phenol. Of such compounds, nitrogen-containing basic compounds having the following structural formulae (A) to (E) are preferable.

(A)

In the formula, $R^{250}$, $R^{251}$ and $R^{252}$ each independently represents a hydrogen atom, an alkyl containing 1 to 6 carbon atoms or cycloalkyl group, or a substituted or unsubstituted aryl group containing 6 to 20 carbon atoms. Further, $R^{251}$ and $R^{252}$ may be bonded with each other to form a ring. The alkyl group may have no substituent or a certain substituent. Suitable examples of the alkyl group having a substituent include aminoalkyl groups containing 1 to 6 carbon atoms and hydroxyalkyl groups containing 1 to 6 carbon atoms.

(B)

(C)

(D)

(E)

In the formula (E), $R^{253}$, $R^{254}$, $R^{255}$ and $R^{256}$ each independently represents an alkyl group containing 1 to 6 carbon atoms.

The compounds preferable by far are basic compounds having at least two per molecule of nitrogen atoms differing in chemical environment, especially compounds which each has a substituted or unsubstituted amino group and a nitrogen-containing ring structure.

Suitable examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a subsituted or unsubstituted piperazine, a subsituted or unsubstituted aminomorpholine, and a substituted or unsubstituted aminoalkylmorpholine. Examples of substituents suitable for the above-recited compounds include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Suitable examples of nitrogen-containing basic compounds include guanidine, 1,1-dimethylguanidine, 1,1,3,3-tetra methylguanidine, 2-aminopyridine, 3-aminopyridine, 4-aminopyridine, 2-dimethylaminopyridine, 4-dimethylaminopyridine, 2-diethylaminopyridine, 2-(aminomethyl) pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazobicyclo[4.3.0]nona-5-ene, 1,8-diazabicyclo[5.4.0]-undeca-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, a tertiary morpholine derivative such as cyclohexylmorpholinoethylthiourea (CHMETU), and the hindered amines disclosed in JP-A-11-52575 (specifically those disclosed inparagraph [0005] of the document cited). However, these examples should not be construed as limiting the scope of the basic compounds usable in the invention.

Examples of compounds preferred in particular include 1,5-diazabicyclo[4.3.0]nona-5-ene, 1,8-diazabicyclo[5.4.0]-undeca-7-ene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-piperidyl)sebacate.

Of these compounds, 1,5-diazabicyclo[4.3.0]nona-5-ene, 1,8-diazabicyclo[5.4.0]-undeca-7-ene, 1,4-diazabicyclo[2.2.2]octane, 4-dimethylaminopyridine, hexamethylenetetramine, CHMETU and bis(1,2,2,6,6-pentamethyl-4-piperidyl)sebacate are preferred over the others.

These nitrogen-containing basic compounds are used alone or as a combination of two or more thereof. The content of the nitrogen-containing basic compounds is generally from 0.001 to 10% by weight, preferably from 0.01 to 5% by weight based on the total solids in the resist composition.

The addition of the nitrogen-containing basic compounds in a proportion of 0.001% by weight or more is appropriate in terms of effect produced thereby, and the proportion of 10% by weight or below is appropriate in terms of sensitivity and developability of unexposed areas.

The present positive resist composition is dissolved in an appropriate solvent capable of dissolving the ingredients as mentioned above, and coated on a substrate. Suitable examples of a solvent used herein include ethylene dichloride, cyclohexanone, cyclopentanone, 2-heptanone, γ-butyrolactone, methyl ethyl ketone, ethylene glycolmonomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These organic solvents may be used alone or as a mixture of two or more thereof.

Of the solvents recited above, propylene glycol monomethyl ether, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone and tetrahydrofuranare preferred over the others.

The present positive resist composition is coated on a substrate and forms a thin film. It is appropriate that this coating film have a thickness of from 0.2 to 1.2 μm.

Examples of an inorganic substrate usable in the invention include a commonly-used Bare Si substrate, an SOG substrate and a substrate having an inorganic anti-reflecting coating as described below.

In the invention, commercial inorganic or organic anti-reflecting coating can be used, if needed.

The anti-reflecting coating of inorganic type, such as a coating formed from titanium, titanium dioxide, titanium nitride, chromium oxide, carbon or amorphous silicon, and the anti-reflecting coating of organic type, such as a coating formed from a light absorbent and a polymeric material, can be used. The formation of the former coating requires equipment, such as a vacuum evaporator, a CVD apparatus or a sputtering apparatus. Examples of an anti-reflecting coating of organic type include the anti-reflecting coating disclosed in JP-B-7-69611 which contains a condensate produced from a diphenylamine derivative and formaldehyde-modified melamine resin, an alkali-soluble resin and a light absorbing agent, the anti-reflecting coating disclosed in U.S. Pat. No. 5,294,680 which is formed from a product of reaction between a maleic anhydride copolymer and a light absorbing agent of diamine type, the anti-reflecting coating disclosed in JP-A-6-118631 which contains a resin binder and a thermally cross-linking agent of methylolmelamine type, the anti-reflecting coating disclosed in JP-A-6-118656 which is formed from an acrylic resin containing carboxylic acid groups, epoxy groups and light-absorbing groups in each molecule, the anti-reflecting coating disclosed in JP-A-8-87115 which contains methylolmelamine and a light absorbing agent of benzophenone type, and the anti-reflecting coating disclosed in JP-A-8-179509 which is formed from polyvinyl alcohol resin to which a low molecular light-absorbing agent is added.

As to the anti-reflecting coating of organic type, it is also possible to use commercially available ones, such as DUV30 series, DUV40 series and ARC25 produced by Brewer Science Inc., and AC-2, AC-3, $AR_{19}$ and $AR_{20}$ produced by Shipley Co., Ltd.

Satisfactory resist patterns can be formed in a process that the present positive resist composition is coated on a substrate used for fabrication of high-precision integrated circuit elements (e.g., a silicon/silicon dioxide coating) directly or via an anti-reflecting coating as recited above, which is provided in advance on the substrate, by means of an appropriate coating apparatus, such as a spinner or a coater, exposed to light via the desired mask, baked and then developed. The exposure light used herein is preferably light with wavelengths of 150 nm to 250 nm. Specifically, such light includes KrF excimer laser (248 nm), ArF excimer laser (193 nm), $F_2$ excimer laser (157 nm), X-rays and electron beams. The present resist composition is especially suitable for the case where ArF excimer laser is used as exposure light.

As a developing solution for the present positive resist composition, an aqueous alkali solution (generally having a concentration of 0.1 to 10% by weight) can be used. Examples of an alkali usable therein include inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetra methylammonium hydroxide and tetraethylammonium hydroxide, and cyclic amines such as pyrrole and piperidine. To the aqueous alkali solution, alcohol and a surfactant may further be added in appropriate amounts.

EXAMPLES

Now, the invention will be illustrated in more detail by reference to the following examples, but these examples should not be construed as limiting the scope of the invention.

Synthesis of Resin (1):

2-Ethyl-2-adamantyl methacrylate, isoadamantyl methacrylate, butyrolactone methacrylate and methacrylic acid were prepared in proportions of 25/25/40/10, dissolved in methyl isobutyl ketone to make 100 mL of a solution having a solids content of 30%. To this solution, a polymerization initiator, V-601 produced by Wako Pure chemical Industries, Ltd., was added in a proportion of 4% by mole. The resulting solution was dripped into 10 mL of methyl isobutyl ketone heated at 80° C. over a 4-hour period under the atmosphere of nitrogen. After the dripping was finished, the reaction solution was heated and stirred for 4 hours. At the conclusion of the reaction, the reaction solution was cooled to room temperature, and poured into 1 liter of a 1:1 mixture of distilled water and isopropyl alcohol to crystallize the product. A white powder deposited was washed with 1 liter of methanol, and Resin (1) as the intended product was collected.

The ratio of constituent monomers in the polymer produced was 22/27/39/12, as determined by $C^{13}$ NMR. And weight average molecular weight determined by GPC measurement was found to be 8,700, calculated in terms of standard polystyrene.

Other resins having proportions of constituent monomers and molecular weights as shown in Table 1 were synthesized in similar manners to the above (the repeating units 1, 2, 3 and 4 shown in Table 1 conform to the sequence from the left in each structural formula).

TABLE 1

| Resin | Repeating unit 1 Formula Ia (mole %) | Repeating unit 2 Formula Ib (mole %) | Repeating unit 3 (mole %) | Repeating unit 4 (mole %) | Molecular weight |
|---|---|---|---|---|---|
| 2 | 26 | 25 | 36 | 13 | 9100 |
| 3 | 25 | 24 | 36 | 15 | 8900 |
| 4 | 28 | 26 | 34 | 12 | 9000 |
| 5 | 24 | 28 | 22 | 26 | 8100 |
| 6 | 29 | 20 | 26 | 25 | 7100 |
| 7 | 28 | 20 | 25 | 27 | 9400 |
| 8 | 30 | 21 | 47 | 2 | 10200 |
| 9 | 26 | 23 | 18 | 33 | 7800 |
| 10 | 26 | 28 | 34 | 12 | 9200 |
| 11 | 20 | 33 | 30 | 17 | 8600 |
| 12 | 30 | 25 | 42 | 3 | 10200 |
| 13 | 28 | 28 | 35 | 10 | 9300 |
| 14 | 35 | 25 | 20 | 20 | 8500 |
| 15 | 26 | 25 | 35 | 14 | 8200 |
| 16 | 20 | 18 | 41 | 21 | 9700 |
| 17 | 15 | 18 | 49 | 27 | 10100 |
| 18 | 17 | 19 | 44 | 29 | 8400 |

The structural formulae of Resins (1) to (18) are illustrated below.

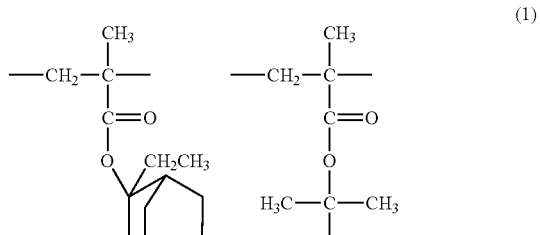

(1)

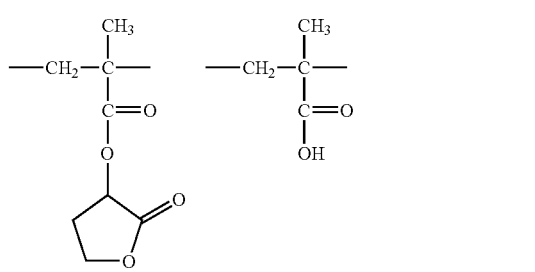

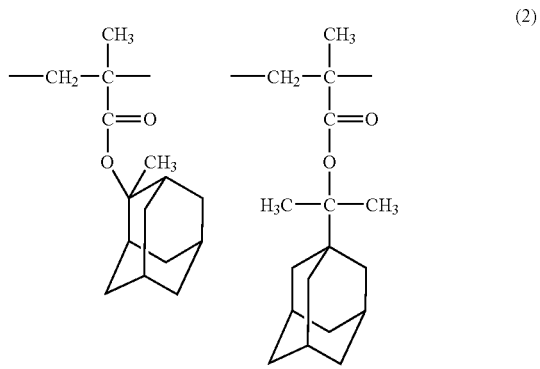

(2)

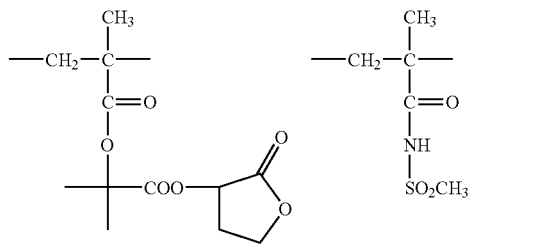

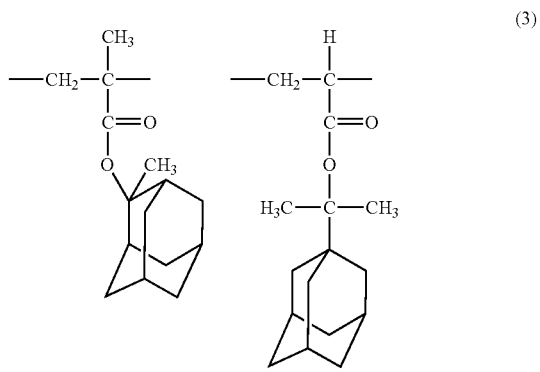

(3)

-continued
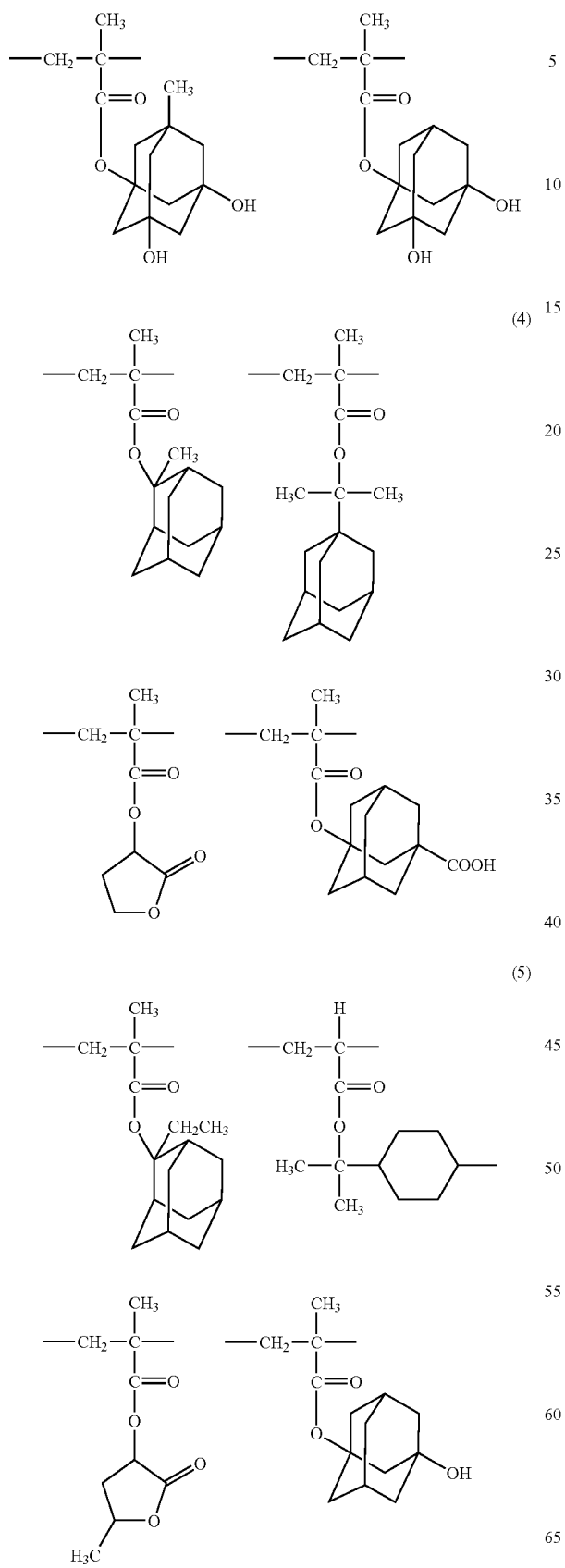
-continued
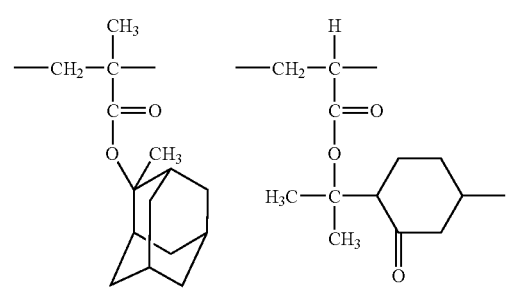
(6)
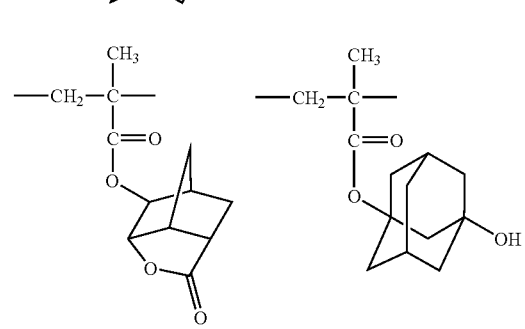
(7)
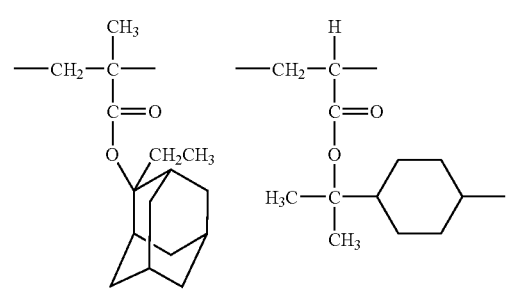
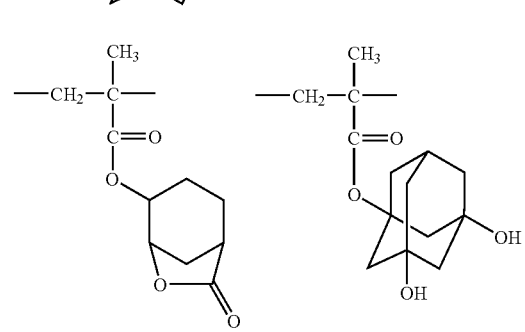
(8)
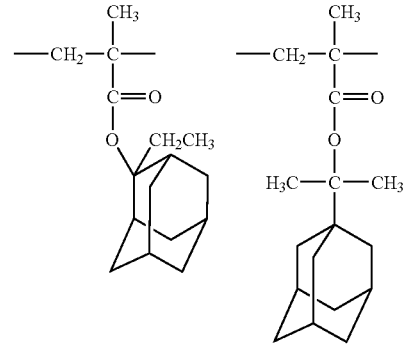

-continued
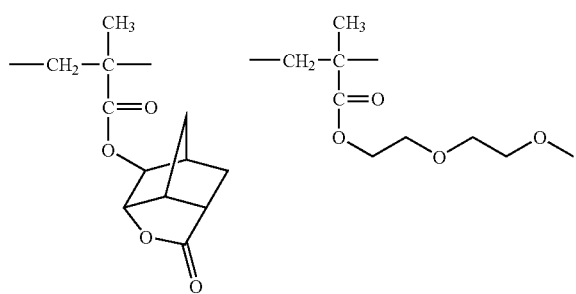
(9)
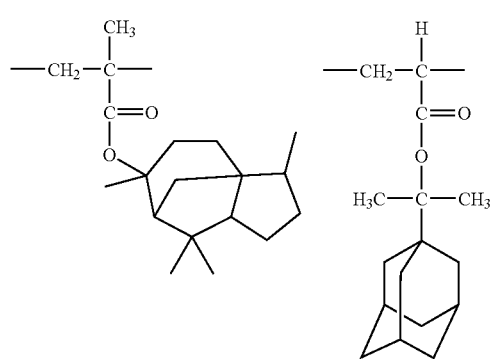
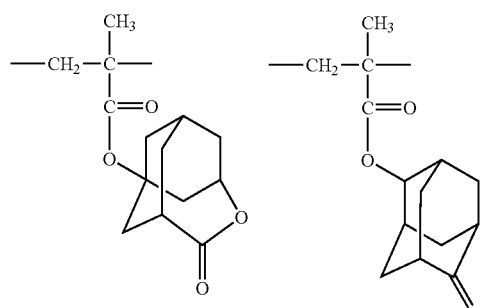
(10)
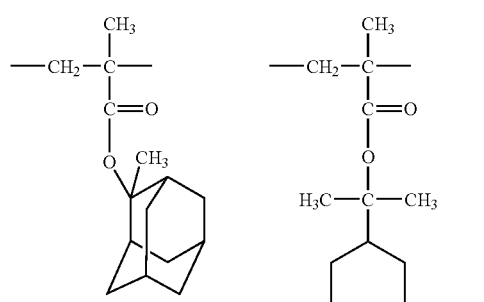
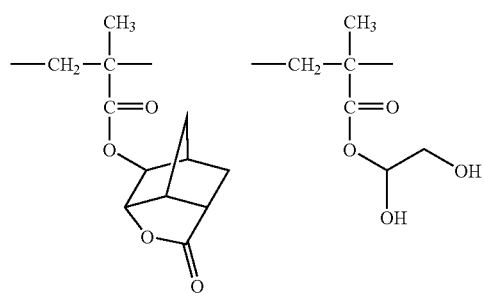
-continued
(11)
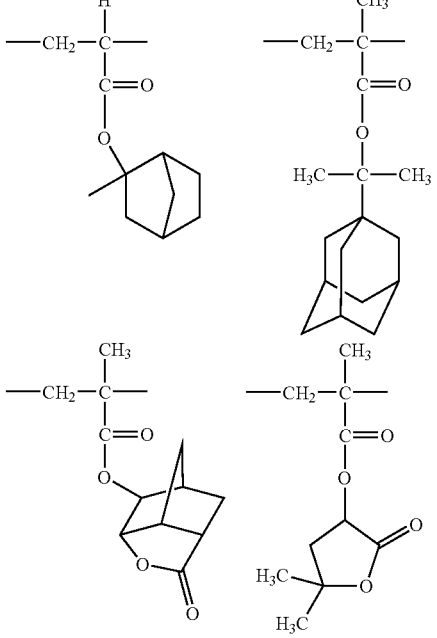
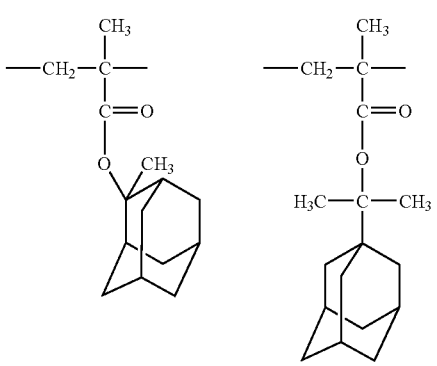
(12)
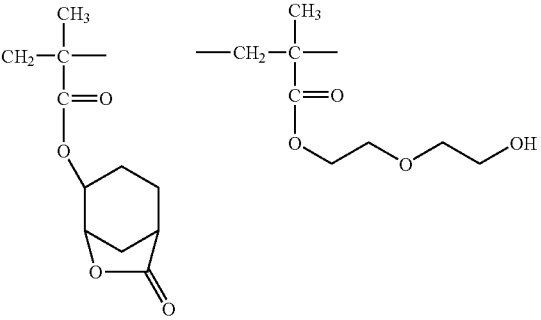
(13)
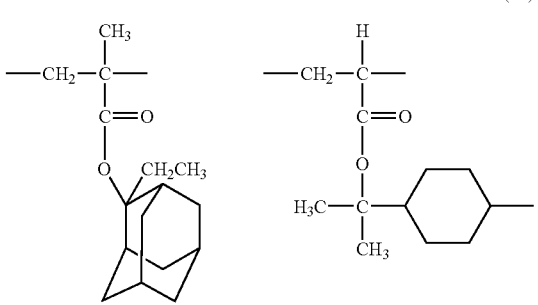

-continued
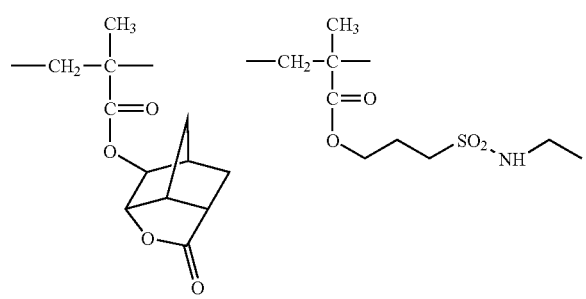
(14)
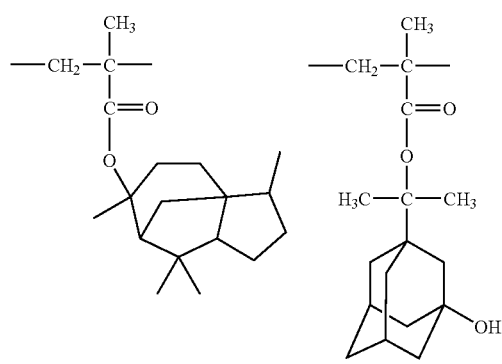
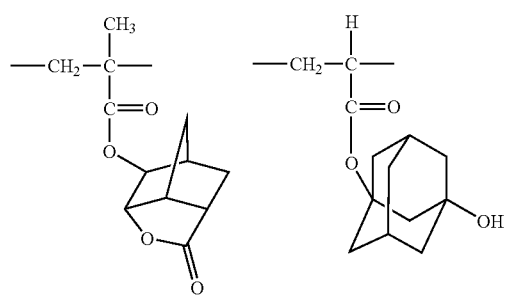
(15)
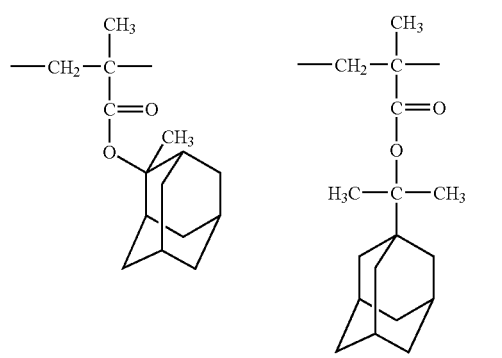
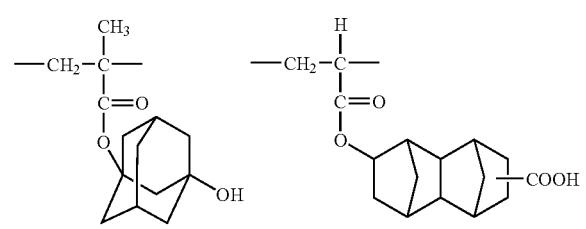
-continued
(16)
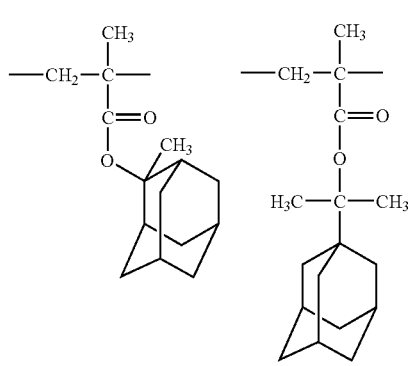
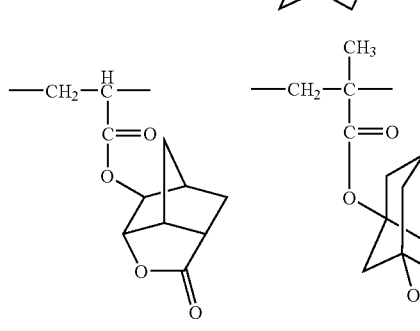
(17)
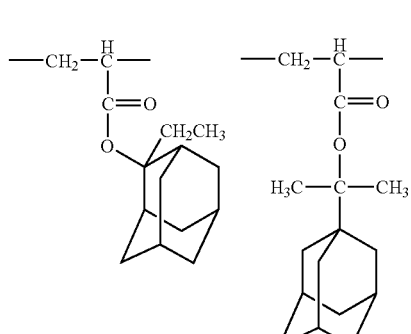
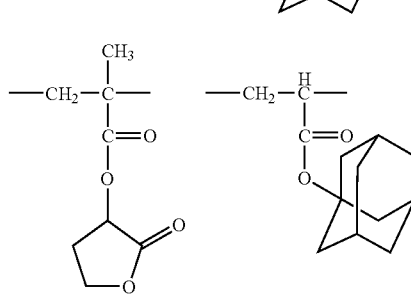
(18)
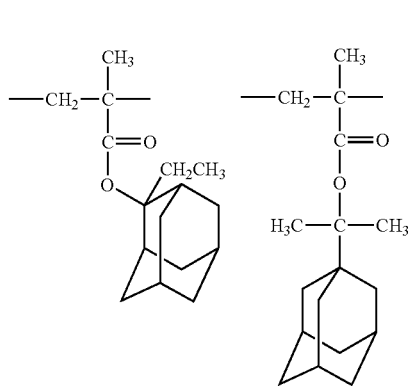

-continued

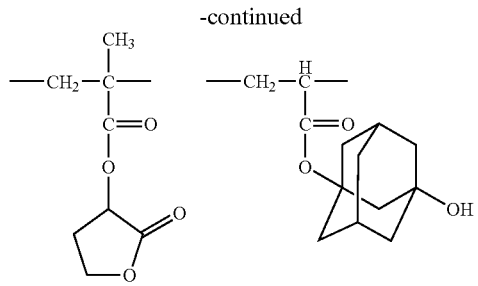

Examples 1 to 42 and
Comparative Examples 1 to 8

(Preparation and Evaluation of Positive Resist Compositions)

The combinations of ingredients set forth in Table 2 were each dissolved in propylene glycol monomethyl ether acetate to prepare solutions having a solids concentration of 10% by weight, and these solutions were each filtered through a 0.1 μm polytetrafluoroethylene or polyethylene filter to prepare positive resist compositions.

ARC-29A produced by Brewer Science Inc. was coated on a silicon wafer in a thickness of 78 nm by means of a spin coater and dried for 60 seconds on a 205° C. hot plate to prepare an anti-reflecting coating. On this anti-reflecting coating, each of the positive resist compositions was coated and dried at 120° C. for 90 seconds to form a positive resist film about 300 nm in thickness. The resist films thus formed were each exposed to ArF excimer laser (an ArF stepper having a wavelength of 193 nm and NA=0.6, made by ISI Inc.) as the exposure amount was varied by use of a 260 nm-pitch mask having a line pattern/space pattern ratio of 1:1.

After the exposure, the resist films were each subjected to heat treatment for 90 seconds at 120° C., developed with a 2.38% by weight % of aqueous solution of tetra methylammonium hydroxide, rinsed with distilled water, and then subjected to spin drying, thereby forming resist patterns.

The thus formed resist patterns on silicon wafer were observed under a scanning electron microscope, and evaluated in accordance with the following criteria. The evaluation results obtained are shown in Table 2 and Table 3.

Line Edge Roughness (LER)

Line-pattern dimensions were measured with S-8840 made by Hitachi Ltd. at 50 different positions on a 5 μm segment in the length direction of a 130 nm line pattern, and therefrom 3σ was calculated. The smaller the value thus calculated, the better the LER of the line patterns formed.

Pattern Collapse

A mask having 15 successive lines in a 130 nm line-and-space 1:1 pattern was used. A case where no topple was caused in the line pattern under the exposure amount enabling reproduction of the mask size was rated as good, a case where the number of lines having undergone topple under the same exposure amount as the above was 3 or below was rated as so-so, and a case where the number of lines having undergone topple under the same exposure amount as the above was greater than 3 was rated as bad. Formation of patterns free of topple is highly regarded as a resist performance.

TABLE 2

| | Resin (weight proportion, %) | Acid generator (weight proportion, %) | Basic compound (weight proportion, %) | Surfactant (weight proportion, %) | LER (nm) | Pattern collapse |
|---|---|---|---|---|---|---|
| Example 1 | 1 (95.9) | I-2 (4) | — | W1 (0.1) | 9 | good |
| Example 2 | 2 (95.9) | I-2 (4) | 1 (0.1) | — | 10 | good |
| Example 3 | 3 (95.8) | IA-32 (4) | 3 (0.1) | W5 (0.1) | 8 | good |
| Example 4 | 4 (95.8) | I-11 (4) | 4 (0.1) | W3 (0.1) | 10 | good |
| Example 5 | 5 (95.8) | I-17 (4) | 6 (0.1) | W2 (0.1) | 8 | good |
| Example 6 | 6 (95.8) | I-18 (4) | 5 (0.1) | W4 (0.1) | 9 | good |
| Example 7 | 7 (95.8) | I-25 (4) | 2 (0.1) | W1 (0.1) | 8 | good |
| Example 8 | 8 (95.8) | I-26 (4) | 6 (0.1) | W1 (0.1) | 10 | good |
| Example 9 | 9 (95.8) | I-33 (4) | 6 (0.1) | W5 (0.1) | 8 | good |
| Example 10 | 10 (95.8) | I-36 (4) | 1 (0.1) | W5 (0.1) | 10 | good |
| Example 11 | 11 (95.8) | I-40 (4) | 3 (0.1) | W3 (0.1) | 9 | good |
| Example 12 | 12 (95.8) | I-45 (4) | 3 (0.1) | W3 (0.1) | 10 | good |
| Example 13 | 13 (95.8) | I-46 (4) | 1 (0.1) | W2 (0.1) | 9 | good |
| Example 14 | 14 (95.8) | I-53 (4) | 5 (0.1) | W1 (0.1) | 9 | good |
| Example 15 | 15 (95.8) | I-56 (4) | 6 (0.1) | W2 (0.1) | 8 | good |
| Example 16 | 16 (95.8) | IA-31 (4) | 6 (0.1) | W5 (0.1) | 8 | good |
| Example 17 | 17 (95.8) | IA-32 (4) | 6 (0.1) | W5 (0.1) | 8 | good |
| Example 18 | 18 (95.8) | I-26 (4) | 6 (0.1) | W5 (0.1) | 9 | good |
| Example 19 | 1 (95.8) | IA-32/z1 (2/2) | 6 (0.1) | W2 (0.1) | 10 | good |
| Example 20 | 5 (95.8) | I-26/z1 (2/2) | 6 (0.1) | W2 (0.1) | 9 | good |
| Example 21 | 1 (95.8) | I-56/z2 (2/2) | 6 (0.1) | W5 (0.1) | 9 | good |
| Comparative Example 1 | 1 (95.8) | z2 (4) | 6 (0.1) | W2 (0.1) | 18 | so-so |
| Comparative Example 2 | R (95.8) | z1 (4) | 6 (0.1) | W2 (0.1) | 16 | bad |
| Comparative Example 3 | R (95.8) | I-26 (4) | 6 (0.1) | W2 (0.1) | 17 | bad |

TABLE 3

| | Resin (weight proportion, %) | Acid generator (weight proportion, %) | Basic compound (weight proportion, %) | Surfactant (weight proportion, %) | LER (nm) | Pattern collapse |
|---|---|---|---|---|---|---|
| Example 22 | 1 (95.9) | P-1 (4) | — | W1 (0.1) | 8 | good |
| Example 23 | 2 (95.9) | P-2 (4) | 1 (0.1) | — | 10 | good |
| Example 24 | 3 (95.8) | P-3 (4) | 3 (0.1) | W5 (0.1) | 9 | good |
| Example 25 | 4 (95.8) | P-31 (4) | 4 (0.1) | W3 (0.1) | 9 | good |
| Example 26 | 5 (95.8) | P-14 (4) | 6 (0.1) | W2 (0.1) | 8 | good |
| Example 27 | 6 (95.8) | P-26 (4) | 5 (0.1) | W4 (0.1) | 10 | good |
| Example 28 | 7 (95.8) | P-6 (4) | 2 (0.1) | W1 (0.1) | 8 | good |
| Example 29 | 8 (95.8) | P-38 (4) | 6 (0.1) | W1 (0.1) | 9 | good |
| Example 30 | 9 (95.8) | P-39 (4) | 6 (0.1) | W5 (0.1) | 9 | good |
| Example 31 | 10 (95.8) | P-3 (4) | 1 (0.1) | W5 (0.1) | 8 | good |
| Example 32 | 11 (95.8) | P-13 (4) | 3 (0.1) | W3 (0.1) | 8 | good |
| Example 33 | 12 (95.8) | P-17 (4) | 3 (0.1) | W3 (0.1) | 10 | good |
| Example 34 | 13 (95.8) | P-10 (4) | 1 (0.1) | W2 (0.1) | 10 | good |
| Example 35 | 14 (95.8) | P-5 (4) | 5 (0.1) | W1 (0.1) | 9 | good |
| Example 36 | 15 (95.8) | P-33 (4) | 6 (0.1) | W2 (0.1) | 9 | good |
| Example 37 | 16 (95.8) | P-2 (4) | 6 (0.1) | W5 (0.1) | 8 | good |
| Example 38 | 17 (95.8) | P-1 (4) | 6 (0.1) | W5 (0.1) | 8 | good |
| Example 39 | 18 (95.8) | P-2 (4) | 6 (0.1) | W5 (0.1) | 9 | good |
| Example 40 | 1 (95.8) | P-2/z1 (2/2) | 6 (0.1) | W2 (0.1) | 10 | good |
| Example 41 | 5 (95.8) | P-1/z1 (2/2) | 6 (0.1) | W2 (0.1) | 8 | good |
| Example 42 | 1 (95.8) | P-6/z2 (2/2) | 6 (0.1) | W5 (0.1) | 8 | good |
| Comparative Example 4 | 1 (95.8) | z30 (4) | 6 (0.1) | W2 (0.1) | 18 | so-so |
| Comparative Example 5 | R (95.8) | z1 (4) | 6 (0.1) | W2 (0.1) | 16 | so-so |
| Comparative Example 6 | R (95.8) | z30 (4) | 6 (0.1) | W2 (0.1) | 16 | bad |
| Comparative Example 7 | 8 (95.8) | Z31 (4) | 6 (0.1) | W2 (0.1) | 18 | bad |
| Comparative Example 8 | R (95.8) | P-2 (4) | 6 (0.1) | W2 (0.1) | 17 | so-so |

The surfactants used were as follows:

W1: Megafac F176 (produced by Dainippon Ink & Chemicals, Inc.) (a surfactant containing fluorine atoms)

W2: Megafac R08 (produced by Dainippon Ink & Chemicals, Inc.) (a surfactant containing fluorine and silicon atoms)

W3: Organosiloxane polymer KP-341 (produced by Shin-Etsu Chemical Co., Ltd.)

W4: Polyoxyethylene nonyl phenyl ether

W5: Troysol S-366 (produced by Troy Chemical Industries, Inc.)

The basic compounds used are as follows:

1: 1,5-Diazabicyclo[4.3.0]-5-nonene (DBN)

2: Bis(1,2,2,6,6,-pentamethyl-4-piperidyl)sebacate

3: Tri-n-butylamine

4: Triphenylimidazole

5: Antipyrine

6: 2,6-Disopropylaniline

The resin R used for comparison was 2-methyl-2-adamantyl methacrylate/mevalonic lactone methacrylate/t-butyl methacrylate (50/20/30 by mole) terpolymer synthesized according to Example of JP-A-11-119434.

As can be clearly seen from the results shown in Table 2 and Table 3, the present positive resist compositions were superior in line edge roughness performance and pattern collapse performance.

What is claimed is:

1. A positive resist composition comprising:

(A) a resin comprising a repeating unit represented by the following formula (Ia) and a repeating unit represented by the following formula (Ib), which increases the solubility in an alkali developing solution by the action of an acid:

(B) a compound represented by the following formula (I), (II) or (III):

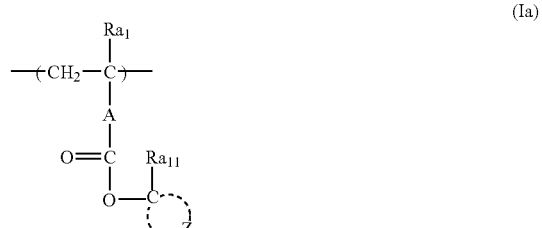

(Ia)

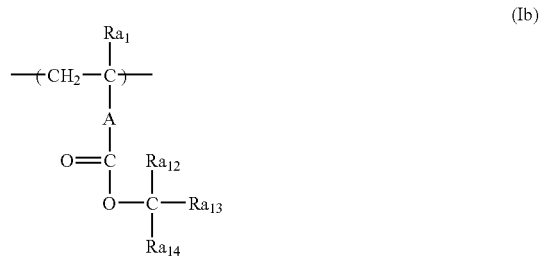

(Ib)

wherein $Ra_1$ each independently represents a hydrogen atom or an alkyl group, and A each independently represents a linkage group, $Ra_{11}$ represents an alkyl group containing 1 to 4 carbon atoms, Z represents a group of atoms forming an alicyclic hydrocarbon group together with the carbon atom adjacent to $Ra_{11}$, $Ra_{12}$ to $Ra_{14}$ each independently represents a hydrocarbon group, with the proviso that at least one among $Ra_{12}$, $Ra_{13}$ and $Ra_{14}$ represents an alicyclic hydrocarbon group:

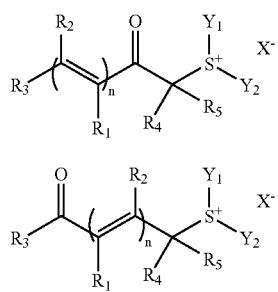

wherein $R_1$ to $R_3$, which may be the same or different, each represents a hydrogen atom, an alkyl group, an alkenyl group, an aryl group or an alkoxy group, $R_4$ and $R_5$, which may be the same or different, each represent a hydrogen atom, a cyano group, an alkyl group, an aryl group or an alkoxy group, $Y_1$ and $Y_2$, which may be the same or different, each represents an alkyl group, an aryl group, an aralkyl group or a hetero atom-containing aromatic group, n represents an integer of 1 to 4, and with the proviso that when n is 2 or more, a plurality of $R_1$s may be the same or different and a plurality of $R_2$s may also be the same or different, any two or more among $R_1$ to $R_3$, $R_4$, $R_5$, $Y_1$ and $Y_2$ may be bonded with each other to form a cyclic structure, two or more of structures represented by formula (I) or (II) may be present by being bonded to each other via one or more of a linkage group at any sites of $R_1$s, $R_2$s, $R_3$s, $R_4$s, $R_5$s, $Y_1$s and $Y_2$s, $X^-$ represents a non-nucleophilic anion:

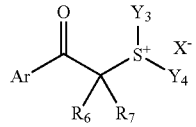

wherein Ar represents an aryl group or a hetero atom-containing aromatic group, $R_6$ represents a hydrogen atom, a cyano group, an alkyl group or an aryl group, $R_7$ represents an alkyl group or an aryl group, $Y_3$ and $Y_4$, which may be the same or different, each represents an alkyl group, an aryl group, an aralkyl group or a hetero atom-containing aromatic group, or $Y_3$ and $Y_4$ may be bonded with each other to form a ring, Ar and at least either $Y_3$ or $Y_4$ may be bonded with each other to form a ring, Ar and $R_6$ may be bonded with each other to form a ring, or two or more of structures represented by formula (III) may be present by being bonded to each other via one or more of a linkage group at Ar sites, either $R_6$ or $R_7$ sites, or either $Y_3$ or $Y_4$ sites, and $X^-$ represents a non-nucleophilic anion, and wherein the content of the compound represented by the formula (I) or (II) is from 0.1 to 20% by weight based on the content of the solids in the composition.

2. The composition according to claim 1, wherein the compound (B) represented by formula (III) is a compound represented by the following formula (IV):

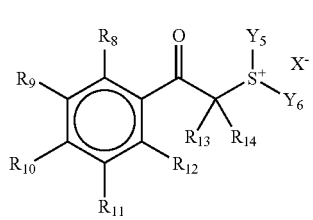

wherein $R_8$ to $R_{12}$, which may be the same or different, each represents a hydrogen atom, a nitro group, a halogen atom, an alkyl group, an alkoxy group, an alkyloxycarbonyl group, an aryl group or an acylamino group, with the proviso that at least two of $R_8$ to $R_{12}$ may be bonded with each other to form a ring structure, $R_{13}$ represents a hydrogen atom, a cyano group, an alkyl group or an aryl group, $R_{14}$ represents an alkyl group or an aryl group, $Y_5$ and $Y_6$, which may be the same or different, each represents an alkyl group, an aryl group, an aralkyl group or a hetero atom-containing aromatic group, or $Y_5$ and $Y_6$ may be bonded with each other to form a ring, or at least one of $R_8$ to $R_{12}$ and at least either $Y_5$ or $Y_6$ may be bonded with each other to form a ring, or at least one of $R_8$ to $R_{12}$ may be bonded with $R_{13}$ to form a ring, two or more of structures represented by formula (IV) may be present by being bonded to each other via one or more of a linkage group at any sites of $R_8$s to $R_{14}$s or at either $Y_5$ sites or $Y_6$ sites, and $X^-$ represents a non-nucleophilic anion.

3. The composition according to claim 1, further comprising (C) a fluorine-based and/or silicon-based surfactant.

4. The composition according to claim 1, further comprising (D) an organic basic compound.

5. The composition according to claim 1, wherein the component (B) includes: at least one of the compounds represented by the formulae (I) and (II); and the compound represented by the formula (III).

6. The composition according to claim 1, wherein the amount of the repeating unit represented by the formula (Ia) and the repeating unit represented by the formula (Ib) is from 30 to 70 mole % based on the component (a).

7. A method for forming a pattern, which comprises forming a resist film comprising the composition described in claim 1, exposing the resist film upon irradiation with the actinic rays or a radiation, and subsequently developing the resist film.

8. The method for forming a pattern according to claim 7, wherein the compound (B) represented by formula (III) is a compound represented by the following formula (IV):

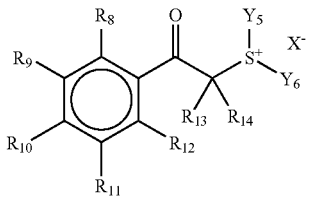
(IV)

wherein $R_8$ to $R_{12}$, which may be the same or different, each represents a hydrogen atom, a nitro group, a halogen atom, an alkyl group, an alkoxy group, an alkyloxycarbonyl group, an aryl group or an acylamino group, with the proviso that at least two of $R_8$ to $R_{12}$ may be bonded with each other to form a ring structure, $R_{13}$ represents a hydrogen atom, a cyano group, an alkyl group or an aryl group, $R_{14}$ represents an alkyl group or an aryl group, $Y_5$ and $Y_6$, which may be the same or different, each represents an alkyl group, an aryl group, an aralkyl group or a hetero atom-containing aromatic group, or $Y_5$ and $Y_6$ may be bonded with each other to form a ring, or at least one of $R_8$ to $R_{12}$ and at least either $Y_5$ or $Y_6$ may be bonded with each other to form a ring, or at least one of $R_8$ to $R_{12}$ may be bonded with $R_{13}$ to form a ring, two or more of structures represented by formula (IV) may be present by being bonded to each other via one or more of a linkage group at any sites of $R_8$s to $R_{14}$s or at either $Y_5$ sites or $Y_6$ sites, and $X^-$ represents a non-nucleophilic anion.

9. The method for forming a pattern according to claim 7, wherein the composition further comprises (C) a fluorine-based and/or silicon-based surfactant.

10. The method for forming a pattern according to claim 7, wherein the composition further comprises (D) an organic basic compound.

11. The method for forming a pattern according to claim 7, wherein the component (B) includes: at least one of the compounds represented by the formulae (I) and (II); and the compound represented by the formula (III).

12. The method for forming a pattern according to claim 7, wherein the amount of the repeating unit represented by the formula (Ia) and the repeating unit represented by the formula (Ib) is from 30 to 70 mole % based on the component (a).

13. A positive resist composition comprising:
(A) a resin comprising a repeating unit represented by the following formula (Ia) and a repeating unit represented by the following formula (Ib), which increases the solubility in an alkali developing solution by the action of an acid:
(B) a compound represented by the following formula (I), (II) or (III):

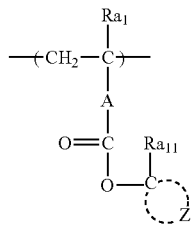
(Ia)

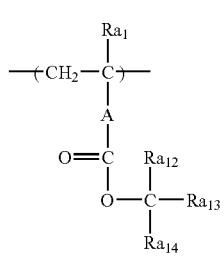
(Ib)

wherein $Ra_1$ each independently represents a hydrogen atom or an alkyl group, and A each independently represents a linkage group, $Ra_{11}$ represents an alkyl group containing 1 to 4 carbon atoms, Z represents a group of atoms forming an alicyclic hydrocarbon group together with the carbon atom adjacent to $Ra_{11}$, $Ra_{12}$ to $Ra_{14}$ each independently represents a hydrocarbon group, with the proviso that at least one among $Ra_{12}$, $Ra_{13}$ and $Ra_{14}$ represents an alicyclic hydrocarbon group:

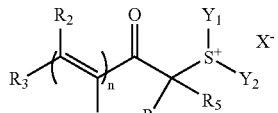
(I)

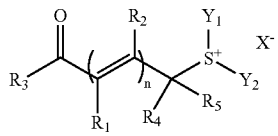
(II)

wherein $R_1$ to $R_3$, which may be the same or different, each represents a hydrogen atom, an alkyl group, an alkenyl group, an aryl group or an alkoxy group, $R_4$ and $R_5$, which may be the same or different, each represent a hydrogen atom, a cyano group, an alkyl group, an aryl group or an alkoxy group, $Y_1$ and $Y_2$, which may be the same or different, each represents an alkyl group, an aryl group, an aralkyl group or a hetero atom-containing aromatic group, n represents an integer of 1 to 4, and with the proviso that when n is 2 or more, a plurality of $R_1$s may be the same or different and a plurality of $R_2$s may also be the same or different, any two or more among $R_1$ to $R_3$, $R_4$, $R_5$, $Y_1$ and $Y_2$ may be bonded with each other to form a cyclic structure, two or more of structures represented by formula (I) or (II) may be present by being bonded to each other via one or more of a linkage group at any sites of $R_1$s, $R_2$s, $R_3$s, $R_4$s, $R_5$s, $Y_1$s and $Y_2$s,

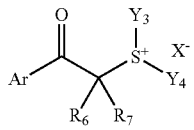 (III)

$X^-$ represents a non-nucleophilic anion:
wherein Ar represents an aryl group or a hetero atom-containing aromatic group,
$R_6$ represents a hydrogen atom, a cyano group, an alkyl group or an aryl group,
$R_7$ represents an alkyl group or an aryl group,
$Y_3$ and $Y_4$, which may be the same or different, each represents an alkyl group, an aryl group, an aralkyl group or a hetero atom-containing aromatic group, or $Y_3$ and $Y_4$ may be bonded with each other to form a ring,
Ar and at least either $Y_3$ or $Y_4$ may be bonded with each other to form a ring,
Ar and $R_6$ may be bonded with each other to form a ring, or two or more of structures represented by formula (III) may be present by being bonded to each other via one or more of a linkage group at Ar sites, either $R_6$ or $R_7$ sites, or either $Y_3$ or $Y_4$ sites, and
$X^-$ represents a non-nucleophilic anion;
wherein the component (B) includes: at least one of the compounds represented by the formulae (I) and (II); and the compound represented by the formula (III).

14. A method for forming a pattern, which comprises forming a resist film comprising the composition described in claim 13, exposing the resist film upon irradiation with the actinic rays or a radiation, and subsequently developing the resist film.

* * * * *